(12) United States Patent
Kim et al.

(10) Patent No.: US 11,447,859 B2
(45) Date of Patent: Sep. 20, 2022

(54) METAL TRIAMINE COMPOUND, METHOD FOR PREPARING THE SAME, AND COMPOSITION FOR DEPOSITING METAL-CONTAINING THIN FILM INCLUDING THE SAME

(71) Applicant: DNF CO., LTD., Daejeon (KR)

(72) Inventors: Myong Woon Kim, Daejeon (KR); Sang Ick Lee, Daejeon (KR); Sang Jun Yim, Cheongju-si (KR); Won Mook Chae, Daejeon (KR); Jeong Hyeon Park, Daejeon (KR); Kang Yong Lee, Sejong (KR); A Ra Cho, Daejeon (KR); Joong Jin Park, Daejeon (KR); Heang Don Lim, Daejeon (KR)

(73) Assignee: DNF CO., LTD., Daejeon (KR)

( * ) Notice: Subject to any disclaimer, the term of this patent is extended or adjusted under 35 U.S.C. 154(b) by 830 days.

(21) Appl. No.: 16/093,905

(22) PCT Filed: Apr. 26, 2018

(86) PCT No.: PCT/KR2018/004841
§ 371 (c)(1),
(2) Date: Nov. 1, 2018

(87) PCT Pub. No.: WO2018/199642
PCT Pub. Date: Nov. 1, 2018

(65) Prior Publication Data
US 2021/0222294 A1 Jul. 22, 2021

(30) Foreign Application Priority Data

Apr. 27, 2017 (KR) .......................... 10-2017-0054290
May 22, 2017 (KR) .......................... 10-2017-0062801
(Continued)

(51) Int. Cl.
C23C 16/34 (2006.01)
C07F 5/00 (2006.01)
C07F 7/00 (2006.01)
C07F 7/28 (2006.01)
C07F 9/00 (2006.01)
(Continued)

(52) U.S. Cl.
CPC .............. *C23C 16/34* (2013.01); *C07F 5/003* (2013.01); *C07F 7/003* (2013.01); *C07F 7/28* (2013.01);
(Continued)

(58) Field of Classification Search
None
See application file for complete search history.

(56) References Cited

U.S. PATENT DOCUMENTS 8,471,049 B2   6/2013   Lei et al.

FOREIGN PATENT DOCUMENTS

| CN | 104445997 A | 3/2015 |
| KR | 101485520 B1 | 1/2015 |
| KR | 20150105747 A | 9/2015 |

OTHER PUBLICATIONS

Le Bris, N. et al., "Modes of complexation of linear tri- and tetraamines with group 6 metal carbonyls," Journal of Organometallic Chemistry, vol. 487, No. 1-2, Feb. 8, 1995, 7 pages.
(Continued)

*Primary Examiner* — Clinton A Brooks
(74) *Attorney, Agent, or Firm* — McCoy Russell LLP

(57) ABSTRACT

Provided are a novel metal triamine compound, a method for preparing the same, a composition for depositing a metal-containing thin film including the same, and a method for preparing a metal-containing thin film using the same. The metal triamine compound of the present invention has excellent reactivity, is thermally stable, has high volatility, and has high storage stability, and thus, it may be used as a metal-containing precursor to easily prepare a high-purity metal-containing thin film having high density.

15 Claims, 19 Drawing Sheets

| Comparison of step coverage property of zirconium oxide thin film by temperature | | | | | |
|---|---|---|---|---|---|
| | 6:1 trench structure | | Aspect ratio 60:1 hole structure pattern | 6:1 trench structure | |
| Transmission electron microscope images | | | | | |
| Substrate temperature | 260°C | | 300°C | 320°C | 350°C |
| Step coverage property [%] | 100 | 100 | 99 | 100 | 100 |

(30) Foreign Application Priority Data

May 23, 2017 (KR) .......................... 10-2017-0063332
Apr. 25, 2018 (KR) .......................... 10-2018-0047876

(51) Int. Cl.

| | | |
|---|---|---|
| C07F 11/00 | (2006.01) | |
| C23C 16/04 | (2006.01) | |
| C23C 16/40 | (2006.01) | |
| C23C 16/455 | (2006.01) | |
| C23C 16/50 | (2006.01) | |

(52) U.S. Cl.
CPC .............. *C07F 9/005* (2013.01); *C07F 11/00* (2013.01); *C07F 11/005* (2013.01); *C23C 16/045* (2013.01); *C23C 16/405* (2013.01); *C23C 16/45536* (2013.01); *C23C 16/45553* (2013.01); *C23C 16/50* (2013.01)

(56) References Cited

OTHER PUBLICATIONS

Taha, A. et al., "Structural, molecular orbital and optical characterizations of solvatochromic mixed ligand copper(II) complex of 5,5-Dimethyl cyclohexanate 1,3-dione and N,N,N',N'N"-pentamethyldiethylenetriamine," Spectrochimica Acta Part A: Molecular and Biomolecular Spectroscopy, vol. 122, Mar. 25, 2014, Available Online Nov. 20, 2013, pages.

Hill, M. et al., "Single-source AACVD of composite cobalt-silicon oxide thin films," Inorganica Chimica Acta, vol. 422, Oct. 1, 2014, Available Online Jul. 27, 2014, 10 pages.

Taiwan Intellectual Property Office, Office Action Issued in Application No. 107114580, dated Feb. 26, 2019, 7 pages.

Pohl, L. et al., "Physical properties of non-pyrophoric group III precursors for MOVPE," Journal of Crystal Growth, vol. 107, No. 1-4, Jan. 1, 1991, 5 pages.

Clark, H. et al., "Titanium(IV) complexes incorporating the aminodiamide ligand [(SiMe3)N{CH2CH2 N(SiMe3)}2] 2-(L); the X-ray crystal structures of [TiMe2(L) ] and [TiCl{CH(SiMe3)2}(L)]," Journal of Organometallic Chemistry, vol. 501, No. 1-2, Oct. 4, 1995, 8 pages.

Ward, B. et al., "Group 6 Imido Complexes Supported by Diamido-Donor Ligands," Inorganic Chemistry, vol. 42, No. 16, Aug. 11, 2003, Published Online Jul. 12, 2003, 9 pages.

Morgan, A. et al., "Exploring Alternative Synthetic Routes for the Preparation of Five-Coordinate Diamidoamine Group 4 Metal Complexes," Organometallics, vol. 24, No. 22, Sep. 17, 2005, 10 pages.

European Patent Office, Extended European Search Report Issued in Application No. 187852413, dated Oct. 11, 2019, Germany, 7 pages.

[FIG. 1]
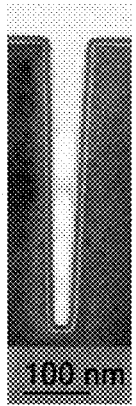

[FIG. 2]
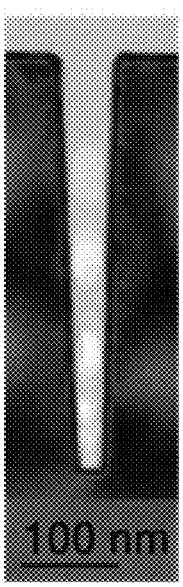

[FIG. 3]
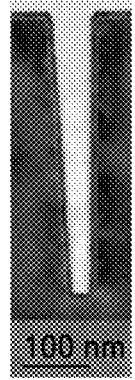

[FIG. 4]

| | Comparison of step coverage property of hafnium oxide thin film by temperature | | | | | |
|---|---|---|---|---|---|---|
| | 6:1 trench structure | | | Aspect ratio 60:1 hole structure pattern | | 6:1 trench structure |
| Transmission electron microscope images | | | | | | |
| Substrate temperature | 270°C | 290°C | | 310°C | | 330°C |
| Step coverage property [%] | 100 | 100 | 100 | 99 | | 100 |

[FIG. 5]
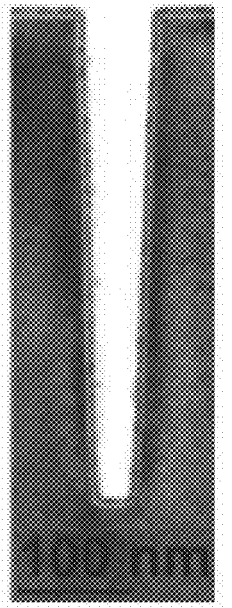

[FIG. 6]
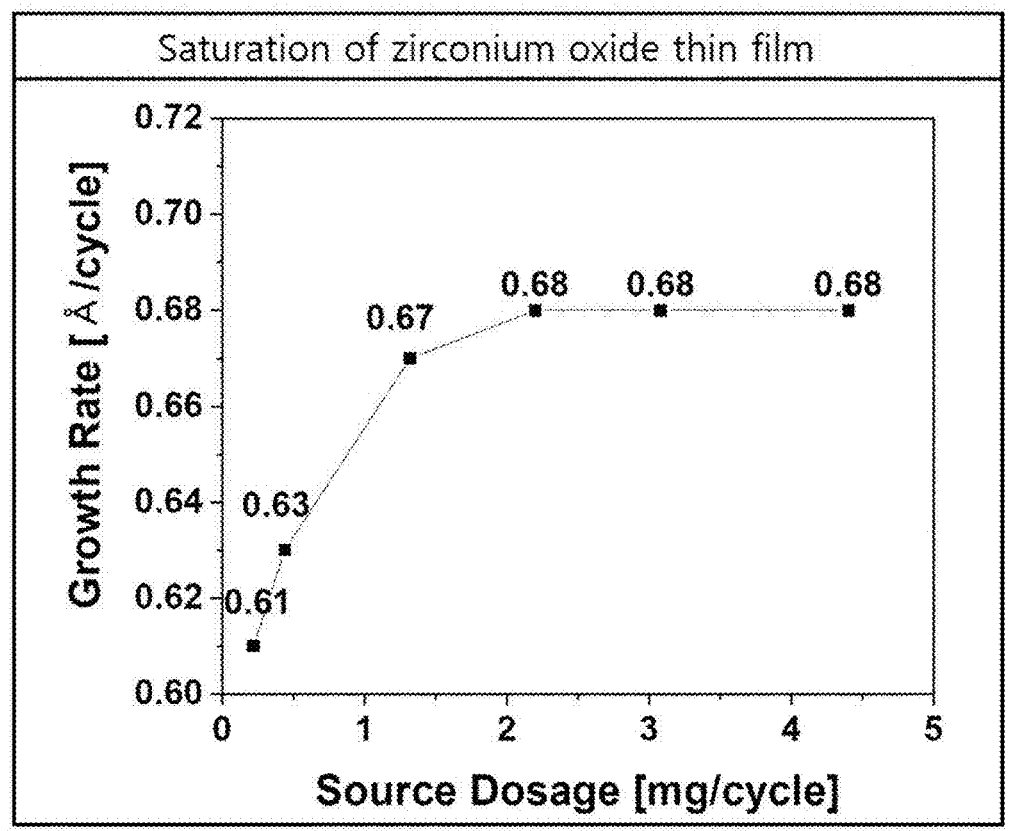

[FIG. 7]
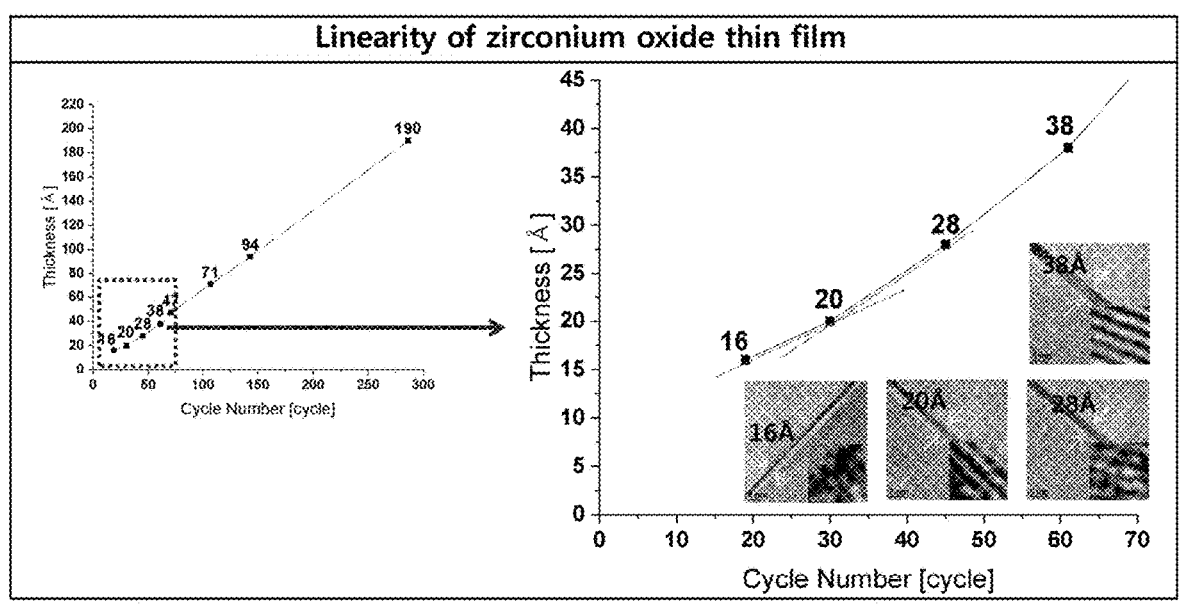

[FIG. 8]
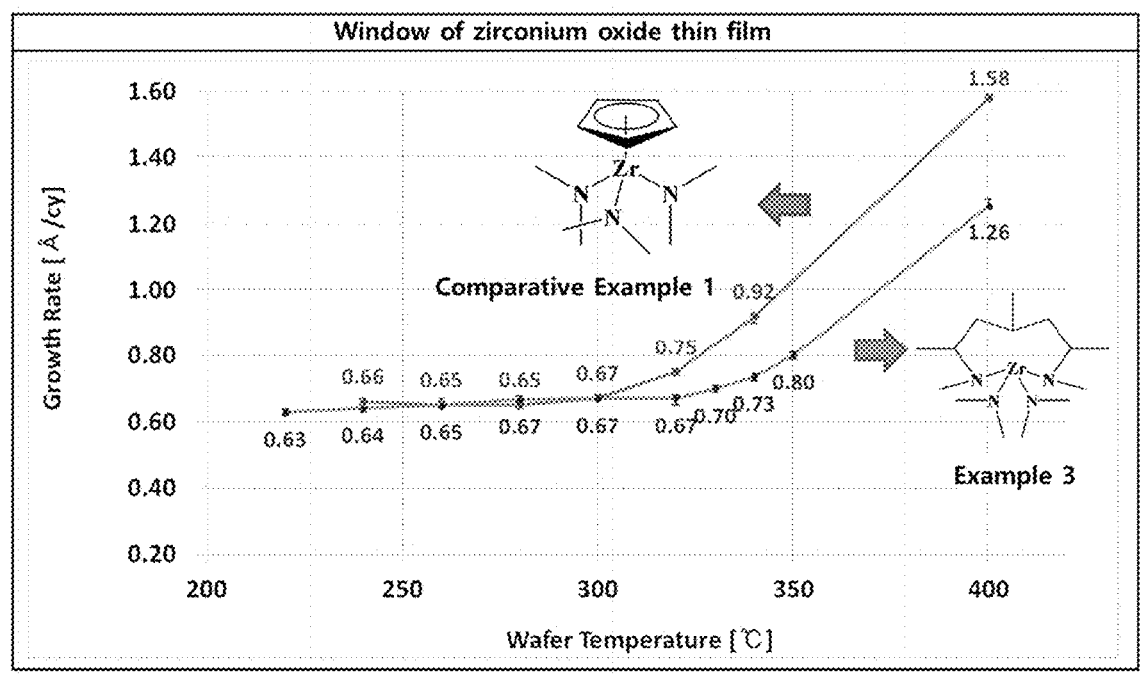

[FIG. 9]
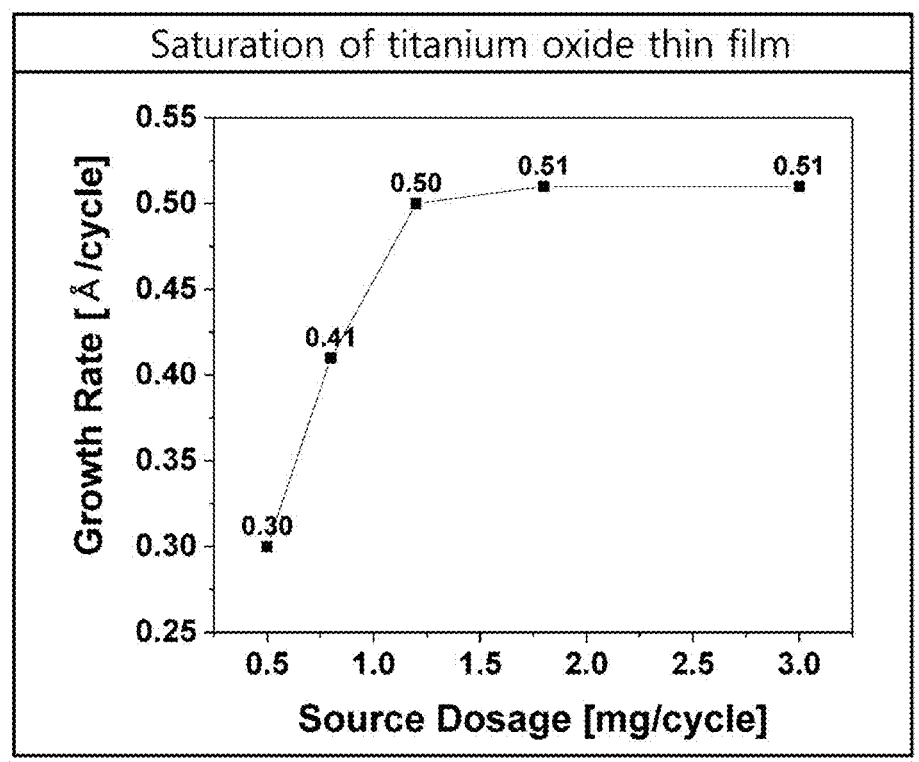

[FIG. 10]
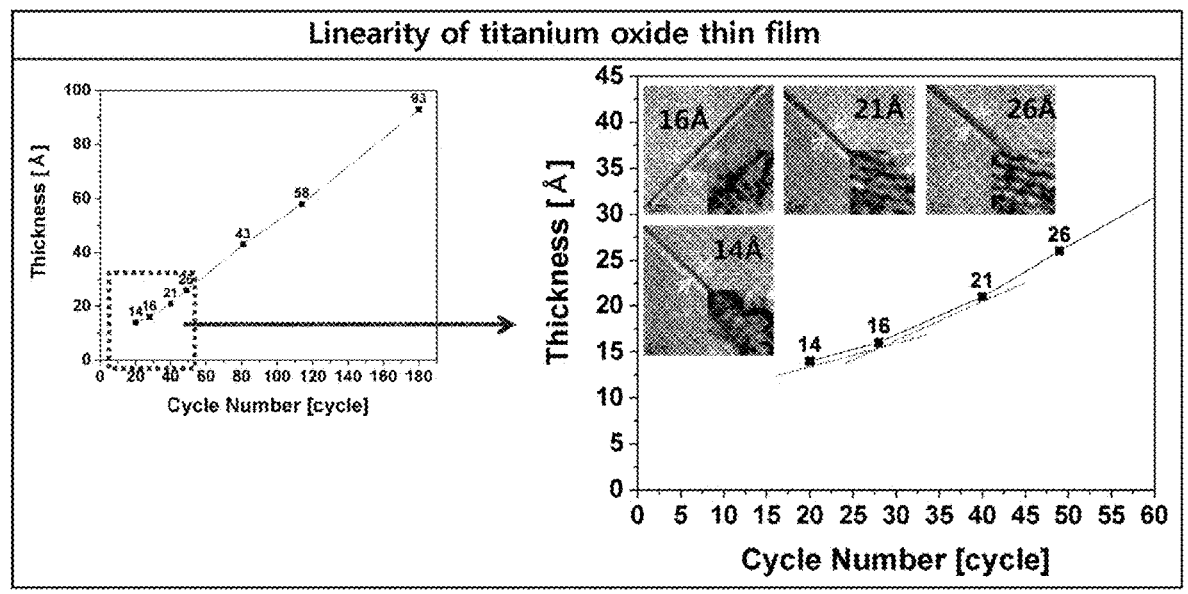

[FIG. 11]
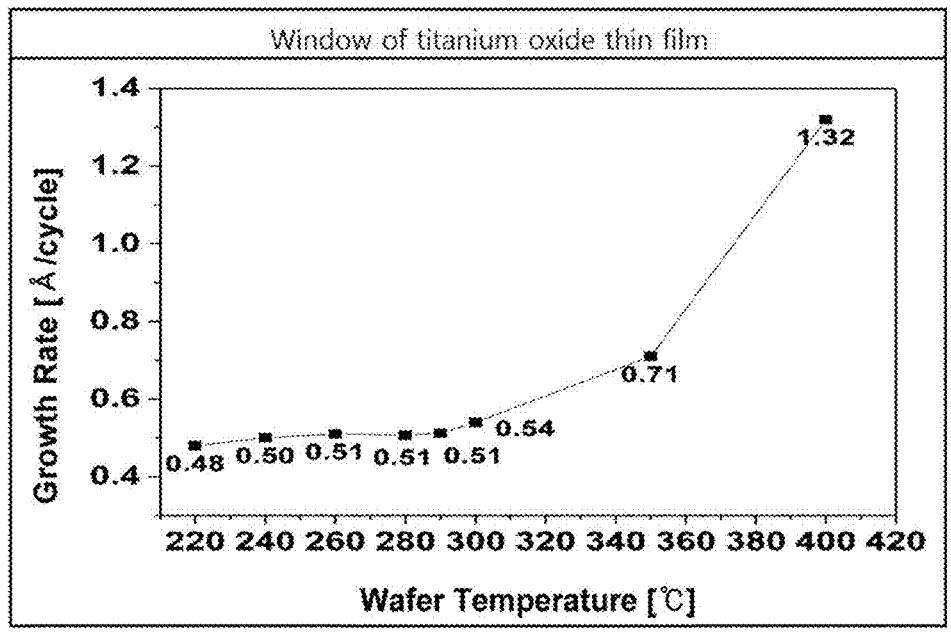
[FIG. 12]
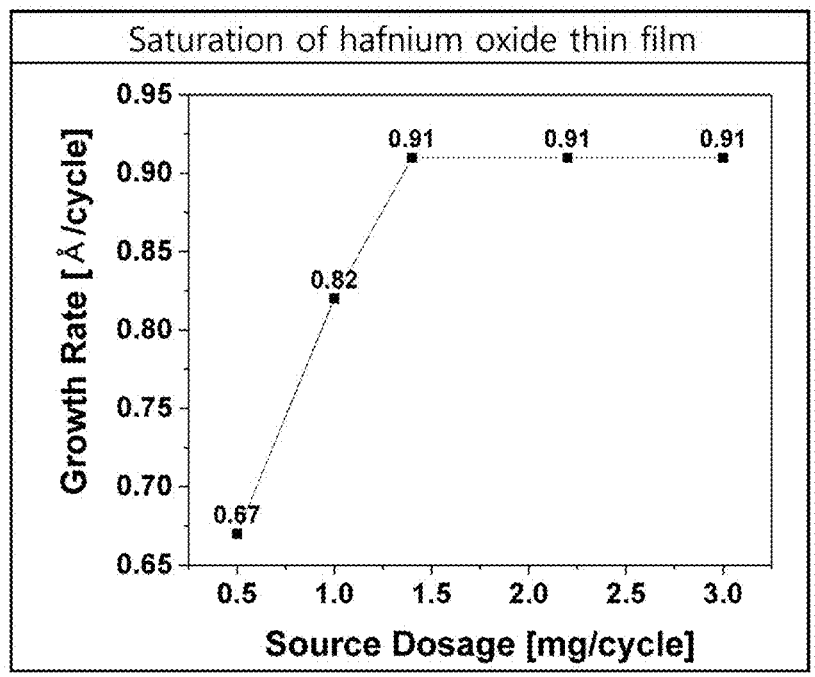

[FIG. 13]
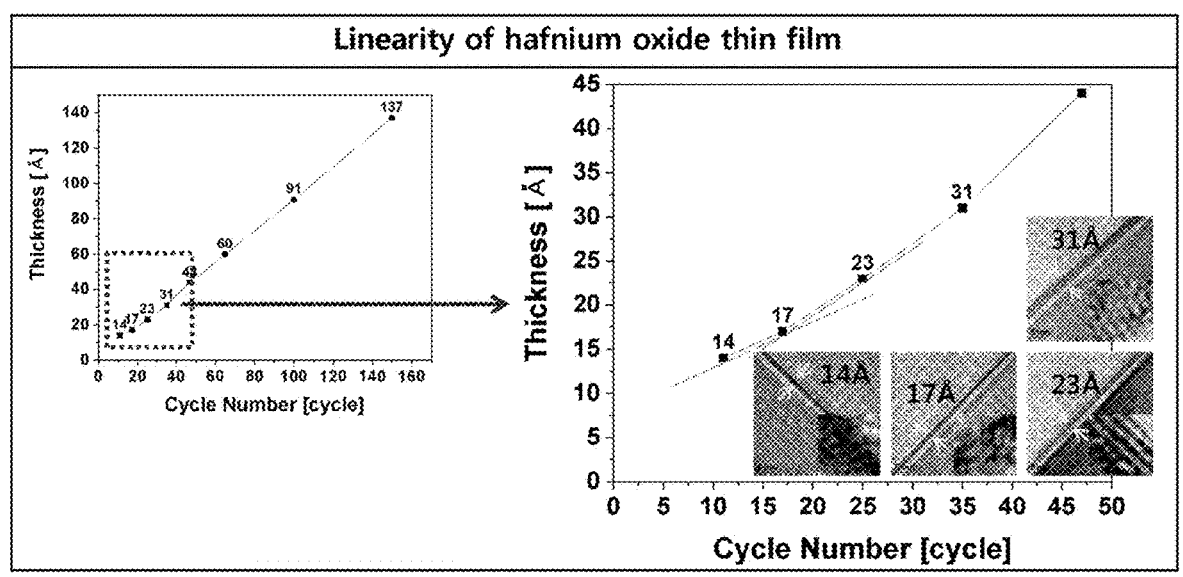

[FIG. 14]
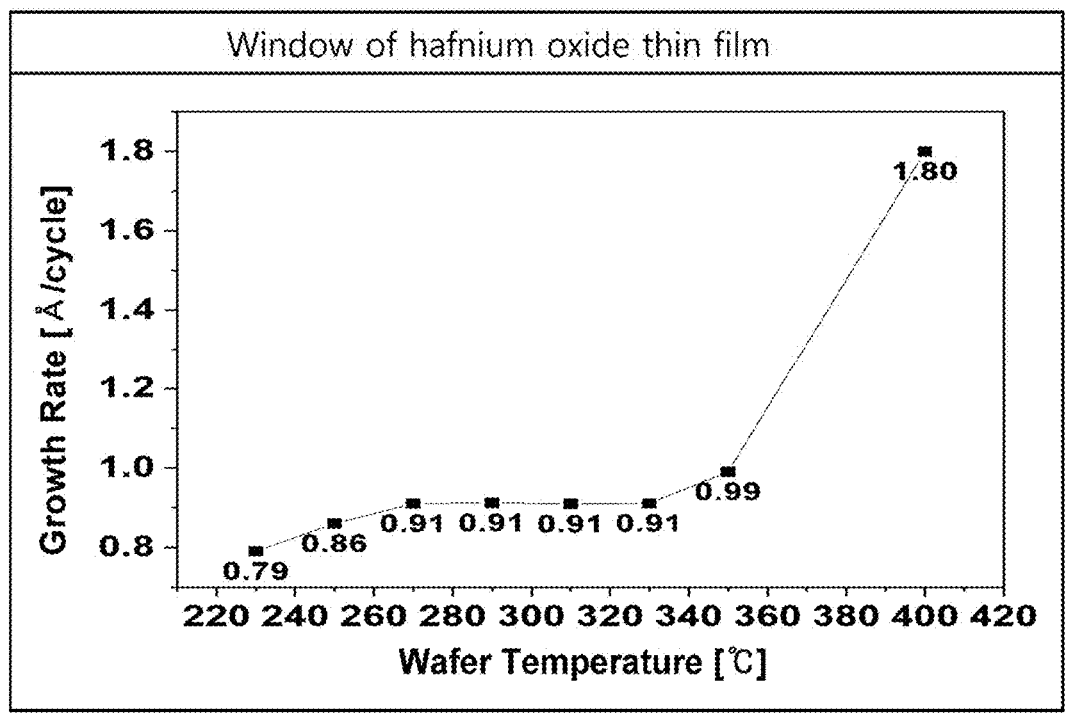
[FIG. 15]
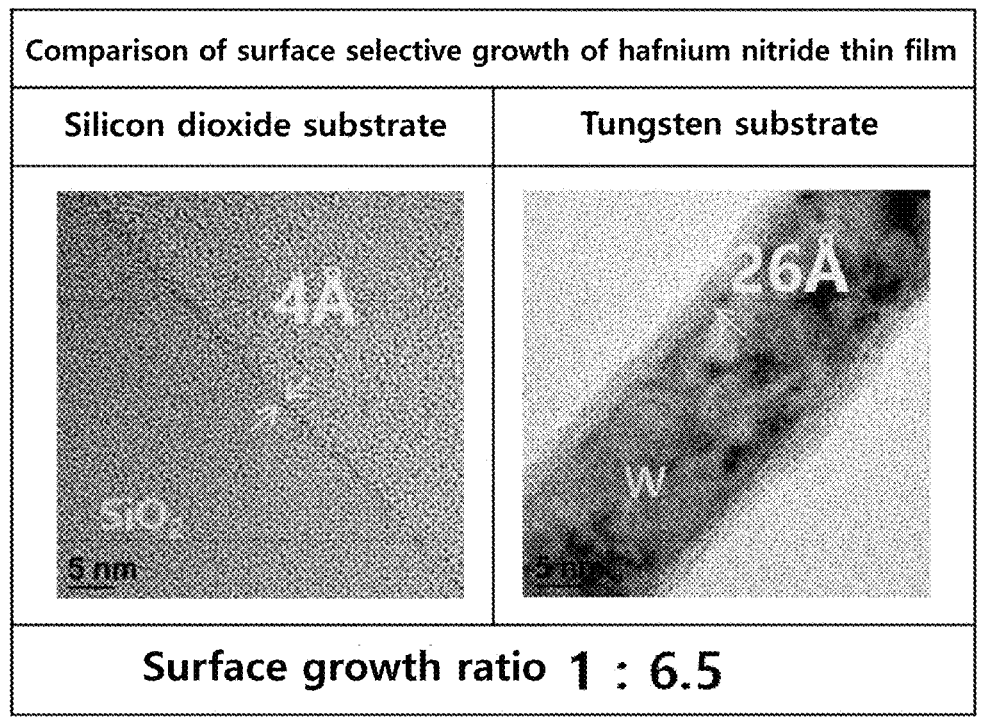

[FIG. 16]
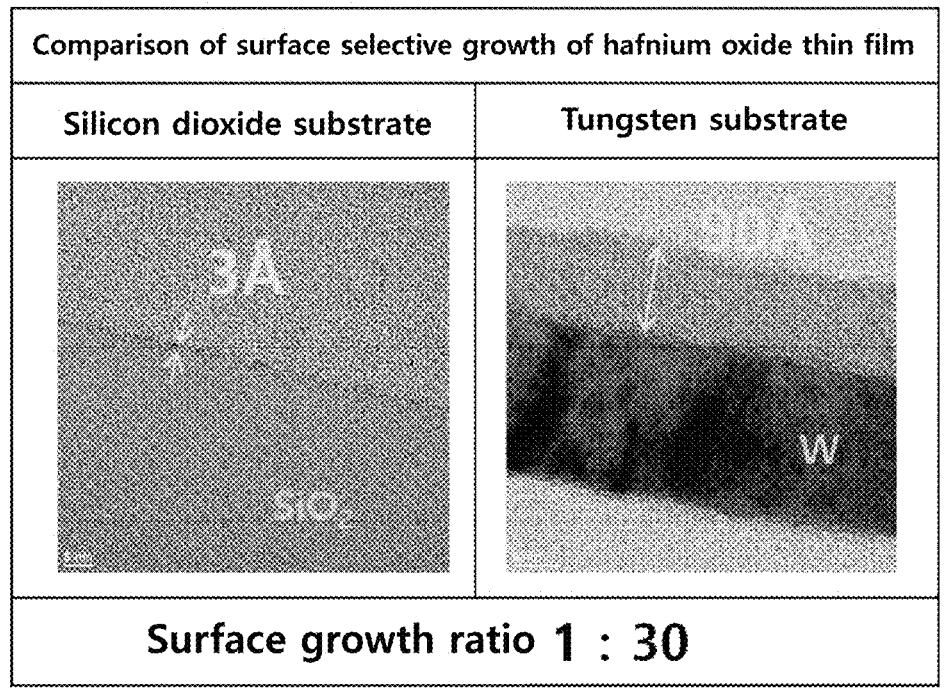
[FIG. 17]
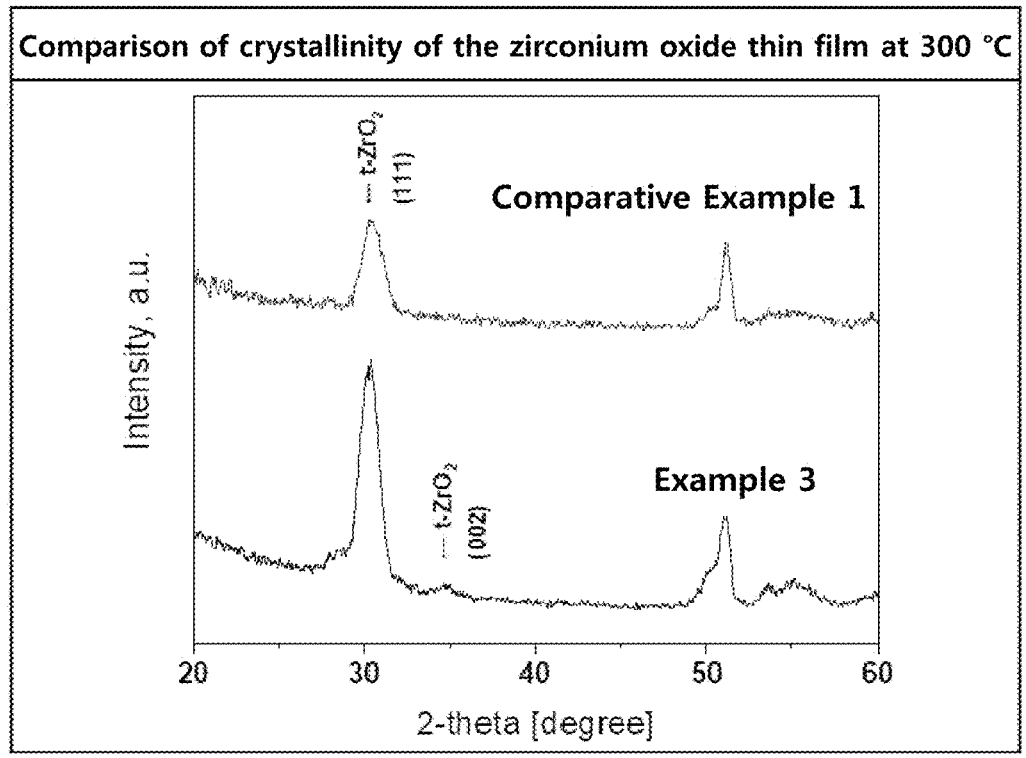

[FIG. 18]
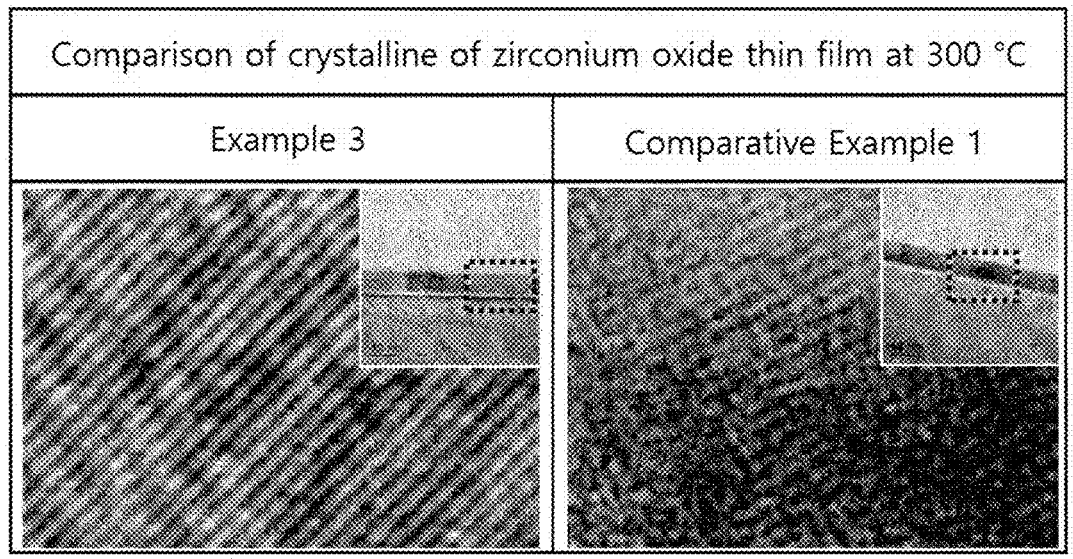
[FIG. 19]
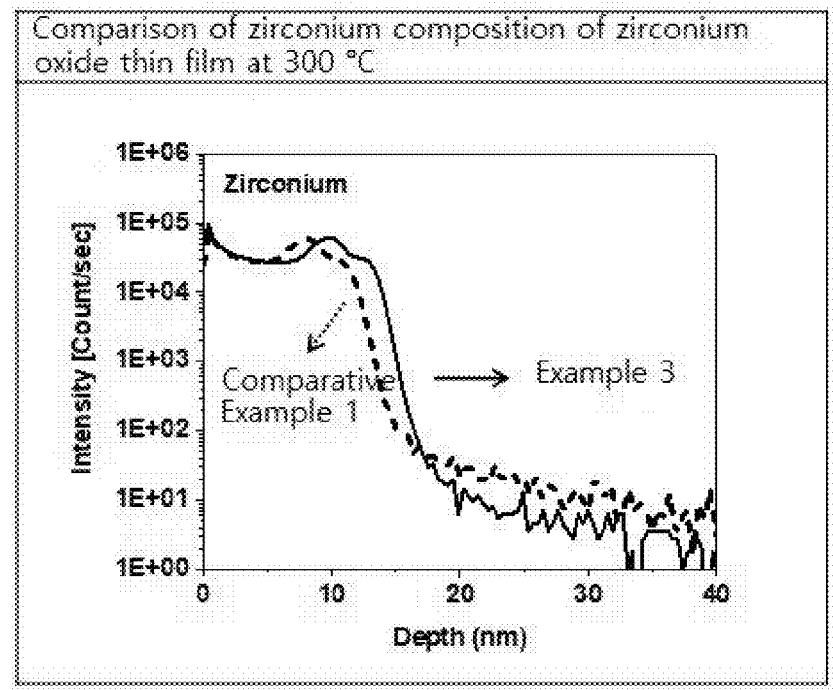

[FIG. 20]
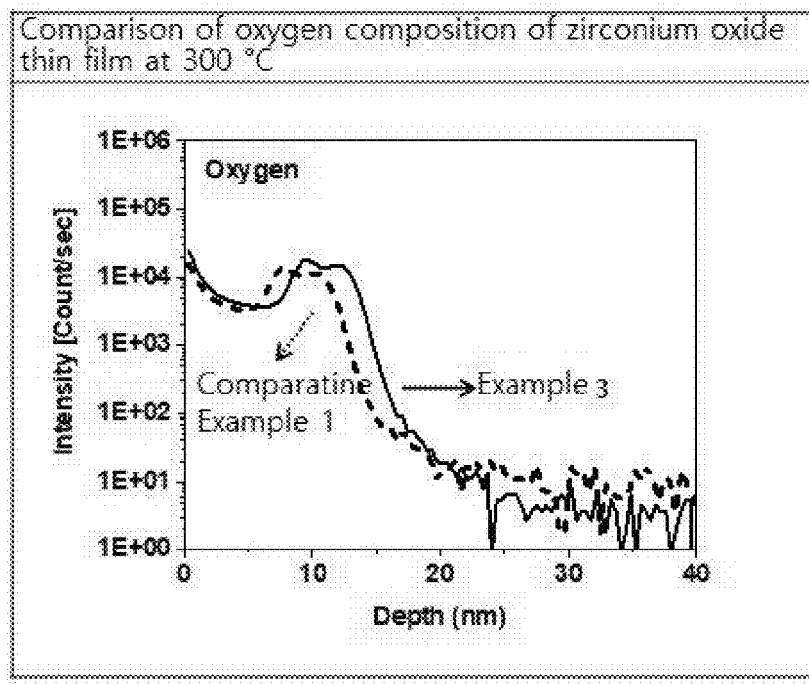
[FIG. 21]
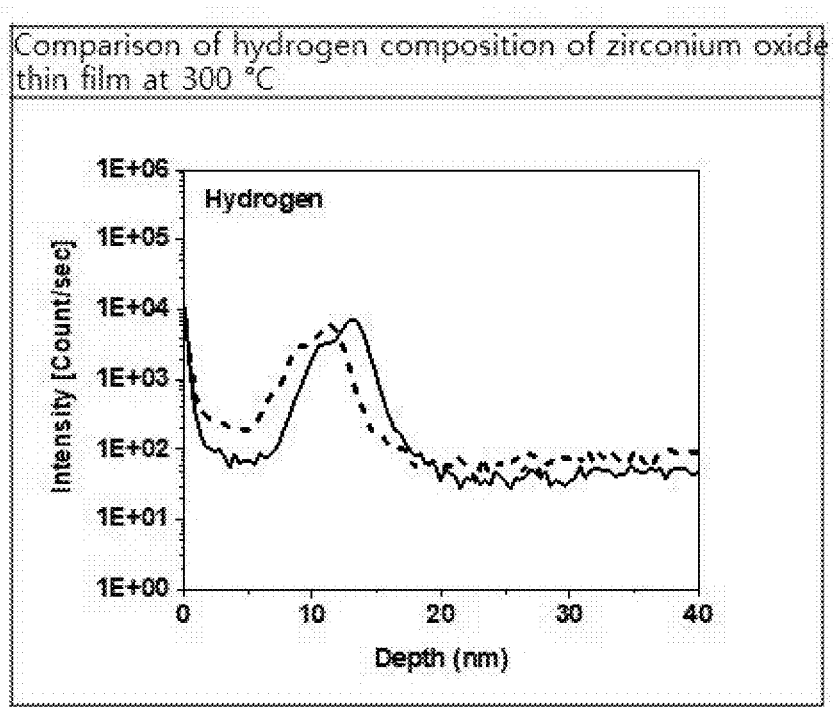

[FIG. 22]
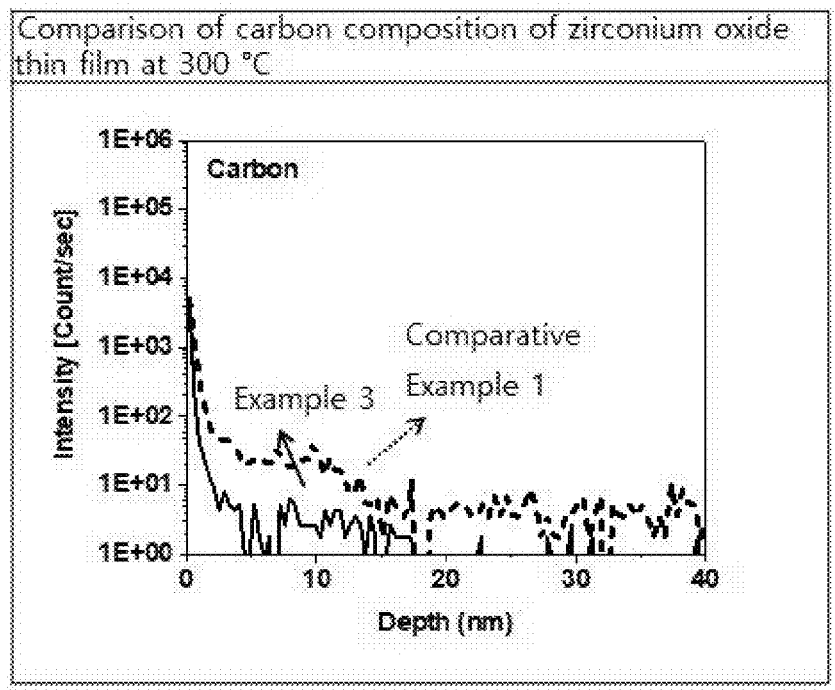
[FIG. 23]
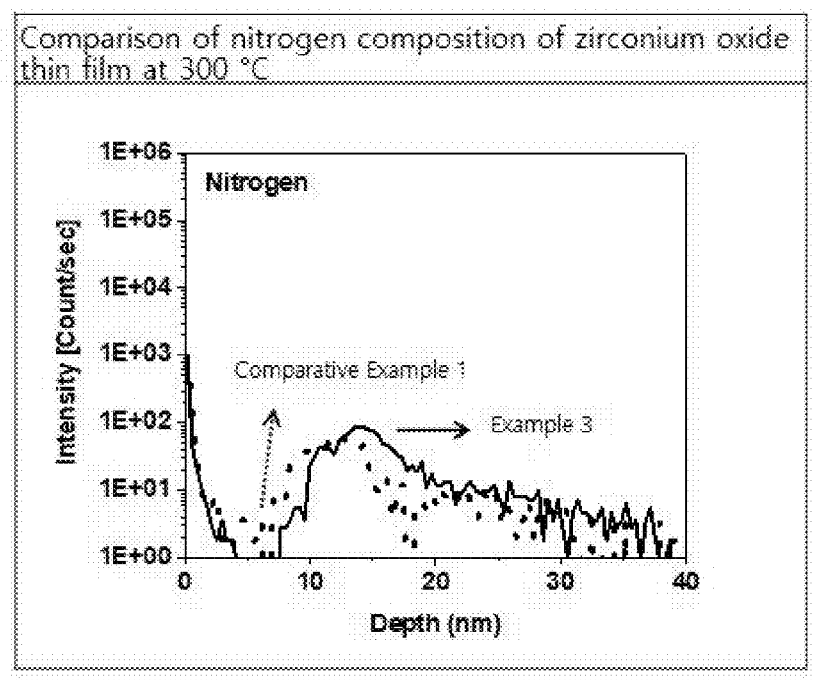

[FIG. 24]
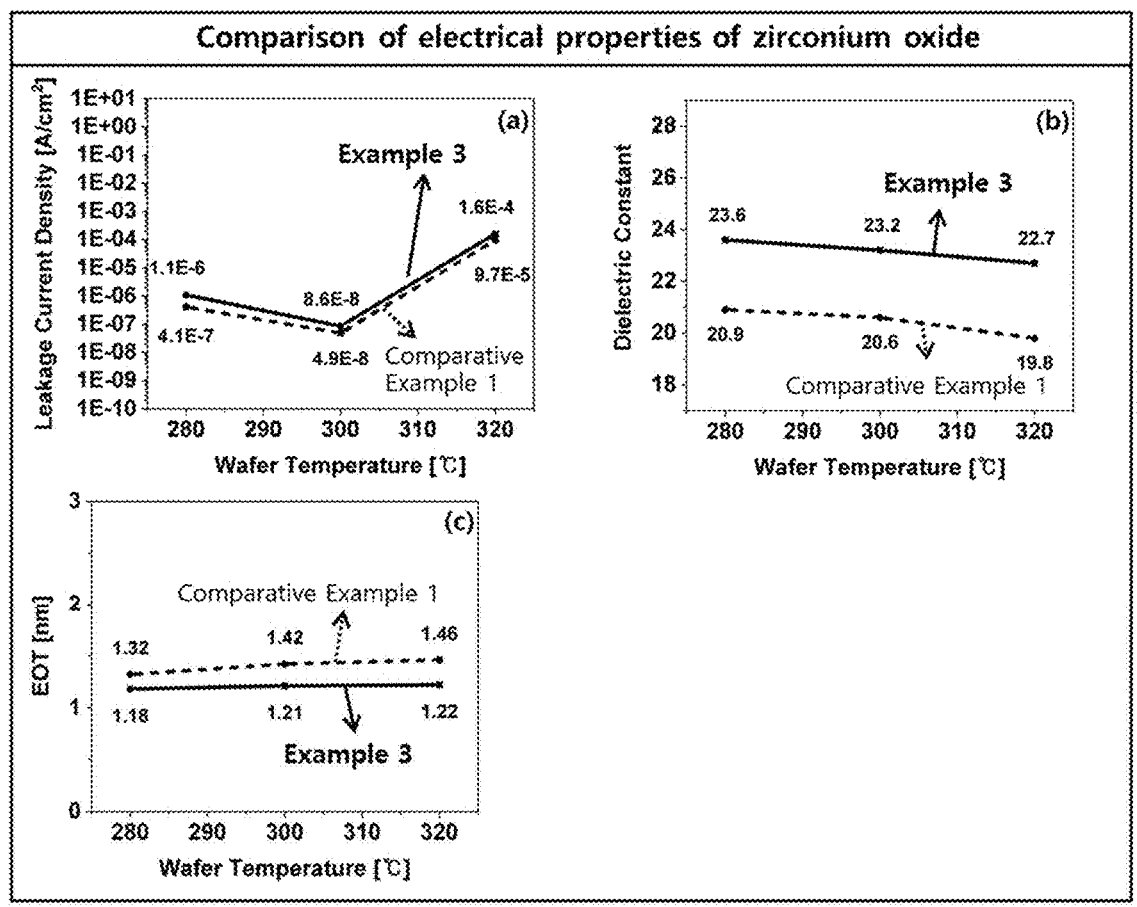

[FIG. 25]
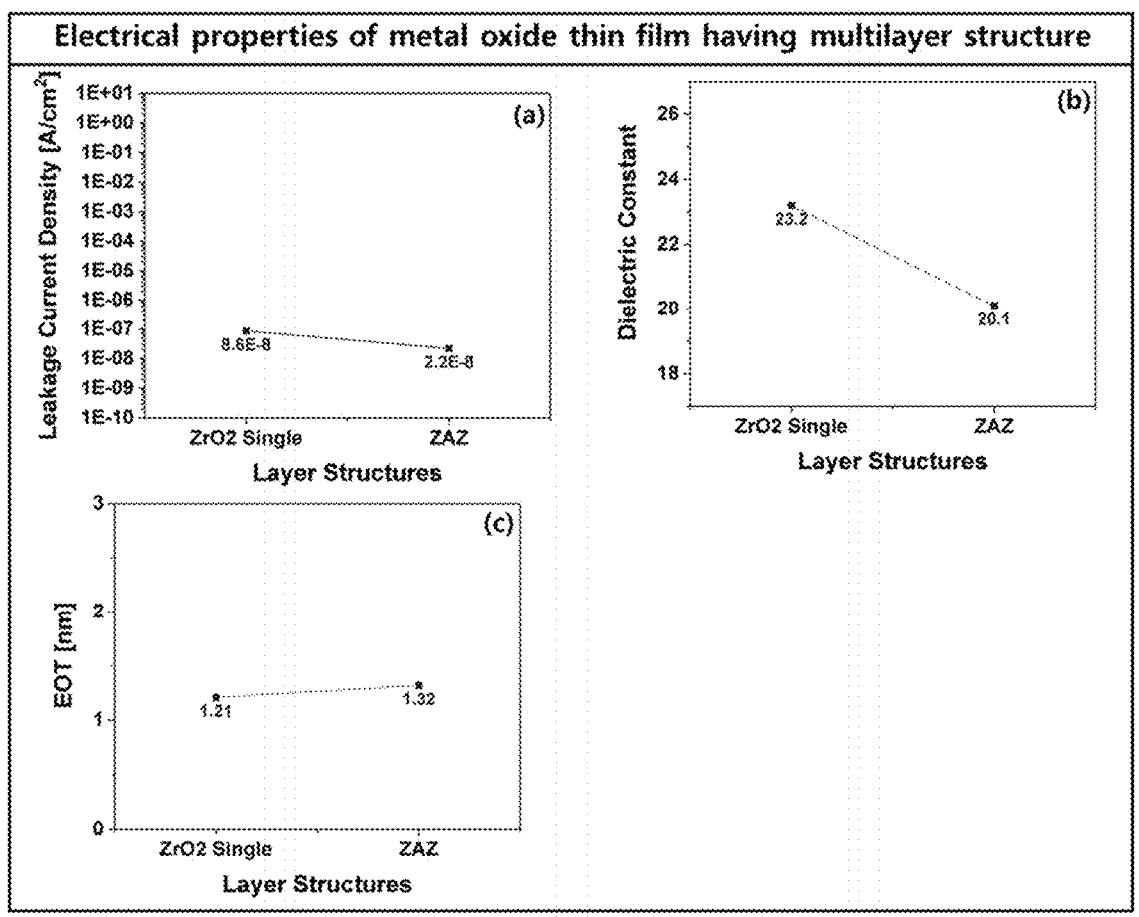

METAL TRIAMINE COMPOUND, METHOD FOR PREPARING THE SAME, AND COMPOSITION FOR DEPOSITING METAL-CONTAINING THIN FILM INCLUDING THE SAME

CROSS-REFERENCE TO RELATED APPLICATIONS

The present application is a U.S. National Phase of International Patent Application Serial No. PCT/KR2018/004841 entitled "METAL TRIAMINE COMPOUND, METHOD FOR PREPARING THE SAME, AND COMPOSITION FOR DEPOSITING METAL-CONTAINING THIN FILM INCLUDING THE SAME," filed on Apr. 26, 2018. International Patent Application Serial No. PCT/KR2018/004841 claims priority to Korean Patent Application No. 10-2017-0054290, filed on Apr. 27, 2017, Korean Patent Application No. 10-2017-0062801, filed on May 22, 2017, Korean Patent Application No. 10-2017-0063332, filed on May 23, 2017, and Korean Patent Application No. 10-2018-0047876, filed on Apr. 25, 2018. The entire contents of each of the above-cited applications are hereby incorporated by reference in their entirety for all purposes.

TECHNICAL FIELD

The present invention relates to a novel metal triamine compound, a method for preparing the same, and a composition for depositing a metal-containing thin film including the same, and more particularly, to a novel metal triamine compound which may be useful as a precursor of a metal-containing thin film, and a method for preparing the same, a composition for depositing a metal-containing thin film including the same, and a method for preparing a metal-containing thin film using the composition for depositing a metal-containing thin film of the present invention.

BACKGROUND ART

With the development of the semiconductor manufacturing technology, the size of the semiconductor element gets smaller, and the integration of the element is rapidly increased, and thus, the use of chemical vapor deposition and atomic layer deposition during the manufacturing process is gradually increased. In addition, the thin film formation by chemical vapor deposition and atomic layer deposition is greatly affected by the physical and chemical properties of the precursor compound according to the use purpose.

As the improvement of system performance, and higher density integration and higher speed of a transistor which is a key component of the element are required, attempts have been made to continuously decrease the size of integrated circuits to increase the switching speed, and to decrease the power loss. Accordingly, the higher speed of the transistor has been achieved by decreasing the distance between channels and decreasing the thickness of a gate oxide film. However, since SiO2 which is the previously used gate oxide film has a problem of having increased leakage current at 80 nm or less, in order to overcome this limitation, it is essential to apply a high-k material having excellent insulation, high dielectric constant, and a low dielectric loss.

In order to solve these problems, a high-k metal oxide material which is a high-k material having excellent insulation, a high dielectric constant and a low dielectric loss has been suggested as an alternative dielectric material for a gate or capacitor dielectric.

Meanwhile, Group 4 transition metal precursors according to a prior art, for example, U.S. Pat. No. 8,471,049, etc., are not thermally stable at high temperature, and thus, are disadvantageous in that they have low deposition rate and growth rate in chemical vapor deposition (CVD) and atomic layer deposition (ALD) processes.

Thus, in order to solve the above problems, the present inventors have developed a precursor for depositing a metal-containing thin film having high thermal stability, high volatility and a stable vapor pressure.

DISCLOSURE

Technical Problem

An object of the present invention is to provide a metal triamine compound having high volatility, excellent thermal stability and excellent cohesion, thereby being usable as a precursor for depositing a metal-containing thin film, and capable of forming a surface selective thin film, and a method for preparing the same.

Another object of the present invention is to provide a composition for depositing a metal-containing thin film including the novel metal triamine compound of the present invention, and a method for preparing a metal-containing thin film using the composition.

Technical Solution

In one general aspect, a metal triamine compound having low activation energy to have excellent reactivity, high volatility, excellent thermal stability, and excellent cohesion, thereby being usable as a precursor for depositing a metal-containing thin film, and capable of forming a surface selective thin film is provided, and the metal triamine compound of the present invention is represented by the following Chemical Formula 1:

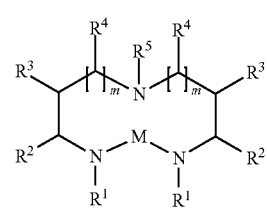

[Chemical Formula 1]

wherein
M is $M^1(A^1)$, $M^2(A^2)(A^3)$, $M^3(A^2)(A^3)(A^4)$, $M^4(=NR')_2$ or $M^4(CO)_4$;
$M^1$ is a Group 13 metal or a lanthanide metal;
$M^2$ is a Group 4 transition metal;
$M^3$ is a Group 5 transition metal;
$M^4$ is a Group 6 transition metal;
R' is (C1-C7) alkyl;
$R^1$ to $R^5$ are each independently hydrogen or (C1-C7) alkyl;
$A^1$ is (C1-C7)alkyl, $NR^6R^7$, $OR^8$, a cyclopentadienyl ring or a fused ring containing the cyclopentadienyl ring;
$A^2$, $A^3$ and $A^4$ are each independently $NR^6R^7$, $OR^8$, a cyclopentadienyl ring or a fused ring containing the cyclopentadienyl ring;

the cyclopentadienyl ring or the fused ring containing the cyclopentadienyl ring in $A^1$, $A^2$, $A^3$ and $A^4$ may be further substituted with (C1-C7)alkyl or (C2-C7)alkenyl;

$R^6$, $R^7$ and $R^8$ are each independently (C1-C7)alkyl or $SiR^9R^{10}R^{11}$;

$R^9$ to $R^{11}$ are each independently (C1-C7)alkyl; and m is an integer of 0 to 2.

The metal triamine compound of Chemical Formula 1 according to an exemplary embodiment of the present invention may be preferably represented by the following Chemical Formula 2 or 3:

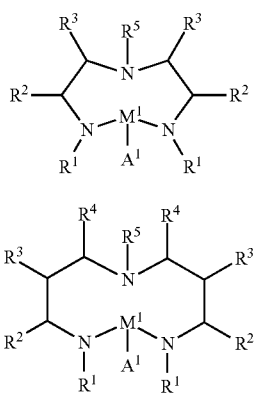

[Chemical Formula 2]

[Chemical Formula 3]

wherein $M^1$ is B, Al, Ga, In or La;

$R^1$ to $R^5$ are each independently a hydrogen atom or (C1-C5)alkyl;

$A^1$ is (C1-C5)alkyl, $NR^6R^7$, $OR^8$ or a cyclopentadienyl ring;

$R^6$, $R^7$ and $R^8$ are each independently (C1-C5)alkyl or $SiR^9R^{10}R^{11}$; and $R^9$ to $R^{11}$ are each independently (C1-C5)alkyl.

The metal triamine compound of Chemical Formula 1 according to an exemplary embodiment of the present invention may be preferably represented by the following Chemical Formula 4 or 5:

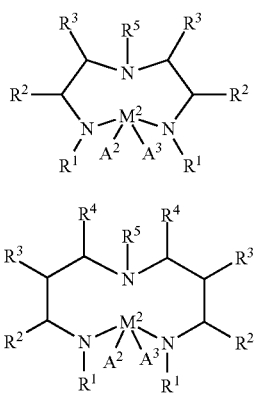

[Chemical Formula 4]

[Chemical Formula 5]

wherein $M^2$ is Ti, Zr or Hf;

$R^1$ to $R^5$ are each independently a hydrogen atom or (C1-C5)alkyl;

$A^2$ and $A^3$ are each independently $NR^6R^7$, $OR^8$ or a cyclopentadienyl ring;

$R^6$, $R^7$ and $R^8$ are each independently (C1-C5)alkyl or $SiR^9R^{10}R^{11}$; and $R^9$ to $R^{11}$ are each independently (C1-C5)alkyl.

The metal triamine compound according to an exemplary embodiment of the present invention may be preferably represented by the following Chemical Formula 4-1 or 4-2:

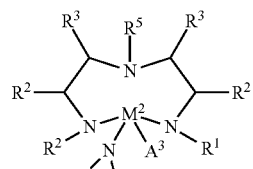

[Chemical Formula 4-1]

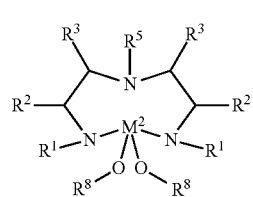

[Chemical Formula 4-2]

wherein $M^2$ is Ti, Zr or Hf;

$R^1$ to $R^3$ and $R^5$ are each independently a hydrogen atom or (C1-C5)alkyl;

$A^3$ is $NR^6R^7$ or a cyclopentadienyl ring;

$R^6$, $R^7$ and $R^8$ are each independently (C1-C5)alkyl or $SiR^9R^{10}R^{11}$; and $R^9$ to $R^{11}$ are each independently (C1-C5)alkyl.

In the metal triamine compound according to an exemplary embodiment of the present invention, more preferably in the above Chemical Formulae 4-1 and 4-2, $R^1$ and $R^5$ may be each independently (C1-C3)alkyl, $R^2$ and $R^3$ may be each independently hydrogen or (C1-C3)alkyl, $R^6$ and $R^7$ may be each independently (C1-C3)alkyl or $SiR^9R^{10}R^{11}$, $R^9$ to $R^{11}$ may be each independently (C1-C3)alkyl, and $R^8$ may be (C1-C4)alkyl.

The metal triamine compound of Chemical Formula 1 according to an exemplary embodiment of the present invention may be preferably represented by the following Chemical Formula 6 or 7:

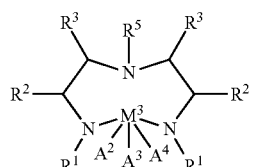

[Chemical Formula 6]

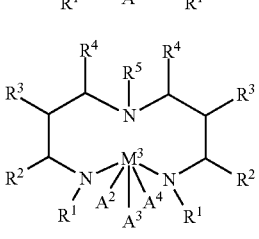

[Chemical Formula 7]

wherein $M^3$ is V, Nb or Ta;

$R^1$ to $R^5$ are each independently a hydrogen atom or (C1-C5)alkyl;

$A^2$, $A^3$ and $A^4$ are each independently $NR^6R^7$, $OR^8$ or a cyclopentadienyl ring;

$R^6$, $R^7$ and $R^8$ are each independently (C1-C5)alkyl or $SiR^9R^{10}R^{11}$; and $R^9$ to $R^{11}$ are each independently (C1-C5)alkyl.

In the metal triamine compound of Chemical Formula 6 or 7 according to an exemplary embodiment of the present invention, more preferably $R^1$ and $R^5$ may be each independently (C1-C3)alkyl, $R^2$ to $R^4$ may be each independently hydrogen or (C1-C3)alkyl, $A^2$, $A^3$ and $A^4$ may be each independently $NR^6R^7$, $R^6$ and $R^7$ may be each independently (C1-C3)alkyl or $SiR^9R^{10}R^{11}$, and $R^9$ to $R^{11}$ may be each independently (C1-C3)alkyl.

The metal triamine compound of Chemical Formula 1 according to an exemplary embodiment of the present invention may be preferably represented by the following Chemical Formula 8 or 9:

[Chemical Formula 8]

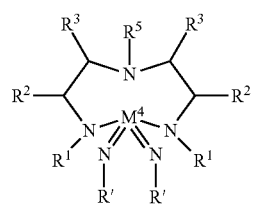

[Chemical Formula 9]

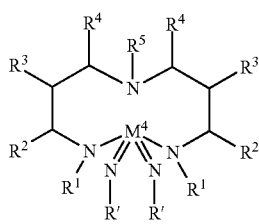

wherein
$M^4$ is Cr, Mo or W;
$R^1$ to $R^5$ are each independently a hydrogen atom or (C1-C5)alkyl; and
R' is (C1-C5) alkyl.

The metal triamine compound of Chemical Formula 1 according to an exemplary embodiment of the present invention may be preferably represented by the following Chemical Formula 10 or 11:

[Chemical Formula 10]

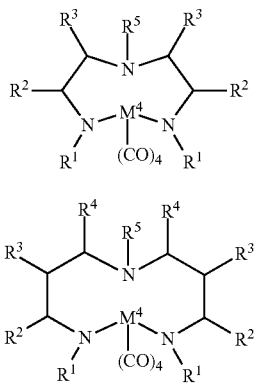

[Chemical Formula 11]

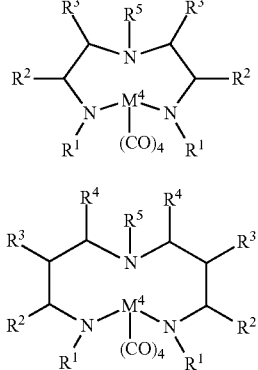

wherein
$M^4$ is Cr, Mo or W;
$R^1$ to $R^5$ are each independently a hydrogen atom or (C1-C5)alkyl.

Specifically, the metal triamine compound of Chemical Formula 1 according to an exemplary embodiment of the present invention may be selected from the following compounds, but not limited thereto:

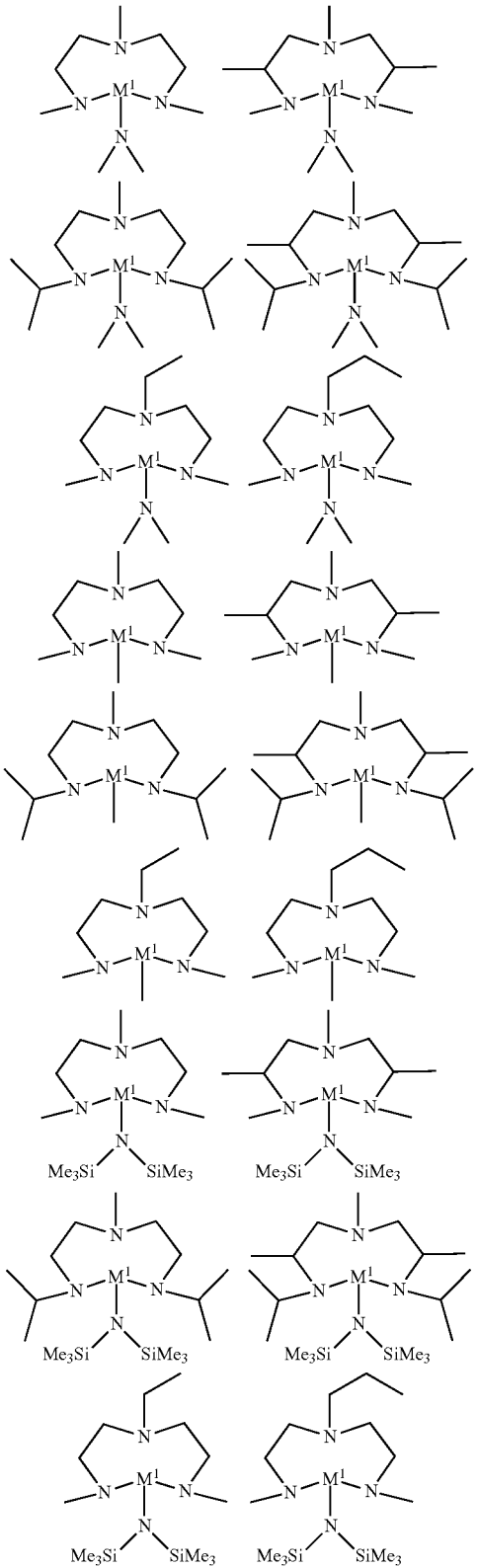

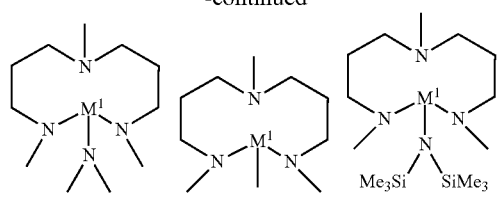
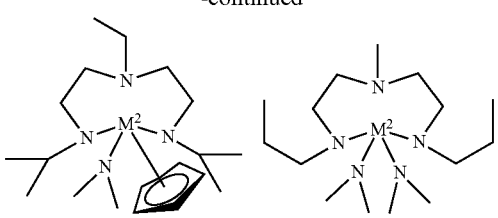
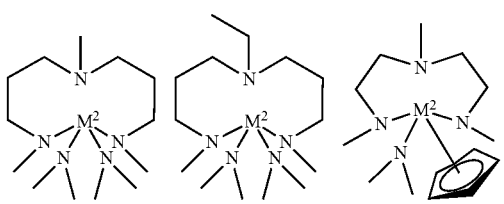
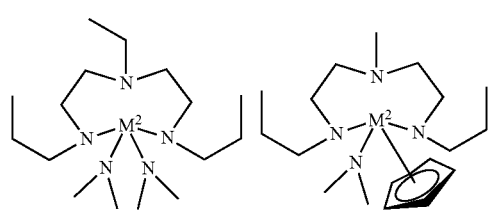
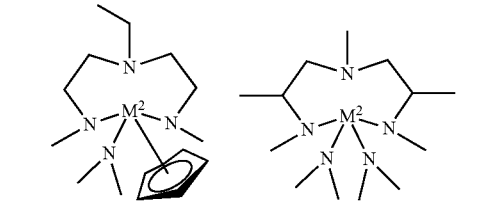
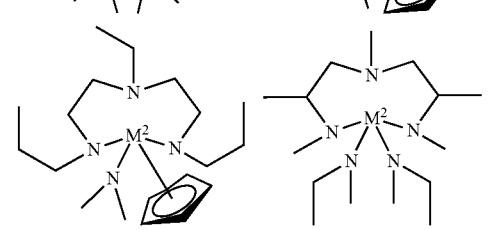
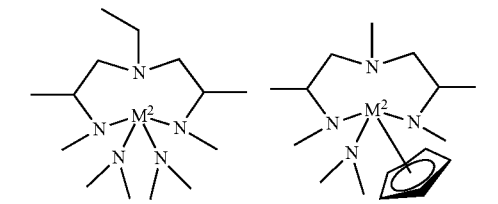
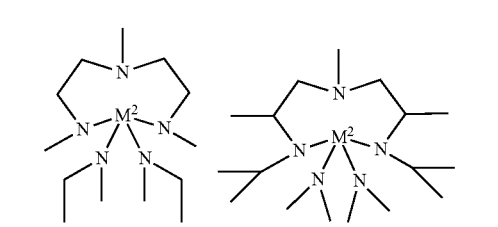
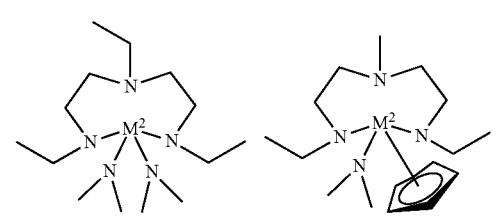
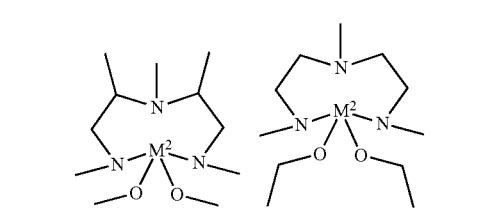
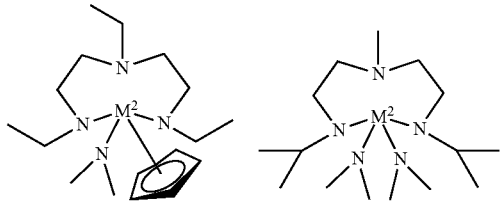
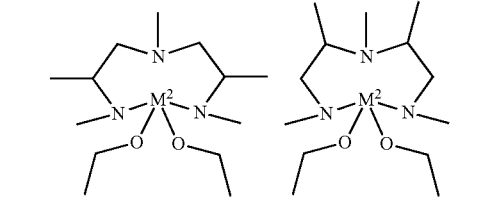
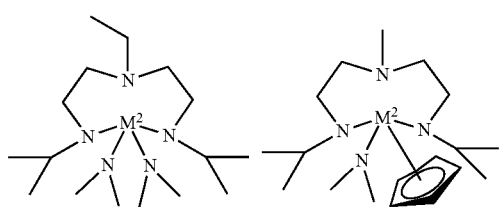
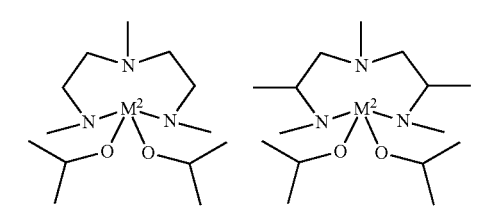

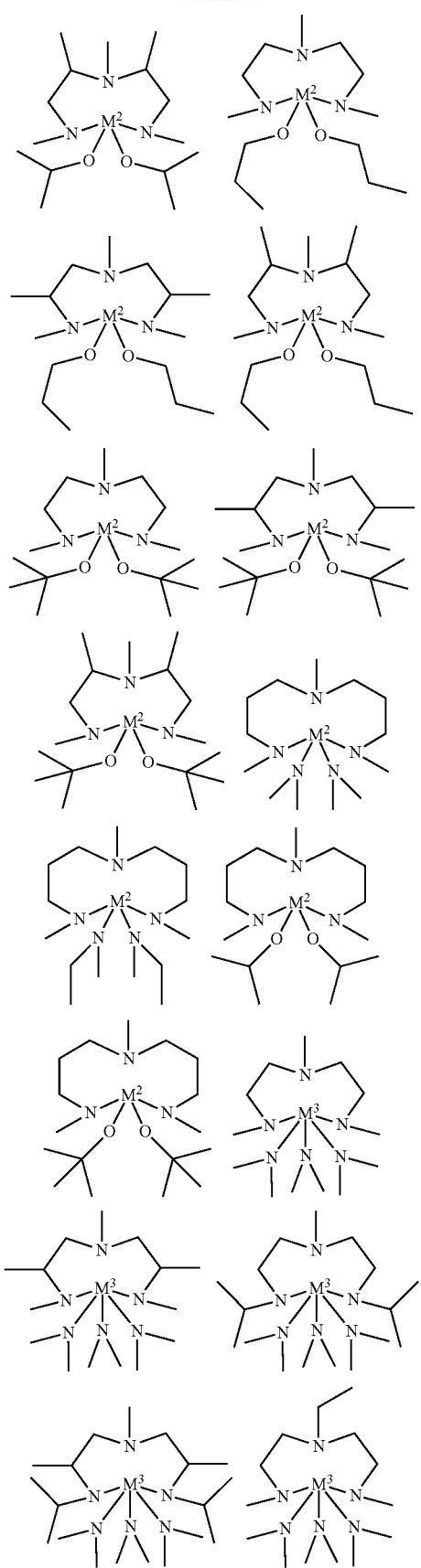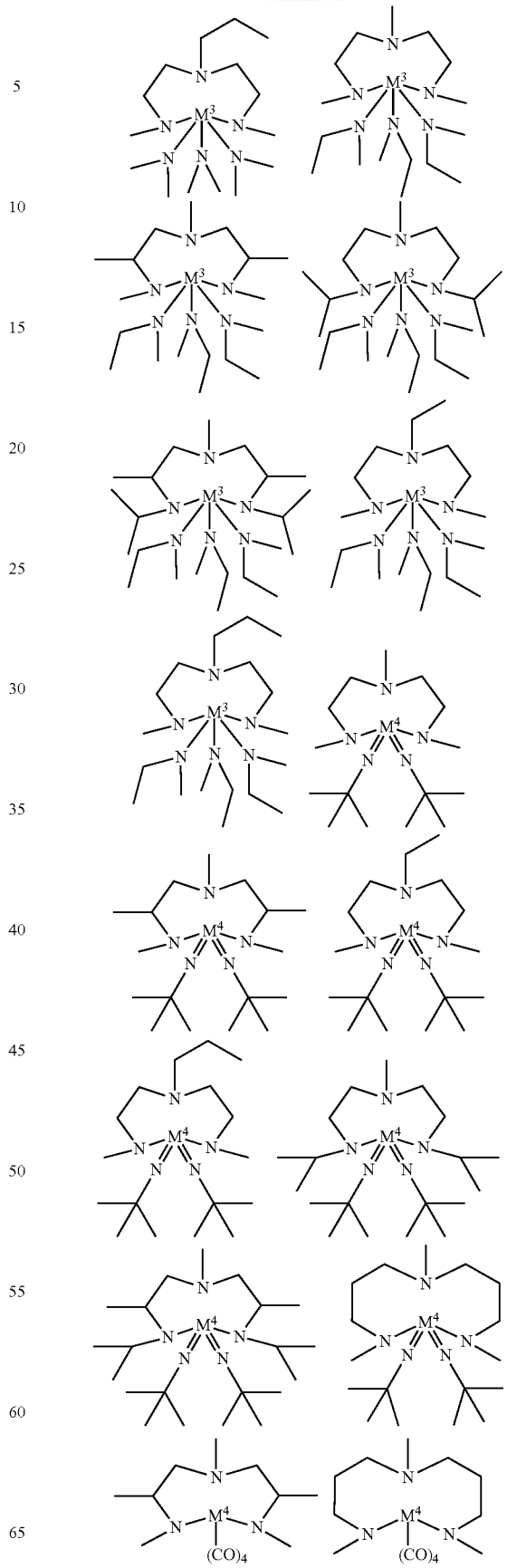

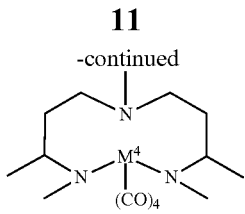

wherein $M^1$ is B, Al, Ga, In, Ti or La; $M^2$ is Ti, Zr or Hf; $M^3$ is V, Nb or Ta; and $M^4$ is Cr, Mo or W.

In another general aspect, a method for preparing the metal triamine compound represented by Chemical Formula 1 is provided.

In an exemplary embodiment of the present invention, in Chemical Formula 1, the compound wherein M is $M^1(A^1)$ is represented by Chemical Formula I, the compound wherein M is $M^2(A^2)(A^3)$ is represented by Chemical Formula II, the compound wherein M is $M^3(A^2)(A^3)(A^4)$ is represented by Chemical Formula III, the compound wherein M is $M^4(=NR')_2$ is represented by Chemical Formula IV, and the compound wherein M is $M^4(CO)_4$ is represented by Chemical Formula V.

A method for preparing the metal triamine compound of the following Chemical Formula I wherein M is $M^1(A^1)$ in the metal triamine compound of Chemical Formula 1 according to an exemplary embodiment of the present invention, includes reacting the dialkylenetriamine compound of the following Chemical Formula A and the metal precursor of the following Chemical Formula B to prepare the metal triamine compound of Chemical Formula I:

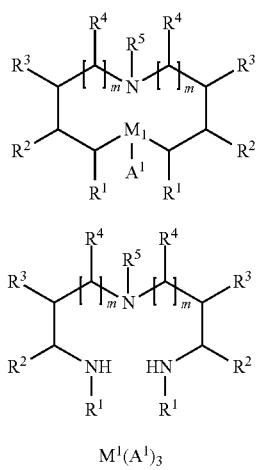

[Chemical Formula I]

[Chemical Formula A]

[Chemical Formula B]

$M^1(A^1)_3$ wherein $M^1$ is a Group 13 metal or a lanthanide metal;

$R^1$ to $R^5$ are each independently hydrogen or (C1-C7) alkyl;

$A^1$ is (C1-C5)alkyl, $NR^6R^7$, $OR^8$, a cyclopentadienyl ring or a fused ring containing the cyclopentadienyl ring, and the cyclopentadienyl ring or the fused ring containing the cyclopentadienyl ring of $A^1$ may be further substituted with (C1-C7)alkyl or (C2-C7)alkenyl;

$R^6$, $R^7$ and $R^8$ are each independently (C1-C7)alkyl or $SiR^9R^{10}R^{11}$;

$R^9$ to $R^{11}$ are each independently (C1-C7)alkyl; and m is an integer of 0 to 2.

A method for preparing the metal triamine compound of the following Chemical Formula II-1 wherein M is $M^2(A^2)$ ($A^3$) in the metal triamine compound of Chemical Formula 1 according to an exemplary embodiment of the present invention, includes reacting the dialkylenetriamine compound of the following Chemical Formula A and the metal precursor of the following Chemical Formula C to prepare the metal triamine compound of Chemical Formula II-1:

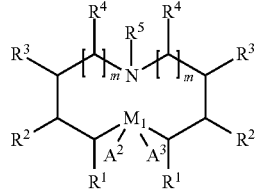

[Chemical Formula II-1]

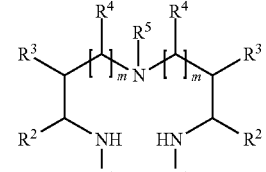

[Chemical Formula A]

$M^2(A^2)_x(A^3)_{4-x}$

[Chemical Formula C]

wherein $M^2$ is a Group 4 transition metal;

$R^1$ to $R^5$ are each independently hydrogen or (C1-C7) alkyl;

$A^2$ and $A^3$ are each independently $NR^6R^7$, a cyclopentadienyl ring or a fused ring containing the cyclopentadienyl ring, and the cyclopentadienyl ring or the fused ring containing the cyclopentadienyl ring of $A^2$ and $A^3$ may be further substituted with (C1-C7)alkyl or (C2-C7)alkenyl;

$R^6$ and $R^7$ are each independently (C1-C7)alkyl or $SiR^9R^{10}R^{11}$;

$R^9$ to $R^{11}$ are each independently (C1-C7)alkyl;

m is an integer of 0 to 2; and x is an integer of 1 to 3.

A method for preparing the metal triamine compound of Chemical Formula II-1 wherein M is $M^2(A^2)(A^3)$ in the metal triamine compound of Chemical Formula 1 according to an exemplary embodiment of the present invention, includes reacting the dialkylenetriamine lithium salt compound of the following Chemical Formula D and the metal halide precursor of the following Chemical Formula E to prepare the metal triamine compound of Chemical Formula II-1:

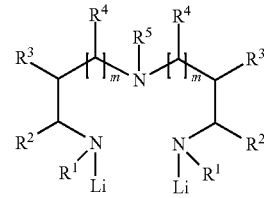

[Chemical Formula D]

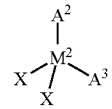

[Chemical Formula E]

wherein $M^2$ is a Group 4 transition metal;

X is halogen;

$R^1$ to $R^5$ are each independently hydrogen or (C1-C7)alkyl;

$A^2$ and $A^3$ are each independently $NR^6R^7$, a cyclopentadienyl ring or a fused ring containing the cyclopentadienyl ring, and the cyclopentadienyl ring or the fused ring containing the cyclopentadienyl ring of $A^2$ and $A^3$ may be further substituted with (C1-C7)alkyl or (C2-C7)alkenyl;

$R^6$ and $R^7$ are each independently (C1-C7)alkyl or $SiR^9R^{10}R^{11}$;

$R^9$ to $R^{11}$ are each independently (C1-C7)alkyl; and m is an integer of 0 to 2.

The dialkylenetriamine lithium salt compound of Chemical Formula D may be prepared by reacting the dialkylenetriamine compound of the following Chemical Formula A and (C1-C7)alkyllithium:

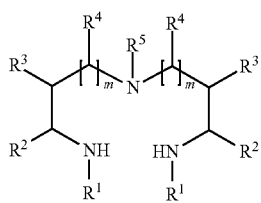

[Chemical Formula A]

wherein $R^1$ to $R^5$ are each independently hydrogen or (C1-C7)alkyl; and m is an integer of 0 to 2.

A method for preparing the metal triamine compound of the following Chemical Formula II-2 wherein M is $M^2(A^2)(A^3)$ in the metal triamine compound of Chemical Formula 1 according to an exemplary embodiment of the present invention, includes reacting the dialkylenetriamine compound of the following Chemical Formula A with the metal precursor of the following Chemical Formula C-1, and then reacting the product with the alcohol compound of the following Chemical Formula F, thereby preparing the metal triamine compound of Chemical Formula II-2:

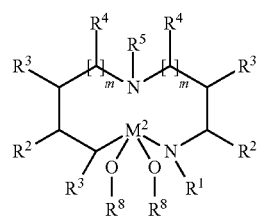

[Chemical Formula II-2]

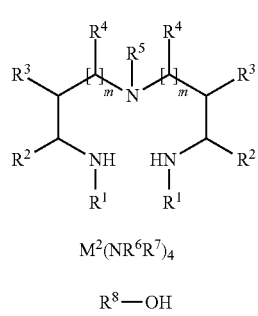

[Chemical Formula A]

$M^2(NR^6R^7)_4$     [Chemical Formula C-1]

$R^8$—OH     [Chemical Formula F]

wherein $M^2$ is a Group 4 transition metal;

$R^1$ to $R^5$ are each independently hydrogen or (C1-C7)alkyl;

$R^6$, $R^7$ and $R^8$ are each independently (C1-C7)alkyl; and m is an integer of 0 to 2.

A method for preparing the metal triamine compound of the following Chemical Formula III wherein M is $M^3(A^2)(A^3)(A^4)$ in the metal triamine compound of Chemical Formula 1 according to an exemplary embodiment of the present invention, includes reacting the dialkylenetriamine compound of the following Chemical Formula A and the metal precursor of the following Chemical Formula G to prepare the metal triamine compound of Chemical Formula III:

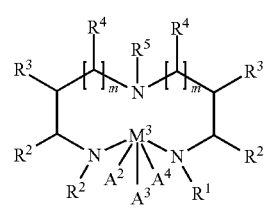

[Chemical Formula III]

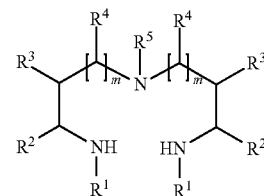

[Chemical Formula A]

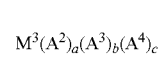

[Chemical Formula G]

wherein $M^3$ is a Group 5 transition metal;

$R^1$ to $R^5$ are each independently hydrogen or (C1-C7)alkyl;

$A^2$, $A^3$ and $A^4$ are each independently $NR^6R^7$, $OR^8$, a cyclopentadienyl ring or a fused ring containing the cyclopentadienyl ring, and the cyclopentadienyl ring or the fused ring containing the cyclopentadienyl ring of $A^2$, $A^3$ and $A^4$ may be further substituted with (C1-C7)alkyl or (C2-C7)alkenyl;

$R^6$, $R^7$ and $R^8$ are each independently (C1-C7)alkyl or $SiR^9R^{10}R^{11}$;

$R^9$ to $R^{11}$ are each independently (C1-C7)alkyl;

m is an integer of 0 to 2; and a, b and c are each independently an integer of 1 or more, and a+b+c is an integer of 5.

A method for preparing the metal triamine compound of the following Chemical Formula IV wherein M is $M^4(=NR')_2$ in the metal triamine compound of Chemical Formula 1 according to an exemplary embodiment of the present invention, includes reacting the compound of the following Chemical Formula H and the dialkylenetriamine lithium salt compound of the following Chemical Formula D to prepare the metal triamine compound of Chemical Formula IV:

[Chemical Formula IV]

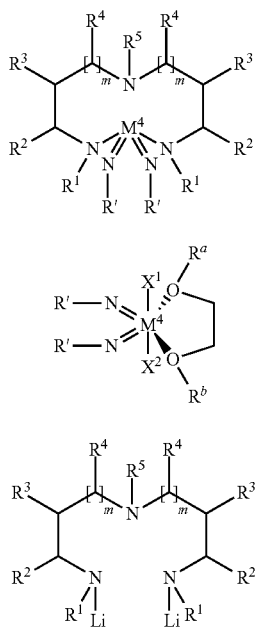

[Chemical Formula V]

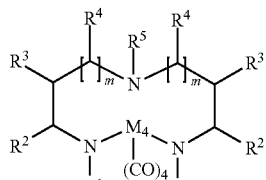

[Chemical Formula H]

[Chemical Formula A]

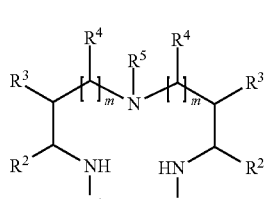

[Chemical Formula D]

[Chemical Formula L]

$M^4(CO)_6$ wherein $M^4$ is a Group 6 transition metal;

$R^1$ to $R^5$ are each independently hydrogen or (C1-C7) alkyl; and m is an integer of 0 to 2.

In another general aspect, a composition for depositing a metal-containing thin film includes the metal triamine compound of the present invention.

In another general aspect, a method for preparing a metal-containing thin film uses the composition for depositing a metal-containing thin film of the present invention.

The method for preparing a metal-containing thin film of the present invention may be performed by atomic layer deposition (ALD), low pressure chemical vapor deposition (LPCVD), chemical vapor deposition (CVD), metalorganic chemical vapor deposition (MOCVD), plasma enhanced chemical vapor deposition (PECVD), or plasma enhanced atomic layer deposition (PEALD), with supply of any one or two or more gases selected from the group consisting of oxygen ($O_2$), ozone ($O_3$), distilled water ($H_2O$), hydrogen peroxide ($H_2O_2$), nitrogen monoxide (NO), nitrous oxide ($N_2O$), nitrogen dioxide ($NO_2$), ammonia ($NH_3$), nitrogen ($N_2$), hydrazine ($N_2H_4$), amine, diamine, carbon monoxide (CO), carbon dioxide ($CO_2$), $C_1$ to $C_{12}$ saturated or unsaturated hydrocarbon, hydrogen, argon and helium.

The method for preparing a metal-containing thin film of the present invention may specifically include:
a) maintaining the temperature of a substrate mounted in a chamber at 80 to 400° C.;
b) injecting carrier gas and the composition for depositing a metal-containing thin film; and
c) injecting reaction gas to deposit the metal-containing thin film on the substrate.

wherein $M^4$ is a Group 6 transition metal;

$R^1$ to $R^5$ are each independently hydrogen or (C1-C7) alkyl;

R' is (C1-C7) alkyl;

$X^1$ and $X^2$ are each independently halogen;

$R^a$ and $R^b$ are each independently (C1-C7)alkyl; and m is an integer of 0 to 2.

The compound of Chemical Formula H may be prepared by reacting $Na_2MoO_4$, the ethane compound of Chemical Formula J, triethylamine ($NEt_3$), chlorotrimethylsilane ($Me_3SiCl$), and the amine compound of Chemical Formula K.

[Chemical Formula J]

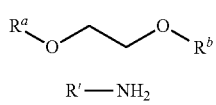

[Chemical Formula K]

R'—$NH_2$ wherein $R^a$ and $R^b$ are each independently (C1-C7)alkyl; and

R' is (C1-C7) alkyl.

A method for preparing the metal triamine compound of the following Chemical Formula IV wherein M is $M^4(CO)_4$ in the metal triamine compound of Chemical Formula 1 according to an exemplary embodiment of the present invention, includes reacting the metal hexacarbonyl precursor of the following Chemical Formula L with halogen, and then reacting the product with the dialkylenetriamine compound of the following Chemical Formula A to prepare the metal triamine compound of Chemical Formula V:

Advantageous Effects

The novel metal triamine compound of the present invention has excellent reactivity, high volatility, and excellent thermal stability and cohesion, thereby being very useful as a precursor of a metal-containing thin film.

Further, the novel metal triamine compound of the present invention has a low melting point, and is mostly present in a liquid state or in the state of solid having a low melting point at room temperature and at the temperature capable of being handled, and thus, is easily handled and has high thermal stability, thereby having very good storage stability.

That is, the metal triamine compound according to the present invention may form a high-purity metal-containing thin film, without contamination with particles due to pyrolysis or contamination with impurities such as carbon, and thus, may be applied to a high-k film in the semiconductor element.

Further, the composition for depositing a metal-containing thin film of the present invention includes the metal triamine compound of the present invention having high thermal stability as a precursor, and thus, is applied to various thin film deposition methods, and by using this, a high-purity metal-containing thin film having high density may be prepared.

The composition for depositing a metal-containing thin film of the present invention includes the metal triamine compound of the present invention which has high volatility, excellent thermal stability and cohesion, and a low melting point, and thus, is mostly present as a liquid at room temperature, as a precursor. Thus, when forming a metal-containing thin film using this composition, a high-purity metal-containing thin film which may have an excellent step coverage even at a high temperature of 260° C. or more, more preferably 300° C. or more, thereby having high density, may be obtained.

DESCRIPTION OF DRAWINGS

FIG. 1 is transmission electron microphotographs of step coverages of a zirconium oxide film using a $CH_3N(CH_2C(CH_3)HN(CH_3))_2Zr(N(CH_3)_2)_2$ precursor by temperature.

FIG. 2 is a transmission electron microphotograph of a step coverage of a titanium oxide film using a $CH_3N(CH_2CH_2N(CH_3))_2Ti(OCH(CH_3)_2)_2$ precursor.

FIG. 3 is transmission electron microphotographs of step coverages of a titanium oxide film using a $CH_3N(CH_2C(CH_3)HN(CH_3))_2Ti(N(CH_3)_2)_2$ precursor.

FIG. 4 is transmission electron microphotographs of step coverages of a hafnium oxide film using a $CH_3N(CH_2C(CH_3)HN(CH_3))_2Hf(N(CH_3)_2)_2$ precursor.

FIG. 5 is a transmission electron microphotograph of a step coverage of a titanium nitride film using a $CH_3N(CH_2C(CH_3)HN(CH_3))_2Ti(N(CH_3)_2)_2$ precursor.

FIG. 6 is a graph of saturation dependent upon a source amount of a zirconium oxide film using a $CH_3N(CH_2C(CH_3)HN(CH_3))_2Zr(N(CH_3)_2)_2$ precursor.

FIG. 7 is a graph of linearity dependent upon a deposition cycle of a zirconium oxide film using a $CH_3N(CH_2C(CH_3)HN(CH_3))_2Zr(N(CH_3)_2)_2$ precursor.

FIG. 8 is an ALD growth temperature window (ALD window) of a zirconium oxide film using a $CH_3N(CH_2C(CH_3)HN(CH_3))_2Zr(N(CH_3)_2)_2$ precursor.

FIG. 9 is a graph of saturation dependent upon a source amount of a titanium oxide film using a $CH_3N(CH_2C(CH_3)HN(CH_3))_2Ti(N(CH_3)_2)_2$ precursor.

FIG. 10 is a graph of linearity dependent upon a deposition cycle of a titanium oxide film using a $CH_3N(CH_2C(CH_3)HN(CH_3))_2Ti(N(CH_3)_2)_2$ precursor.

FIG. 11 is an ALD growth temperature window (ALD window) of a titanium oxide film using a $CH_3N(CH_2C(CH_3)HN(CH_3))_2Ti(N(CH_3)_2)_2$ precursor.

FIG. 12 is a graph of saturation dependent upon a source amount of a hafnium oxide film using a $CH_3N(CH_2C(CH_3)HN(CH_3))_2Hf(N(CH_3)_2)_2$ precursor.

FIG. 13 is a graph of linearity dependent upon a deposition cycle of a hafnium oxide film using a $CH_3N(CH_2C(CH_3)HN(CH_3))_2Hf(N(CH_3)_2)_2$ precursor.

FIG. 14 is an ALD growth temperature window (ALD window) of a hafnium oxide film using a $CH_3N(CH_2C(CH_3)HN(CH_3))_2Hf(N(CH_3)_2)_2$ precursor.

FIG. 15 is a transmission electron microphotograph of surface selective growth comparison of a hafnium nitride film using a $CH_3N(CH_2C(CH_3)HN(CH_3))_2Hf(N(CH_3)_2)_2$ precursor.

FIG. 16 is a transmission electron microphotograph of surface selective growth comparison of a hafnium oxide film using a $CH_3N(CH_2C(CH_3)HN(CH_3))_2Hf(N(CH_3)_2)_2$ precursor.

FIG. 17 is a graph of X-ray diffraction analysis of the crystallinity of a zirconium oxide film using a $CH_3N(CH_2C(CH_3)HN(CH_3))_2Zr(N(CH_3)_2)_2$ precursor.

FIG. 18 is a transmission electron microphotograph of the crystalline of a zirconium oxide film using a $CH_3N(CH_2C(CH_3)HN(CH_3))_2Zr(N(CH_3)_2)_2$ precursor.

FIGS. 19 to 23 are graphs of secondary ion mass spectroscopy of a zirconium oxide film using a $CH_3N(CH_2C(CH_3)HN(CH_3))_2Zr(N(CH_3)_2)_2$ precursor.

FIG. 24 is a graph of electrical properties ((a) leakage current, (b) dielectric constant, (c) thickness of equivalent oxide film) of a zirconium oxide film using a $CH_3N(CH_2C(CH_3)HN(CH_3))_2Zr(N(CH_3)_2)_2$ precursor.

FIG. 25 is a graph of electrical properties ((a) leakage current, (b) dielectric constant, (c) thickness of equivalent oxide film) of a metal oxide film having a multilayer structure (ZAZ) using a $CH_3N(CH_2C(CH_3)HN(CH_3))_2Zr(N(CH_3)_2)_2/TMA/CH_3N(CH_2C(CH_3)HN(CH_3))_2Zr(N(CH_3)_2)_2$ precursor.

BEST MODE

Hereinafter, the novel metal compound and the method for preparing the same of the present invention will be described, however, technical terms and scientific terms used herein have the general meaning understood by those skilled in the art to which the present invention pertains unless otherwise defined, and a description for the known function and configuration unnecessarily obscuring the gist of the present invention will be omitted in the following description.

The term, "alkyl" is a monovalent, straight chain or branched chain, saturated hydrocarbon radical consisting of only carbon and hydrogen atoms, and may have 1 to 7 carbon atoms, preferably 1 to 5 carbon atoms, more preferably 1 to 3 carbon atoms. The example of an alkyl group includes methyl, ethyl, propyl, isopropyl, butyl, isobutyl, t-butyl, pentyl and the like, but not limited thereto.

The term, "alkenyl" is a monovalent, straight chain or branched chain, unsaturated hydrocarbon radical having one or more double bonds between two or more carbon atoms, and may have 2 to 7 carbon atoms, preferably 2 to 5 carbon atoms, more preferably 2 to 3 carbon atoms. The example of an alkenyl group includes ethenyl, propenyl, allyl, propenyl, butenyl and 4-methylbutenyl and the like, but not limited thereto.

The term, "halo" or "halogen" refers to a halogen group element, and includes for example, fluoro, chloro, bromo and iodo.

The present invention provides a metal triamine compound represented by the following Chemical Formula 1, having high volatility, excellent thermal stability, and excellent cohesion, and being capable of forming a surface selective thin film.

[Chemical Formula 1]

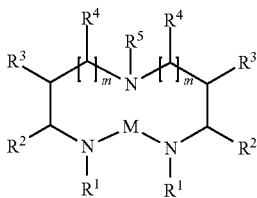

wherein

M is $M^1(A^1)$, $M^2(A^2)(A^3)$, $M^3(A^2)(A^3)(A^4)$, $M^4(=NR')_2$ or $M^4(CO)_4$;

$M^1$ is a Group 13 metal or a lanthanide metal;

$M^2$ is a Group 4 transition metal;

$M^3$ is a Group 5 transition metal;

$M^4$ is a Group 6 transition metal;

R' is (C1-C7) alkyl;

$R^1$ to $R^5$ are each independently hydrogen or (C1-C7) alkyl; and $A^1$ is (C1-C7)alkyl, $NR^6R^7$, $OR^8$, a cyclopentadienyl ring or a fused ring containing the cyclopentadienyl ring;

$A^2$, $A^3$ and $A^4$ are each independently $NR^6R^7$, $OR^8$, a cyclopentadienyl ring or a fused ring containing the cyclopentadienyl ring;

the cyclopentadienyl ring or the fused ring containing the cyclopentadienyl ring in $A^1$, $A^2$, $A^3$ and $A^4$ may be further substituted with (C1-C7)alkyl or (C2-C7)alkenyl;

$R^6$, $R^7$ and $R^8$ are each independently (C1-C7)alkyl or $SiR^9R^{10}R^{11}$;

$R^9$ to $R^{11}$ are each independently (C1-C7)alkyl; and m is an integer of 0 to 2.

The novel metal triamine compound of the present invention has an octahydropentalene, decahydronaphthalene or dodecahydroheptalene structure in which the nitrogen atoms at both ends of dialkylenetriamine are covalently bonded to the metal, and the nitrogen atom in the middle is coordinated, thereby having excellent thermal stability and excellent reactivity so that it is not deteriorated even with constant heating. Further, the novel metal triamine compound of the present invention has a low melting point, and is mostly present in a liquid state or in the state of solid having a low melting point at room temperature or at the temperature capable of being handled, and thus, is easily handled. Further, the novel metal triamine compound of the present invention has a low melting point, and thus, is mostly present in the form of a liquid at room temperature under normal pressure. Thus, it has high storage stability, and excellent volatility, and may be used as a precursor for depositing a metal-containing thin film to prepare a high-purity metal-containing thin film having high density.

The metal triamine compound according to an exemplary embodiment of the present invention may include a compound in a liquid state at room temperature, in terms of having high vapor pressure, but not limited thereto. Since the compound being a liquid at room temperature as such is not needed to be heated to a melting point or more, it may be advantageous as compared with a solid compound.

The metal triamine compound according to an exemplary embodiment of the present invention may be a compound being in a liquid state at room temperature under normal pressure, or in a solid state with a low melting point, in terms of having high vapor pressure to be easier to form a thin film.

The metal M according to an exemplary embodiment of the present invention is selected from metalloids, metals and transition metals, specifically $M^1(A^1)$, $M^2(A^2)(A^3)$, $M^3(A^2)$ $(A^3)(A^4)$, $M^4(=NR')_2$ or $M^4(CO)_4$, wherein $M^1$ is a trivalent Group 13 metal, or a trivalent lanthanide metal, preferably B, Al, Ga, In or La; $M^2$ is a tetravalent Group 4 transition metal, preferably Ti, Zr or Hf; $M^3$ is a pentavalent Group 5 transition metal, preferably V, Nb or Ta; and $M^4$ is a hexavalent Group 6 transition metal, preferably Cr, Mo or W.

Preferably, $R^1$ to $R^5$ according to an exemplary embodiment of the present invention are each independently hydrogen or (C1-C5)alkyl; $A^1$ is (C1-C7)alkyl, $NR^6R^7$, $OR^8$ or a cyclopentadienyl ring; $A^2$, $A^3$ and $A^4$ are each independently $NR^6R^7$, $OR^8$ or a cyclopentadienyl ring; the cyclopentadienyl ring of $A^1$, $A^2$, $A^3$ and $A^4$ may be further substituted with (C1-C5)alkyl or (C2-C5)alkenyl; $R^6$, $R^7$ and $R^8$ are each independently (C1-C5)alkyl or $SiR^9R^{10}R^{11}$; $R^9$ to $R^{11}$ are each independently (C1-C5)alkyl; and m is an integer of 0 or 1.

Preferably, the metal triamine compound of Chemical Formula 1 according to an exemplary embodiment of the present invention may be represented by the following Chemical Formula 2 or 3:

[Chemical Formula 2]

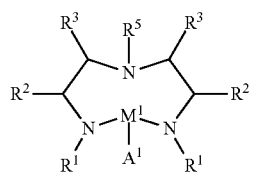

[Chemical Formula 3]

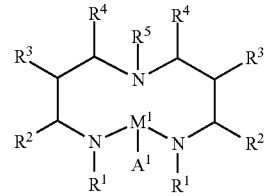

wherein $M^1$ is B, Al, Ga, In or La;

$R^1$ to $R^5$ are each independently a hydrogen atom or (C1-C5)alkyl;

$A^1$ is (C1-C5)alkyl, $NR^6R^7$, $OR^8$ or a cyclopentadienyl ring;

$R^6$, $R^7$ and $R^8$ are each independently (C1-C5)alkyl or $SiR^9R^{10}R^{11}$; and $R^9$ to $R^{11}$ are each independently (C1-C5)alkyl.

The metal triamine compound according to an exemplary embodiment of the present invention may be preferably the compound of Chemical Formula 2 or 3 wherein $R^1$ and $R^5$ are each independently (C1-C3)alkyl, $R^2$ to $R^4$ are each independently hydrogen or (C1-C3)alkyl, $A^1$ is (C1-C3) alkyl, $NR^6R^7$, $OR^8$ or a cyclopentadienyl ring, $R^6$ and $R^7$ are each independently (C1-C3)alkyl or $SiR^9R^{10}R^{11}$; $R^9$ to $R^{11}$ are each independently (C1-C3) alkyl, $R^8$ is (C1-C4)alkyl, specifically, $R^1$ and $R^5$ are each independently methyl, ethyl, n-propyl or isopropyl, $R^2$ to $R^4$ are each independently hydrogen, methyl, ethyl, n-propyl or isopropyl, $A^1$ is methyl, ethyl, n-propyl, isopropyl, $NR^6R^7$, $OR^8$ or a cyclopentadienyl ring, $R^6$ and $R^7$ are each independently methyl, ethyl, n-propyl, isopropyl, trimethylsilyl, triethylsilyl, ethyldimethylsilyl or methylethylpropylsilyl, and $R^8$ is methyl, ethyl, n-propyl, isopropyl, n-butyl, isobutyl or t-butyl, in terms of having high volatility and thermal stability as a precursor for depositing a metal-containing thin film.

Preferably, the metal triamine compound of Chemical Formula 1 according to an exemplary embodiment of the present invention may be represented by the following Chemical Formula 4 or 5:

[Chemical Formula 4]

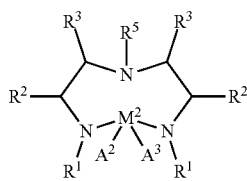

[Chemical Formula 5]

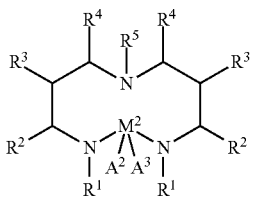

wherein $M^2$ is Ti, Zr or Hf;

$R^1$ to $R^5$ are each independently a hydrogen atom or (C1-C5)alkyl;

$A^2$ and $A^3$ are each independently $NR^6R^7$, $OR^8$ or a cyclopentadienyl ring;

$R^6$, $R^7$ and $R^8$ are each independently (C1-C5)alkyl or $SiR^9R^{10}R^{11}$; and $R^9$ to $R^{11}$ are each independently (C1-C5)alkyl.

The metal triamine compound according to an exemplary embodiment of the present invention may be preferably the compound of Chemical Formula 4 or 5, wherein $R^1$ and $R^5$ are each independently (C1-C3)alkyl, $R^2$ to $R^4$ are each independently hydrogen or (C1-C3)alkyl, $A^2$ and $A^3$ are each independently $NR^6R^7$, $OR^8$ or a cyclopentadienyl ring, $R^6$ and $R^7$ are each independently (C1-C3)alkyl or $SiR^9R^{10}R^{11}$; $R^9$ to $R^{11}$ are each independently (C1-C3) alkyl, $R^8$ is (C1-C4)alkyl, specifically, $R^1$ and $R^5$ are each independently methyl, ethyl, n-propyl or isopropyl, $R^2$ to $R^4$ are each independently hydrogen, methyl, ethyl, n-propyl or isopropyl, $A^2$ and $A^3$ are each independently $NR^6R^7$, $OR^8$ or a cyclopentadienyl ring, $R^6$ and $R^7$ are each independently methyl, ethyl, n-propyl, isopropyl, trimethylsilyl, triethylsilyl, ethyldimethylsilyl or methylethylpropylsilyl, and $R^8$ is methyl, ethyl, n-propyl, isopropyl, n-butyl, isobutyl or t-butyl, in terms of having high volatility and thermal stability as a precursor for depositing a metal-containing thin film.

The metal triamine compound according to an exemplary embodiment of the present invention may be more preferably represented by the following Chemical Formula 4-1 or 4-2:

[Chemical Formula 4-1]

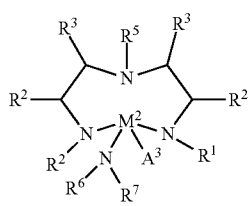

[Chemical Formula 4-2]

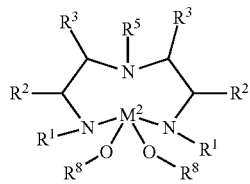

wherein $M^2$ is Ti, Zr or Hf;

$R^1$ to $R^3$ and $R^5$ are each independently a hydrogen atom or (C1-C5)alkyl;

$A^3$ is $NR^6R^7$ or a cyclopentadienyl ring;

$R^6$, $R^7$ and $R^8$ are each independently (C1-C5)alkyl or $SiR^9R^{10}R^{11}$; and $R^9$ to $R^{11}$ are each independently (C1-C5)alkyl.

In the metal triamine compound of Chemical Formulae 4-1 and 4-2 according to an exemplary embodiment of the present invention, more preferably in $R^1$ and $R^5$ may be each independently (C1-C3)alkyl, $R^2$ and $R^3$ may be each independently hydrogen or (C1-C3)alkyl, $A^3$ is $NR^6R^7$ or a cyclopentadienyl ring, $R^6$ and $R^7$ may be each independently (C1-C3)alkyl, and $R^8$ may be (C1-C4)alkyl. Specifically, $R^1$ and $R^5$ may be each independently methyl, ethyl, n-propyl or isopropyl, $R^2$ and $R^3$ may be each independently hydrogen, methyl, ethyl, n-propyl or isopropyl, $R^6$ and $R^7$ may be each independently methyl, ethyl, n-propyl or isopropyl, and $R^8$ may be methyl, ethyl, n-propyl, isopropyl, n-butyl, isobutyl or t-butyl.

In the metal triamine compound of Chemical Formulae 4-1 and 4-2 according to an exemplary embodiment of the present invention, it is more preferred that at least one of $R^2$ and $R^3$ is hydrogen, and the remaining one is hydrogen or (C1-C3)alkyl, in terms of having excellent properties for depositing a thin film.

Preferably, the metal triamine compound of Chemical Formula 1 according to an exemplary embodiment of the present invention may be represented by the following Chemical Formula 6 or 7:

[Chemical Formula 6]

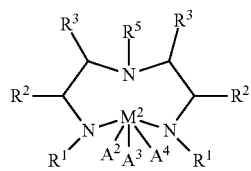

[Chemical Formula 7]

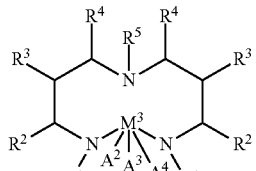

wherein $M^3$ is V, Nb or Ta;

$R^1$ to $R^5$ are each independently a hydrogen atom or (C1-C5)alkyl;

$A^2$, $A^3$ and $A^4$ are each independently $NR^6R^7$, $OR^8$ or a cyclopentadienyl ring;

$R^6$, $R^7$ and $R^8$ are each independently (C1-C5)alkyl or $SiR^9R^{10}R^{11}$; and $R^9$ to $R^{11}$ are each independently (C1-C5)alkyl.

The metal triamine compound according to an exemplary embodiment of the present invention may be preferably the compound of Chemical Formula 6 or 7, wherein $R^1$ and $R^5$ are each independently (C1-C3)alkyl, $R^2$ to $R^4$ are each independently hydrogen or (C1-C3)alkyl, $A^2$, $A^3$ and $A^4$ are each independently $NR^6R^7$, $R^6$ and $R^7$ are each independently (C1-C3)alkyl or $SiR^9R^{10}R^{11}$, $R^9$ to $R^{11}$ are each independently (C1-C3) alkyl, more preferably $R^1$ and $R^5$ are each independently (C1-C3) alkyl, $R^2$ to $R^4$ are each independently hydrogen or (C1-C3)alkyl, $A^2$, $A^3$ and $A^4$ are each independently $NR^6R^7$, $R^6$ and $R^7$ are each independently (C1-C3)alkyl, in terms of having high volatility and thermal stability as a precursor for depositing a metal-containing thin film. Specifically, $R^1$ and $R^5$ may be each independently methyl, ethyl, n-propyl or isopropyl, $R^2$ to $R^4$ may be each independently hydrogen, methyl, ethyl, n-propyl or isopropyl, $A^2$, $A^3$ and $A^4$ may be each independently $NR^6R^7$, and $R^6$ and $R^7$ may be each independently methyl, ethyl, n-propyl, isopropyl, trimethylsilyl, triethylsilyl, ethyldimethylsilyl or methylethylpropylsilyl.

Preferably, the metal triamine compound of Chemical Formula 1 according to an exemplary embodiment of the present invention may be represented by the following Chemical Formula 8 or 9:

[Chemical Formula 8]

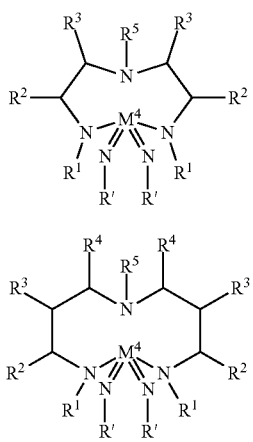

[Chemical Formula 9]

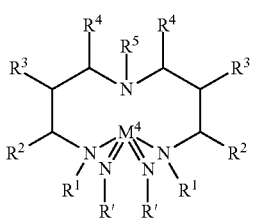

wherein $M^4$ is Cr, Mo or W;

$R^1$ to $R^5$ are each independently a hydrogen atom or (C1-C5)alkyl; and

R' is (C1-C5) alkyl.

The metal triamine compound according to an exemplary embodiment of the present invention may be preferably the compound of Chemical Formula 8 or 9, wherein $R^1$ and $R^5$ are each independently (C1-C3)alkyl, $R^2$ to $R^4$ are each independently hydrogen or (C1-C3)alkyl, and R' is (C1-C4) alkyl, specifically $R^1$ and $R^5$ are each independently methyl, ethyl, n-propyl or isopropyl, $R^2$ to $R^4$ are each independently hydrogen, methyl, ethyl, n-propyl or isopropyl, and R' is methyl, ethyl, n-propyl, isopropyl, n-butyl, isobutyl or t-butyl, in terms of having high volatility and thermal stability as a precursor for depositing a metal-containing thin film.

Preferably, the metal triamine compound of Chemical Formula 1 according to an exemplary embodiment of the present invention may be represented by the following Chemical Formula 10 or 11:

[Chemical Formula 10]

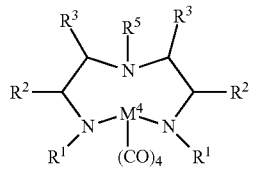

[Chemical Formula 11]

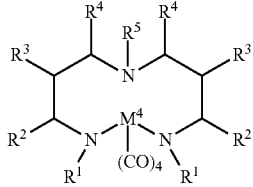

wherein $M^4$ is Cr, Mo or W; and $R^1$ to $R^5$ are each independently a hydrogen atom or (C1-C5)alkyl.

The metal triamine compound according to an exemplary embodiment of the present invention may be preferably the compound of Chemical Formula 10 or 11, wherein $R^1$ and $R^5$ are each independently (C1-C3)alkyl, and $R^2$ to $R^4$ are each independently hydrogen or (C1-C3)alkyl, specifically $R^1$ and $R^5$ are each independently methyl, ethyl, n-propyl or isopropyl, and $R^2$ to $R^4$ are each independently hydrogen, methyl, ethyl, n-propyl or isopropyl, in terms of having high volatility and thermal stability as a precursor for depositing a metal-containing thin film.

The metal triamine compound according to an exemplary embodiment of the present invention may be the metal triamine compound of Chemical Formulae 2 to 11 having an octahydropentalene or decahydronaphthalene structure in which the nitrogen atoms at both ends of dialkylenetriamine are covalently bonded to the metal, and the nitrogen atom in the middle is coordinated. More preferably, the metal triamine compound of Chemical Formula 2, 4, 6, 8 or 10 having an octahydropentalene structure in which the nitrogen atoms at both ends of dialkylenetriamine are covalently bonded to the metal, and the nitrogen atom in the middle is coordinated, is more preferred, in terms of having high volatility and high thermal stability as a precursor for depositing a metal-containing thin film, thereby obtaining a high-quality metal-containing thin film.

The metal triamine compound according to an exemplary embodiment of the present invention may be specifically selected from the compounds having the following structures, but not limited thereto:

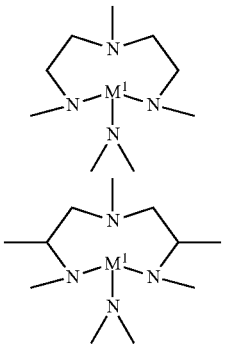

25
-continued
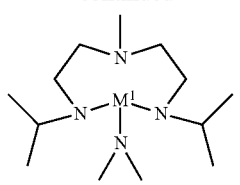
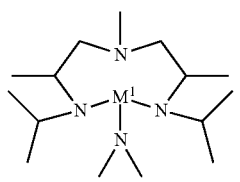
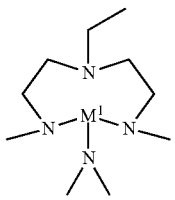
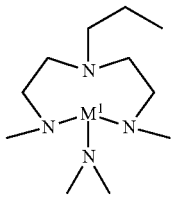
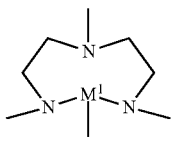
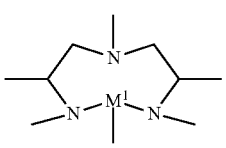
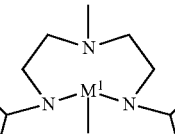
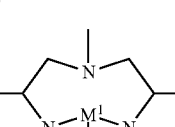
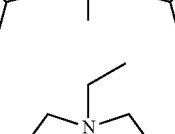
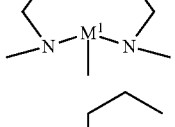
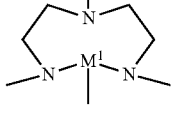
26
-continued
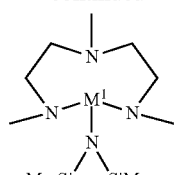
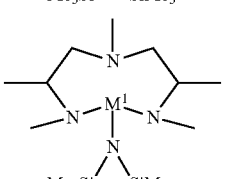
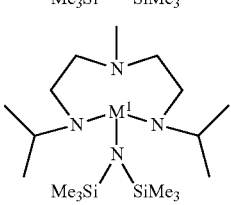
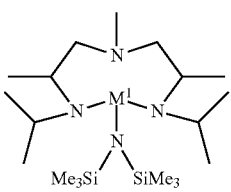
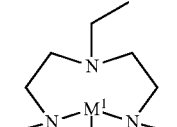
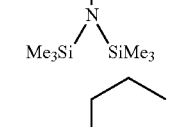
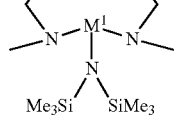
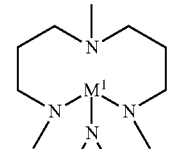
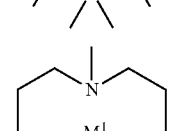
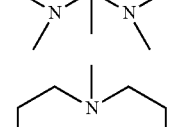
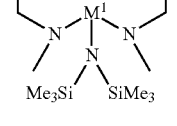

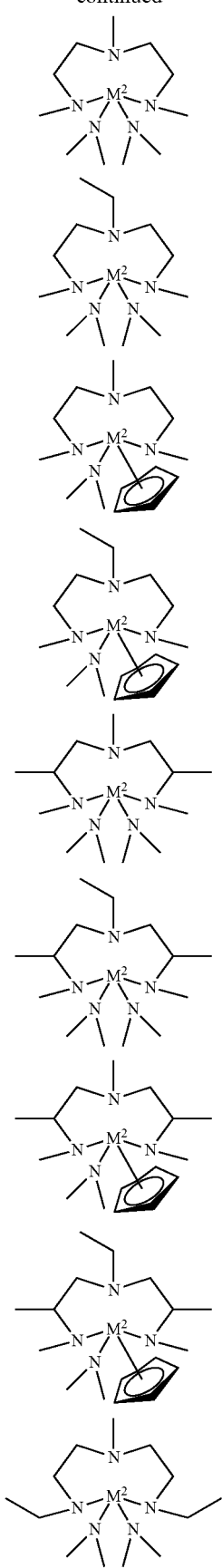
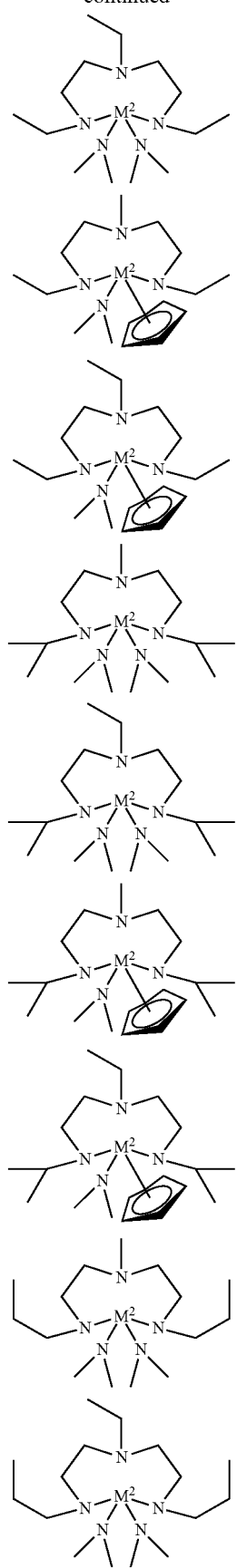

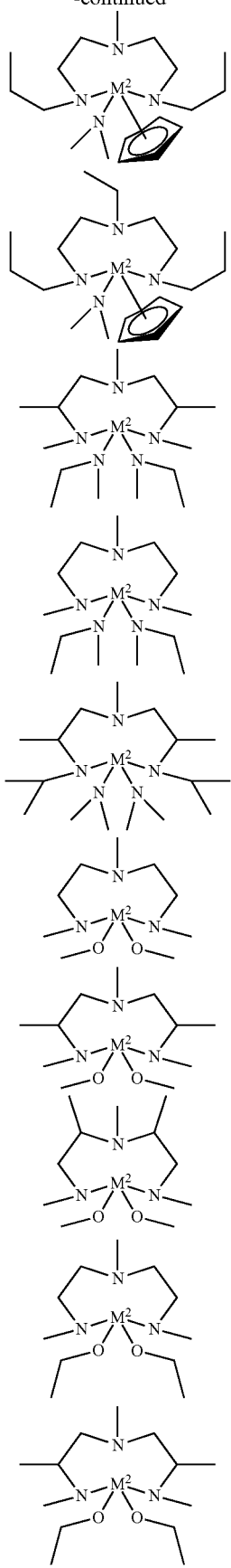
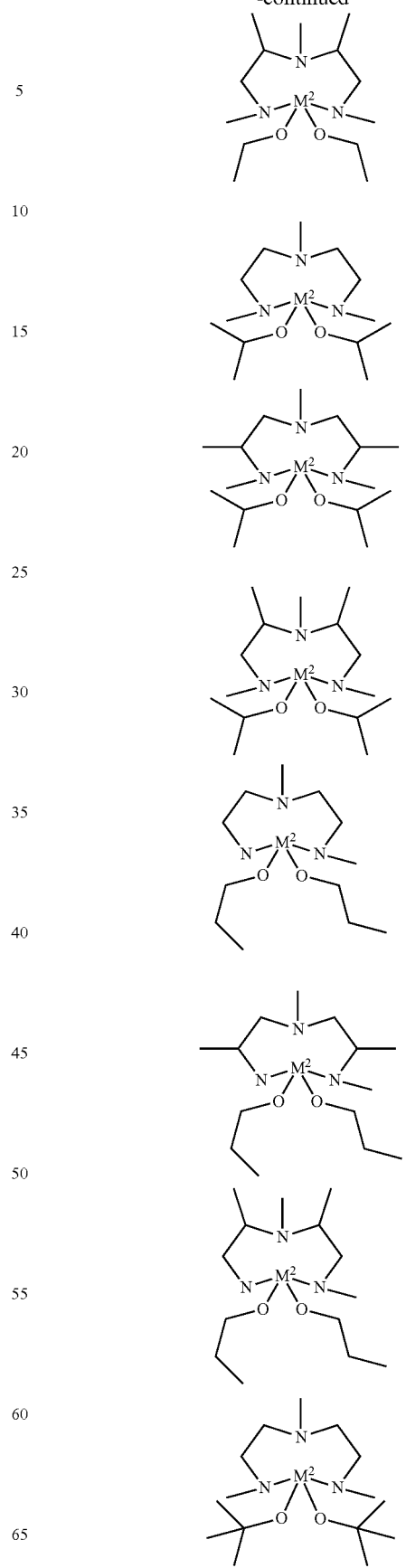

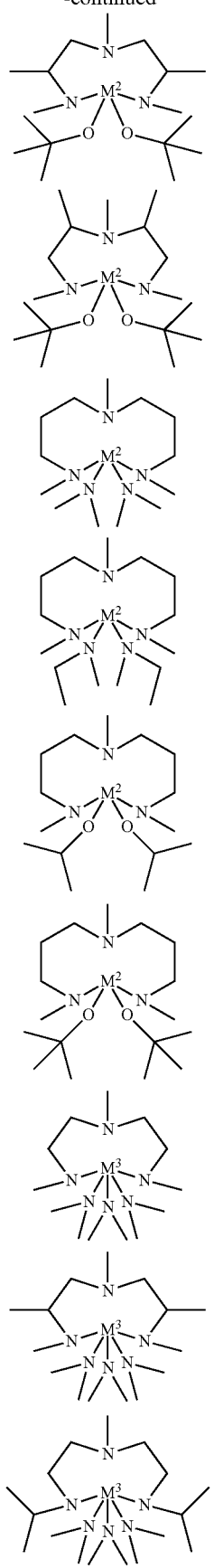
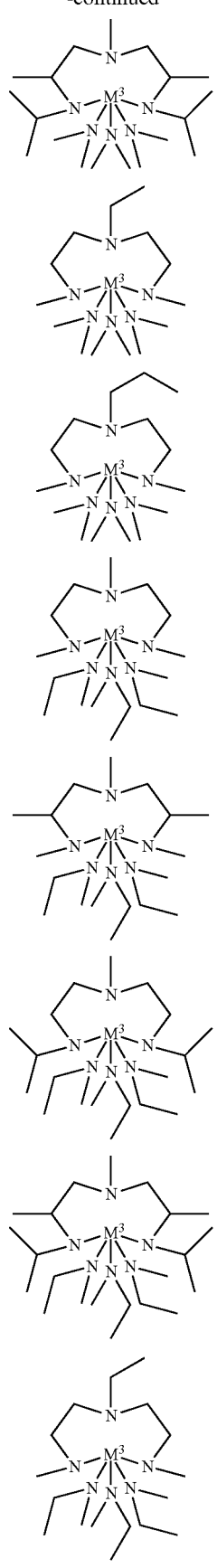

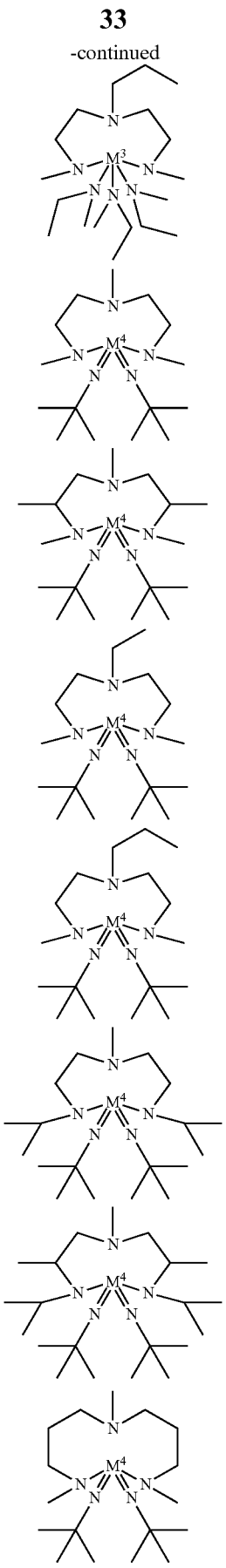

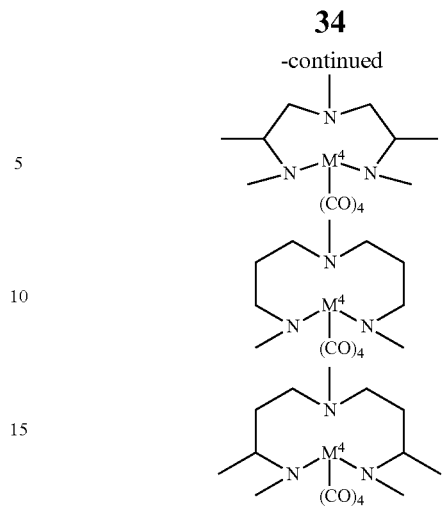

wherein $M^1$ is B, Al, Ga, In, Ti or La; $M^2$ is Ti, Zr or Hf; $M^3$ is V, Nb or Ta; and $M^4$ is Cr, Mo or W.

Further, the present invention provides a method for preparing the metal triamine compound represented by the above Chemical Formula 1.

In an exemplary embodiment of the present invention, in Chemical Formula 1, the compound wherein M is $M^1(A^1)$ is represented by Chemical Formula I, the compound wherein M is $M^2(A^2)(A^3)$ is represented by Chemical Formula II, the compound wherein M is $M^3(A^2)(A^3)(A^4)$ is represented by Chemical Formula III, the compound wherein M is $M^4(=NR')_2$ is represented by Chemical Formula IV, and the compound wherein M is $M^4(CO)_4$ is represented by Chemical Formula V.

A method for preparing the metal triamine compound of the following Chemical Formula I wherein M is $M^1(A^1)$ in the metal triamine compound of Chemical Formula 1 according to an exemplary embodiment of the present invention, includes reacting the dialkylenetriamine compound of the following Chemical Formula A and the metal precursor of the following Chemical Formula B:

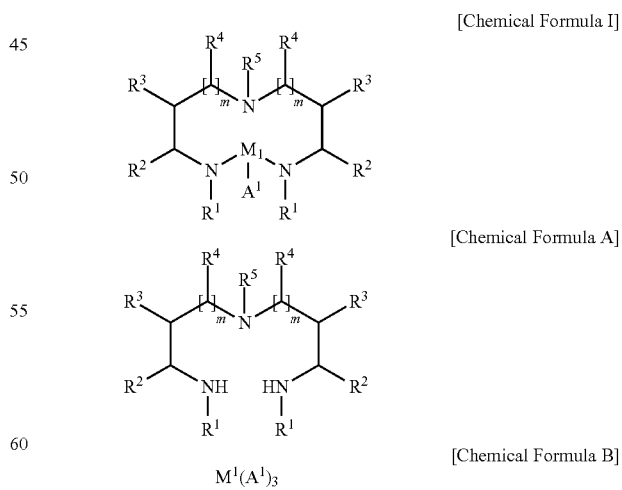

wherein
$M^1$ is a Group 13 metal or a lanthanide metal;
$R^1$ to $R^5$ are each independently hydrogen or (C1-C7) alkyl;

$A^1$ is (C1-C5)alkyl, $NR^6R^7$, $OR^8$, a cyclopentadienyl ring or a fused ring containing the cyclopentadienyl ring, and the cyclopentadienyl ring or the fused ring containing the cyclopentadienyl ring of $A^1$ may be further substituted with (C1-C7)alkyl or (C2-C7)alkenyl;

$R^6$, $R^7$ and $R^8$ are each independently (C1-C7)alkyl or $SiR^9R^{10}R^{11}$;

$R^9$ to $R^{11}$ are each independently (C1-C7)alkyl; and m is an integer of 0 to 2.

The method for preparing the metal triamine compound of Chemical Formula I may be represented by the following Reaction Scheme 1:

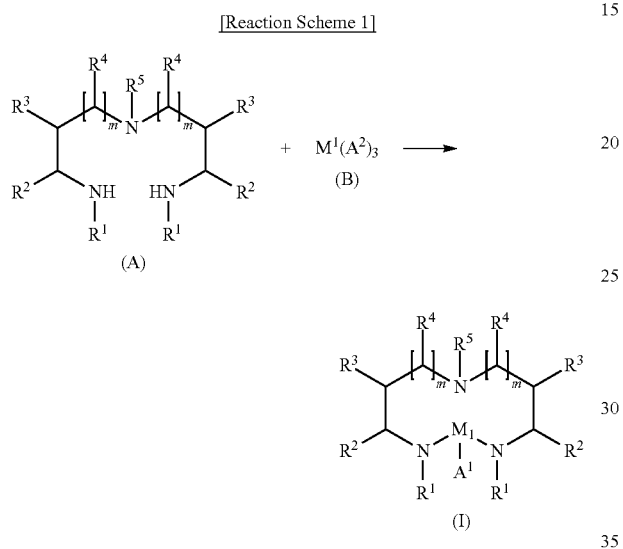

wherein $M^1$, $R^1$ to $R^5$, $A^1$ and m are as defined in Chemical Formula I.

In an exemplary embodiment of the method for preparing a metal triamine compound of the present invention, the metal precursor of Chemical Formula B and the dialkylenetriamine compound of Chemical Formula A may be used at a mole ratio of 1:1 to 1:1.5, preferably a mole ratio of 1:1 to 1:1.25, more preferably a mole ratio of 1:1 to 1:1.10.

The reaction of the dialkylenetriamine compound of Chemical Formula A and the metal precursor of Chemical Formula B [Reaction Scheme 1] may be carried out in a solvent. Any solvent may be used in the above reaction, as long as it is a common organic solvent, however, it is preferred to use one or more selected from the group consisting of hexane, pentane, dichloromethane (DCM), dichloroethane (DCE), toluene, acetonitrile (MeCN), nitromethane, tetrahydrofuran (THF), N,N-dimethyl formamide (DMF) and N,N-dimethylacetamide (DMA).

The reaction temperature may be any temperature used in a common organic synthesis, but vary depending on reaction materials and amounts of starting materials, and preferably the reaction of Reaction Scheme 1 may be carried out at −10 to 80° C., and the reaction is completed after confirming by NMR and the like that the starting materials are completely consumed. When the reaction is completed, the solvent is distilled under reduced pressure after an extraction process, and then a desired material may be separated and purified by a typical method such as column chromatography.

In the metal triamine compound of Chemical Formula 1 according to an exemplary embodiment of the present invention, the metal triamine compound of the following Chemical Formula II-1 wherein M is $M^2(A^2)(A^3)$ in Chemical Formula 1 is prepared by reacting the dialkylenetriamine compound of the following Chemical Formula A and the metal precursor of the following Chemical Formula C, or reacting the dialkylenetriamine lithium salt compound of the following Chemical Formula D and the metal halide precursor of Chemical Formula E:

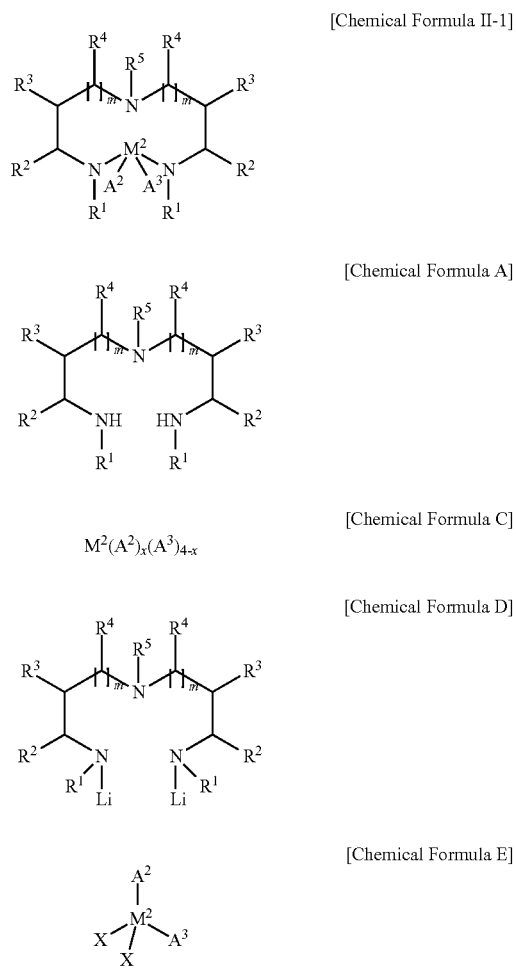

wherein $M^2$ is a Group 4 transition metal;

$R^1$ to $R^5$ are each independently hydrogen or (C1-C7) alkyl;

$A^2$ and $A^3$ are each independently $NR^6R^7$, a cyclopentadienyl ring or a fused ring containing the cyclopentadienyl ring, and the cyclopentadienyl ring or the fused ring containing the cyclopentadienyl ring of $A^2$ and $A^3$ may be further substituted with (C1-C7)alkyl or (C2-C7)alkenyl;

$R^6$ and $R^7$ are each independently (C1-C7)alkyl or $SiR^9R^{10}R^{11}$;

$R^9$ to $R^{11}$ are each independently (C1-C7)alkyl;

m is an integer of 0 to 2;

X is halogen; and x is an integer of 1 to 3.

The dialkylenetriamine lithium salt compound of Chemical Formula D may be prepared by reacting the dialkylenetriamine compound of Chemical Formula A and (C1-C7) alkyllithium, wherein (C1-C7)alkyllithium may be used at 1.5 to 5 mole, preferably 1.5 to 2.5 mole, relative to 1 mole of the dialkylenetriamine compound of Chemical Formula A, and the reaction may be carried out at −10 to 30° C.

The method for preparing the metal triamine compound of Chemical Formula II-1 may be represented by the following Reaction Schemes 2 and 3:

[Reaction Scheme 2]

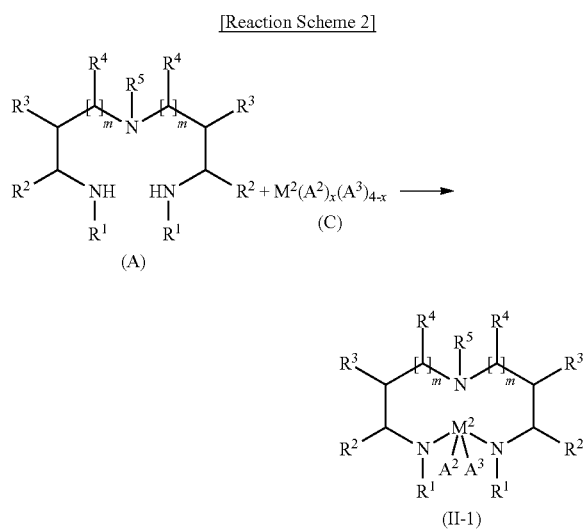

[Reaction Scheme 3]

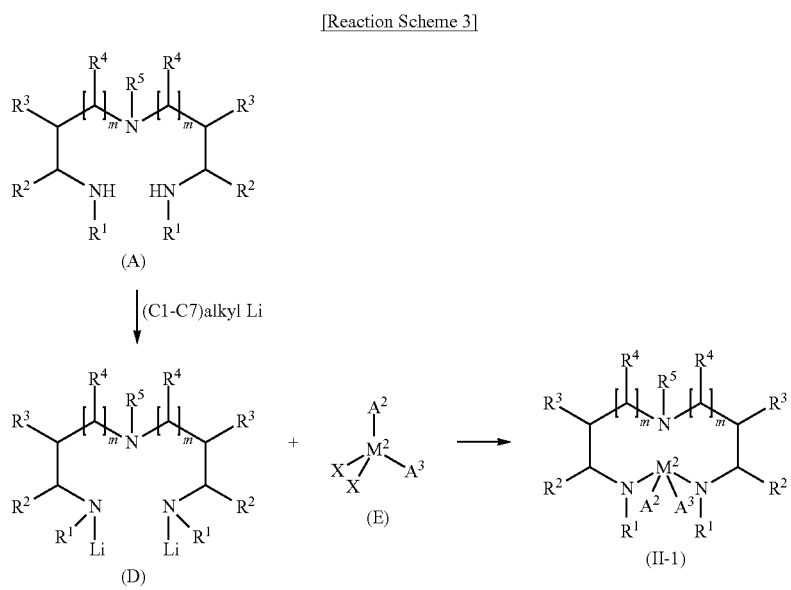

wherein $M^2$, $R^1$ to $R^5$, $A^2$, $A^3$ and m are as defined in Chemical Formula II-1, X is halogen, and x is an integer of 1 to 3.

In an exemplary embodiment of the method for preparing a metal triamine compound of the present invention, the metal precursor of Chemical Formula C and the dialkylenetriamine compound of Chemical Formula A may be used at a mole ratio of 1:1 to 1:1.5, preferably a mole ratio of 1:1 to 1:1.25, more preferably a mole ratio of 1:1 to 1:1.10.

In an exemplary embodiment of the method for preparing a metal triamine compound of the present invention, the metal halide precursor of Chemical Formula E and the dialkylenetriamine lithium salt compound of Chemical Formula D may be used at a mole ratio of 1:1 to 1:1.5, preferably a mole ratio of 1:1 to 1:1.25, more preferably a mole ratio of 1:1 to 1:1.10.

The reaction of the dialkylenetriamine compound of Chemical Formula A and the metal precursor of Chemical Formula C [Reaction Scheme 2] may be carried out in a solvent, or as a neat reaction also. "Neat" refers to carrying out the reaction only by mixing the dialkylenetriamine compound of Chemical Formula A and the metal precursor of Chemical Formula C without using an organic solvent.

The reaction of the dialkylenetriamine lithium salt compound of Chemical Formula D and the metal halide precursor of Chemical Formula E [Reaction Scheme 3] may be carried out in a solvent.

Any solvent may be used in the above reaction, as long as it is a common organic solvent, however, it is preferred to use one or more selected from the group consisting of hexane, pentane, dichloromethane (DCM), dichloroethane (DCE), toluene, acetonitrile (MeCN), nitromethane, tetrahydrofuran (THF), N,N-dimethyl formamide (DMF) and N,N-dimethylacetamide (DMA).

The reaction temperature may be any temperature used in a common organic synthesis, but vary depending on reaction materials and amounts of starting materials, and preferably the reaction of Reaction Scheme 2 may be carried out at −10 to 80° C., and the reaction of Reaction Scheme 3 may be carried out at −10 to 30° C., and the reaction is completed after confirming by NMR and the like that the starting materials are completely consumed. When the reaction is completed, the solvent is distilled under reduced pressure after an extraction process, and then a desired material may be separated and purified by a typical method such as column chromatography.

The metal triamine compound of the following Chemical Formula II-2 wherein M is $M^2(A^2)(A^3)$ in the metal triamine compound of Chemical Formula 1 according to an exemplary embodiment of the present invention, may be prepared by reacting the dialkylenetriamine compound of the following Chemical Formula A with the metal precursor of the following Chemical Formula C-1, and then reacting the product with the alcohol compound of the following Chemical Formula F:

[Chemical Formula II-2]

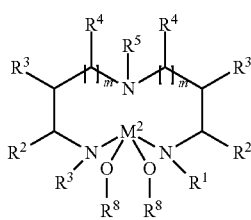

[Chemical Formula A]

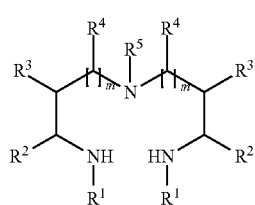

[Chemical Formula C-1]

$M^2(NR^6R^7)_4$

[Chemical Formula F]

$R^8$—OH wherein
$M^2$ is a Group 4 transition metal;
$R^1$ to $R^5$ are each independently hydrogen or (C1-C7)alkyl;
$R^6$, $R^7$ and $R^8$ are each independently (C1-C7)alkyl; and
m is an integer of 0 to 2.

The method for preparing the metal triamine compound of Chemical Formula II-2 may be represented by the following Reaction Scheme 4:

wherein $M^2$, $R^1$ to $R^5$, $R^8$ and m are as defined in the above Chemical Formula II-2, and $R^6$ and $R^7$ are each independently (C1-C7)alkyl.

In an exemplary embodiment of the method for preparing a metal triamine compound of the present invention, the metal precursor of Chemical Formula C-1 and the dialkylenetriamine compound of Chemical Formula A may be used at a mole ratio of 1:1 to 1:1.5, preferably a mole ratio of 1:1 to 1:1.25, more preferably a mole ratio of 1:1 to 1:1.10.

In an exemplary embodiment of the method for preparing a metal triamine compound of the present invention, the dialkylenetriamine compound of Chemical Formula A and the alcohol compound of Chemical Formula F may be used at a mole ratio of 1:2 to 1:4, preferably a mole ratio of 1:2 to 1:3, more preferably a mole ratio of 1:2 to 1:2.5.

The reaction of the dialkylenetriamine compound of Chemical Formula A and the metal precursor of Chemical Formula C-1 may be carried out in a solvent, or as a neat reaction also. "Neat" refers to carrying out the reaction only by mixing the dialkylenetriamine compound of Chemical Formula A and the metal precursor of Chemical Formula C-1 without using an organic solvent.

In an exemplary embodiment of the method for preparing a metal triamine compound of the present invention, the dialkylenetriamine compound of Chemical Formula A and the metal precursor of Chemical Formula C-1 are reacted to prepare the intermediate compound of Chemical Formula Int-1, and the alcohol compound of Chemical Formula F is reacted to prepare the metal triamine compound of Chemical Formula II-2, without further separation purification.

Any solvent may be used in the reaction of the dialkylenetriamine compound of Chemical Formula A and the metal precursor of Chemical Formula C-1, and the subsequent reaction with the alcohol compound of Chemical Formula F, as long as it is a common organic solvent, however, it is preferred to use one or more selected from the group consisting of hexane, pentane, dichloromethane (DCM), dichloroethane (DCE), toluene, acetonitrile (MeCN), nitromethane, tetrahydrofuran (THF), N,N-dimethyl formamide (DMF) and N,N-dimethylacetamide (DMA).

[Reaction Scheme 4]

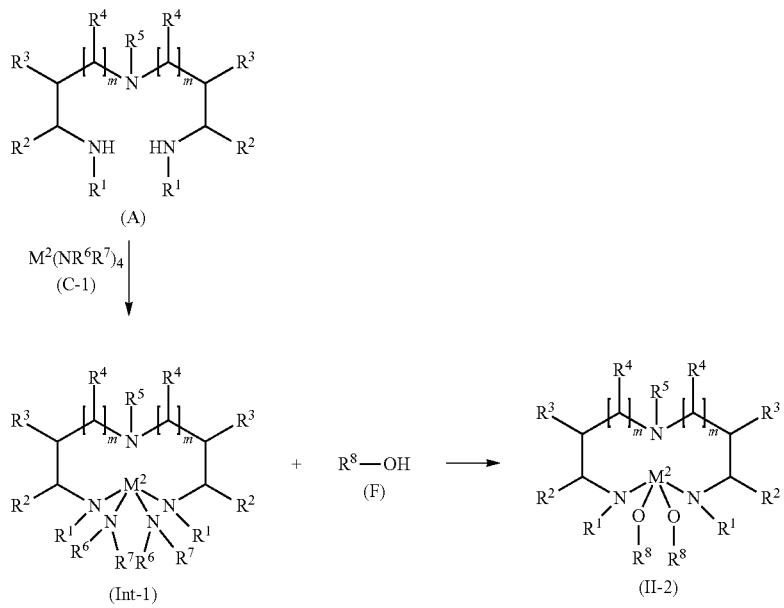

The reaction temperature may be any temperature used in a common organic synthesis, but vary depending on reaction materials and amounts of starting materials, and preferably the reaction may be carried out at −30 to 80° C., and the reaction is completed after confirming by NMR and the like that the starting materials are completely consumed. When the reaction is completed, the solvent is distilled under reduced pressure after an extraction process, and then a desired material may be separated and purified by a typical method such as column chromatography.

The metal triamine compound of the following Chemical Formula III wherein M is $M^3(A^2)(A^3)(A^4)$ in the metal triamine compound of Chemical Formula 1 according to an exemplary embodiment of the present invention, is prepared by reacting the dialkylenetriamine compound of the following Chemical Formula A and the metal precursor of the following Chemical Formula G:

[Chemical Formula III]

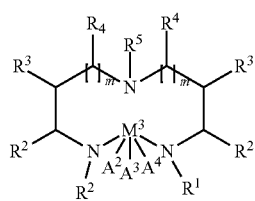

[Chemical Formula A]

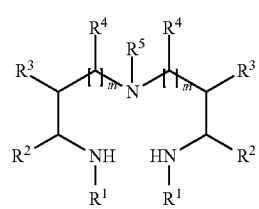

[Chemical Formula G]

$M^2(A^2)_a(A^3)_b(A^4)_c$ wherein $M^3$ is a Group 5 transition metal;

$R^1$ to $R^5$ are each independently hydrogen or (C1-C7)alkyl;

$A^2$, $A^3$ and $A^4$ are each independently $NR^6R^7$, $OR^8$, a cyclopentadienyl ring or a fused ring containing the cyclopentadienyl ring, and the cyclopentadienyl ring or the fused ring containing the cyclopentadienyl ring of $A^2$, $A^3$ and $A^4$ may be further substituted with (C1-C7)alkyl or (C2-C7)alkenyl;

$R^6$, $R^7$ and $R^8$ are each independently (C1-C7)alkyl or $SiR^9R^{10}R^{11}$;

$R^9$ to $R^{11}$ are each independently (C1-C7)alkyl;

m is an integer of 0 to 2; and a, b and c are each independently an integer of 1 or more, and a+b+c is an integer of 5.

The method for preparing the metal triamine compound of Chemical Formula III may be represented by the following Reaction Scheme 5:

[Reaction Scheme 5]

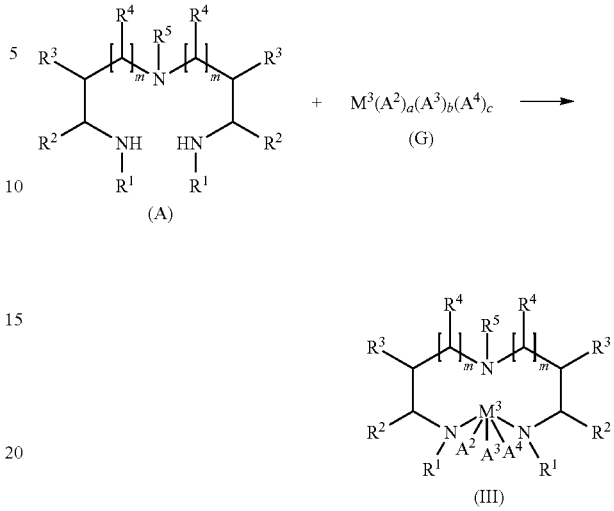

wherein $M^3$, $R^1$ to $R^5$, $A^2$, $A^3$, $A^4$ and m are as defined in the above Chemical Formula III, and a, b and c are each independently an integer of 1 or more, and a+b+c is an integer of 5.

In an exemplary embodiment of the method for preparing a metal triamine compound of the present invention, the metal precursor of Chemical Formula G and the dialkylenetriamine compound of Chemical Formula A may be used at a mole ratio of 1:1 to 1:1.5, preferably a mole ratio of 1:1 to 1:1.25, more preferably a mole ratio of 1:1 to 1:1.10.

The reaction of the dialkylenetriamine compound of Chemical Formula A and the metal precursor of Chemical Formula G may be carried out in a solvent. Any solvent may be used in the above reaction, as long as it is a common organic solvent, however, it is preferred to use one or more selected from the group consisting of hexane, pentane, dichloromethane (DCM), dichloroethane (DCE), toluene, acetonitrile (MeCN), nitromethane, tetrahydrofuran (THF), N,N-dimethyl formamide (DMF) and N,N-dimethylacetamide (DMA).

The reaction temperature may be any temperature used in a common organic synthesis, but vary depending on reaction materials and amounts of starting materials, and preferably the reaction may be carried out at −10 to 30° C., and the reaction is completed after confirming by NMR and the like that the starting materials are completely consumed. When the reaction is completed, the solvent is distilled under reduced pressure after an extraction process, and then a desired material may be separated and purified by a typical method such as column chromatography.

The metal triamine compound of the following Chemical Formula IV wherein M is $M^4(=NR')_2$ in the metal triamine compound of Chemical Formula 1 according to an exemplary embodiment of the present invention, is prepared by reacting the compound of the following Chemical Formula H and the dialkylenetriamine lithium salt compound of the following Chemical Formula D:

[Chemical Formula IV]

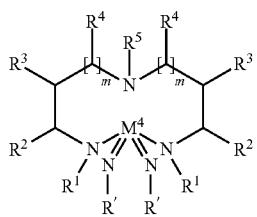

[Chemical Formula H]

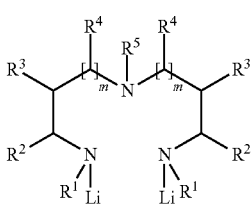

[Chemical Formula D]

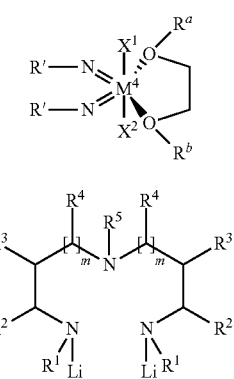

wherein

M⁴ is a Group 6 transition metal;

R¹ to R⁵ are each independently hydrogen or (C1-C7) alkyl;

R' is (C1-C7) alkyl;

X¹ and X² are each independently halogen;

$R^a$ and $R^b$ are each independently (C1-C7)alkyl; and m is an integer of 0 to 2.

The compound of Chemical Formula H may be prepared by reacting $Na_2MoO_4$, the ethane compound of Chemical Formula J, triethylamine ($NEt_3$), chlorotrimethylsilane ($Me_3SiCl$), and the amine compound of Chemical Formula K.

[Chemical Formula J]

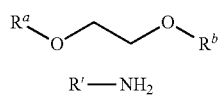

[Chemical Formula K]

wherein $R^a$ and $R^b$ are each independently (C1-C7)alkyl; and

R' is (C1-C7) alkyl.

The method for preparing the metal triamine compound of Chemical Formula IV may be represented by the following Reaction Scheme 6:

[Reaction Scheme 6]

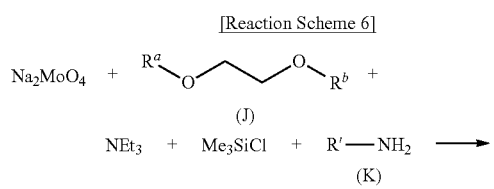

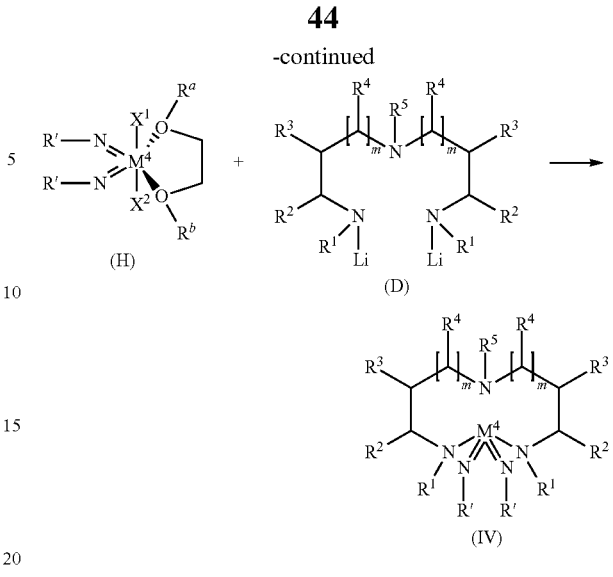

wherein M⁴, R¹ to R⁵, R' and m are as defined in the above Chemical Formula IV, and X¹ and X² are each independently halogen, and $R^a$ and $R^b$ are each independently (C1-C7) alkyl.

In an exemplary embodiment of the method for preparing a metal triamine compound of the present invention, the compound of Chemical Formula H and the dialkylenetriamine lithium salt compound of Chemical Formula D may be used at a mole ratio of 1:1 to 1:1.5, preferably a mole ratio of 1:1 to 1:1.25, more preferably a mole ratio of 1:1 to 1:1.10.

The reaction of the compound of Chemical Formula H and the dialkylenetriamine lithium salt compound of Chemical Formula D may be carried out in a solvent. Any solvent may be used in the above reaction, as long as it is a common organic solvent, however, it is preferred to use one or more selected from the group consisting of hexane, pentane, dichloromethane (DCM), dichloroethane (DCE), toluene, acetonitrile (MeCN), nitromethane, tetrahydrofuran (THF), N,N-dimethyl formamide (DMF) and N,N-dimethylacetamide (DMA).

The reaction temperature may be any temperature used in a common organic synthesis, but vary depending on reaction materials and amounts of starting materials, and preferably the reaction may be carried out at −10 to 30° C., and the reaction is completed after confirming by NMR and the like that the starting materials are completely consumed. When the reaction is completed, the solvent is distilled under reduced pressure after an extraction process, and then a desired material may be separated and purified by a typical method such as column chromatography.

The metal triamine compound of the following Chemical Formula V wherein M is $M^4(CO)_4$ in the metal triamine compound of Chemical Formula 1 according to an exemplary embodiment of the present invention, is prepared by reacting the metal hexacarbonyl precursor of the following Chemical Formula L with halogen, and then reacting the product with the dialkylenetriamine compound of the following Chemical Formula A:

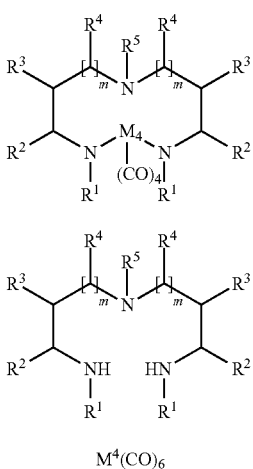

[Chemical Formula V]

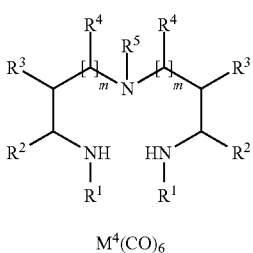

[Chemical Formula A]

$M^4(CO)_6$

[Chemical Formula L]

wherein $M^4$ is a Group 6 transition metal;

$R^1$ to $R^5$ are each independently hydrogen or (C1-C7) alkyl; and m is an integer of 0 to 2.

The method for preparing the metal triamine compound of Chemical Formula V may be represented by the following Reaction Scheme 7:

[Reaction Scheme 7]

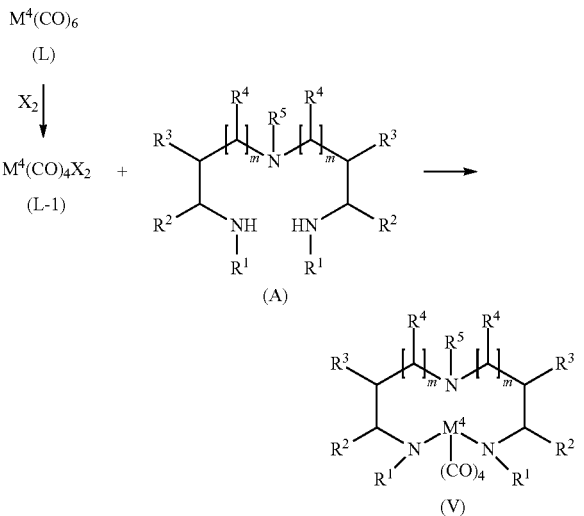

wherein $M^4$, $R^1$ to $R^5$ and m are as defined in the above Chemical Formula V, and X is halogen.

In an exemplary embodiment of the method for preparing a metal triamine compound of the present invention, the metal hexacarbonyl precursor of Chemical Formula L and halogen may be used at a mole ratio of 1:1 to 1:1.5, preferably a mole ratio of 1:1 to 1:1.25, more preferably at a mole ratio of 1:1 to 1:1.10, and the metal tetracarbonyl bishalide precursor of Chemical Formula L-1 and the dialkylenetriamine compound of Chemical Formula A may be used at a mole ratio of 1:1 to 1:1.5, preferably at a mole ratio of 1:1 to 1:1.25, more preferably at a mole ratio of 1:1 to 1:1.10.

Any solvent may be used in the above reaction, as long as it is a common organic solvent, however, it is preferred to use one or more selected from the group consisting of hexane, pentane, dichloromethane (DCM), dichloroethane (DCE), toluene, acetonitrile (MeCN), nitromethane, tetrahydrofuran (THF), N,N-dimethyl formamide (DMF) and N,N-dimethylacetamide (DMA).

The reaction temperature may be any temperature used in a common organic synthesis, but vary depending on reaction materials and amounts of starting materials, and preferably the reaction may be carried out at −78 to 120° C., and the reaction is completed after confirming by NMR and the like that the starting materials are completely consumed. When the reaction is completed, the solvent is distilled under reduced pressure after an extraction process, and then a desired material may be separated and purified by a typical method such as column chromatography.

Further, the present invention provides a composition for depositing a metal-containing thin film including the metal triamine compound of the present invention.

The metal triamine compound of Chemical Formula 1 included in the composition for depositing a metal-containing thin film of the present invention is a liquid or a solid having a low melting point at room temperature, and has high volatility and high thermal stability, and thus, is a precursor which is very useful for forming a metal-containing thin film. The composition for depositing a metal-containing thin film of the present invention includes at least one of the metal triamine compounds of Chemical Formula 1.

In addition, the metal triamine compound of Chemical Formula 1 in the composition for depositing a metal-containing thin film of the present invention may be included within the content range which may be recognized by a person skilled in the art, considering the thin film formation conditions, thickness, properties, or the like of the thin film.

Further, the present invention provides a method for preparing a metal-containing thin film using the composition for depositing a metal-containing thin film.

The metal-containing thin film of the present invention is prepared using the composition for depositing a metal-containing thin film including the metal triamine compound of Chemical Formula 1 as a precursor, and though it is not limited to the following, as an example, it may be a metal-containing oxide film, a metal-containing nitride film, a metal-containing oxynitride film, a metal-containing carbon nitride film, or a metal-containing silicon nitride film, may be a gate insulation film of a transistor, or a dielectric film of a capacitor, and may be manufactured into various high-quality thin films.

The method for preparing a metal-containing thin film of the present invention uses the composition for depositing a metal-containing thin film of the present invention including the metal triamine compound of Chemical Formula 1 which is a liquid or a solid having a low melting point at room temperature, and has high volatility and excellent thermal stability, as a precursor, thereby being easily handled, capable of being prepared into various thin films, and allowing the preparation of a metal-containing thin film having high density and high purity. Furthermore, the metal-containing thin film produced by the preparation method of the present invention has excellent durability and electrical properties, and an excellent step coverage.

Any method is possible for the method for preparing a metal-containing thin film of the present invention as long as it is within the cognizance of a person skilled in the art, however, it may be performed preferably by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD) or plasma-enhanced atomic layer deposition (PEALD).

The method for preparing a metal-containing thin film of the present invention may specifically include:
a) maintaining the temperature of a substrate mounted in a chamber at 80 to 400° C.;
b) injecting carrier gas and the composition for depositing a metal-containing thin film; and
c) injecting reaction gas to deposit the metal-containing thin film on the substrate, and steps b) and c) may be repeated several times depending on the thickness of the metal-containing thin film.

In the method for preparing a metal-containing thin film according to an exemplary embodiment of the present invention, deposition conditions may be adjusted depending on the structure or thermal properties of the desired thin film. As the deposition conditions according to an exemplary embodiment of the present invention, an input flow rate of the composition for depositing a metal-containing thin film including a metal triamine compound, input flow rate of reaction gas and carrier gas, pressure, RF power, a substrate temperature and the like may be exemplified, and as a non-limited example of the deposition condition, the conditions may be adjusted as follows: an input flow rate of the composition for depositing a metal-containing thin film of 10 to 1000 cc/min, a flow rate of carrier gas of 10 to 1000 cc/min, a flow rate of reaction gas of 1 to 1000 cc/min, pressure of 0.5 to 10 torr, RF power of 200 to 1000 W, and a substrate temperature of 80 to 400° C., preferably 200 to 400° C., but not limited thereto.

The reaction gas used in the method for preparing a metal-containing thin film of the present invention is not limited, but may be performed with supply of any one or two or more gases selected from the group consisting of oxygen ($O_2$), ozone ($O_3$), distilled water ($H_2O$), hydrogen peroxide ($H_2O_2$), nitrogen monoxide (NO), nitrous oxide ($N_2O$), nitrogen dioxide ($NO_2$), ammonia ($NH_3$), nitrogen ($N_2$), hydrazine ($N_2H_4$), amine, diamine, carbon monoxide (CO), carbon dioxide ($CO_2$), $C_1$ to $C_{12}$ saturated or unsaturated hydrocarbon, hydrogen ($H_2$), argon (Ar) and helium (He).

As an example, metalorganic chemical vapor deposition (MOCVD) includes deposition processes of injecting a metal triamine compound to the deposition region where the substrate is positioned, and injecting reaction gas to the deposition region, each step is performed simultaneously or subsequently, and the precursor and the reaction gas are reacted to form a metal-containing thin film on the substrate.

As an example, atomic layer deposition (ALD) is performed by injecting a metal triamine compound to a deposition region where a substrate is positioned, discharging the metal triamine compound in the deposition region, and injecting reaction gas to the deposition region and discharging the reaction gas, subsequently, and when each step is performed once, a single layer of the metal-containing thin film is deposited. The repeated process of each step is performed to deposit the metal-containing thin film having a desired thickness.

The substrate used in the method for preparing a metal-containing thin film according to an exemplary embodiment of the present invention may be a substrate including one or more semiconductor materials among Si, Ge, SiGe, GaP, GaAs, SiC, SiGeC, InAs and InP; a SOI (silicon on insulator) substrate; a quartz substrate; or a glass substrate for display; a flexible plastic substrate such as polyimide, polyethylene terephthalate (PET), polyethylene naphthalate (PEN), polymethyl methacrylate (PMMA), polycarbonate (PC), polyethersulfone (PES) and polyester; or a tungsten substrate, but not limited thereto.

In addition, the metal-containing thin film may be formed directly on the substrate, but in addition, a plurality of conductive layers, dielectric layers, insulating layers, or the like may be formed between the substrate and the metal-containing thin film.

A high-purity metal-containing thin film having an excellent step coverage and high density may be prepared by using the composition for depositing a metal-containing thin film, and the method for preparing a metal-containing thin film.

Hereinafter, the present invention will be described in more detail by the following Examples. Prior to that, terms and words used in the present specification and claims are not to be construed as a general or dictionary meaning but are to be construed as meaning and concepts meeting the technical ideas of the present invention based on a principle that the inventors can appropriately define the concepts of terms in order to describe their own inventions in best mode.

Therefore, the configurations illustrated in the Examples and drawings described herein are merely the most preferred exemplary embodiment of the present invention but do not represent all of the technical spirit of the present invention. Thus, it should be understood that there are various equivalents and modified examples to replace these at the time of filing the present application.

In addition, the following examples were all carried out by the known atomic layer deposition (ALD) using 200 mm single wafer type ALD equipment (CN1, Atomic Premium) in a shower head mode.

The thickness of the deposited metal-containing thin film was measured by an ellipsometer (Thermowave, Optiprobe 2600), and a transmission electron microscope (FEI (Netherlands) Tecnai $G^2$F30S-Twin), and the composition thereof was analyzed using an X-ray photoelectron spectroscopy (ThermoFisher Scientific, K-Alpha+).

[Example 1] Synthesis of $CH_3N(CH_2C(CH_3)HN(CH_3))_2Ti(N(CH_3)_2)_2$—Reaction Scheme 2

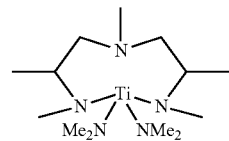

After dissolving tetrakis(dimethylamino)titanium [Ti(NMe$_2$)$_4$] (100 g, 0.45 mol) in 100 mL of hexane, N,N',N''-trimethyldiisopropylenetriamine [$CH_3N(CH_2C(CH_3)HN(CH_3)H)_2$](71 g, 0.45 mol) was added at −10° C., and the temperature was slowly raised to a reflux temperature (70° C.), and then reflux was performed (70° C.) with stirring for 24 hours. After completing the reaction, the solvent and volatile by-products were removed under reduced pressure, and then distillation under reduced pressure (120° C. at the bottom of the reactor, 0.3 torr) was performed, thereby obtaining the title compound in a liquid state, $CH_3N(CH_2C(CH_3)HN(CH_3))_2Ti(N(CH_3)_2)_2$ (80 g, 54.8%).

$^1$H-NMR ($C_6D_6$, ppm) δ 3.46 (2H, m, N($CH_2$C)), 3.33 (6H, s, Ti(N$CH_3$)$_2$), 3.29 (3H, s, (N($CH_3$))$_2$Ti), 3.27 (3H, s, (N($CH_3$))$_2$Ti), 3.17 (6H, s, Ti(N$CH_3$)$_2$), 3.00 (1H, m, CH), 2.91 (2H, m, N(CH$_2$C)), 2.74 (1H, m, CH), 1.94 (3H, s, CH$_3$N), 0.82 (3H, d, C(CH$_3$)), 0.74 (3H, d, C(CH$_3$)).

[Example 2] Synthesis of CH$_3$N(CH$_2$C(CH$_3$)HN(CH$_3$))$_2$Ti(N(CH$_3$)$_2$)$_2$—Reaction Scheme 3

After adding N,N',N''-trimethyldiisopropylenetriamine [CH$_3$N(CH$_2$C(CH$_3$)HN(CH$_3$)H)$_2$] (34.7 g, 0.2 mol) to 100 mL of hexane, 2.35 M normal butyl lithium (n-BuLi, 118 g, 0.4 mol) was slowly added at −10° C., and stirring was performed at room temperature for 12 hours, thereby preparing N,N',N''-trimethyldiisopropylenetriamine dilithium salt [CH$_3$N(CH$_2$C(CH$_3$)HN(CH$_3$)Li)$_2$]. Next, bisdimethylaminotitanium dichloride [Cl$_2$Ti(NMe$_2$)$_2$](41.4 g, 0.2 mol) was added at −10° C., and the temperature was slowly raised to room temperature (25° C.), and then stirring was performed for 24 hours at room temperature (25° C.). When the reaction was completed, the solvent and volatile by-products were removed under reduced pressure, and the NMR of the product was confirmed to be identical to Example 1, thereby obtaining the title compound in a liquid state which is identical to Example 1, CH$_3$N(CH$_2$C(CH$_3$)HN(CH$_3$))$_2$Ti(N(CH$_3$)$_2$)$_2$ (35 g, 57%).

[Example 3] Synthesis of CH$_3$N(CH$_2$C(CH$_3$)HN(CH$_3$))$_2$Zr(N(CH$_3$)$_2$)$_2$—Reaction Scheme 2

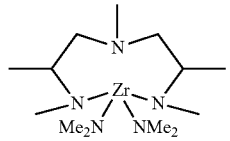

After adding tetrakis(dimethylamino)zirconium [Zr(NMe$_2$)$_4$] (140 g, 0.5 mol) to 100 mL of hexane, N,N',N''-trimethyldiisopropylenetriamine [CH$_3$N(CH$_2$C(CH$_3$)HN(CH$_3$)H)$_2$] (90 g, 0.5 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and distillation under reduced pressure (125° C. at the bottom of the reactor, 0.2 torr) was performed, thereby obtaining the title compound in a liquid state, CH$_3$N(CH$_2$C(CH$_3$)HN(CH$_3$))$_2$Zr(N(CH$_3$)$_2$)$_2$ (100 g, 54.5%).

$^1$H-NMR (C$_6$D$_6$, ppm) δ 3.37 (1H, m, CH), 3.21 (6H, s, Zr(NCH$_3$)$_2$), 3.18 (3H, s, (N(CH$_3$))$_2$Zr), 3.15 (3H, s, (N(CH$_3$))$_2$Zr), 3.10 (1H, m, CH$_2$), 3.06 (6H, s, Zr(NCH$_3$)$_2$), 2.97 (2H, m, CH$_2$), 2.81 (1H, m, CH$_2$), 2.74 (1H, m, CH), 2.01 (3H, s, CH$_3$N), 0.93 (3H, d, C(CH$_3$)), 0.61 (3H, d, C(CH$_3$)).

[Example 4] Synthesis of CH$_3$N(CH$_2$C(CH$_3$)HN(CH$_3$))$_2$Zr(N(CH$_3$)$_2$)$_2$—Reaction Scheme 3

After adding N,N',N''-trimethyldiisopropylenetriamine [CH$_3$N(CH$_2$C(CH$_3$)HN(CH$_3$)H)$_2$] (34.7 g, 0.2 mol) to 100 mL of hexane, 2.35 M normal butyl lithium (n-BuLi, 118 g, 0.4 mol) was slowly added at −10° C., and stirring was performed at room temperature for 12 hours, thereby preparing N,N',N''-trimethyldiisopropylenetriamine dilithium salt (CH$_3$N(CH$_2$C(CH$_3$)HN(CH$_3$)Li)$_2$). Next, after cooling to −10° C., bis(dimethylamino)zirconium dichloride [Cl$_2$Zr(NMe$_2$)$_2$] (50 g, 0.2 mol) was added, and the temperature was slowly raised to room temperature (25° C.), and then stirring was performed for 24 hours at room temperature (25° C.). When the reaction was completed, the solvent and volatile by-products were removed under reduced pressure, and the NMR of the product was confirmed to be identical to Example 3, thereby obtaining the title compound in a liquid state which is identical to Example 3, CH$_3$N(CH$_2$C(CH$_3$)HN(CH$_3$))$_2$Zr(N(CH$_3$)$_2$)$_2$ (40 g, 57%).

[Example 5] Synthesis of CH$_3$N(CH$_2$C(CH$_3$)HN(CH$_3$))$_2$Zr(N(CH$_3$)(C$_2$H))$_2$

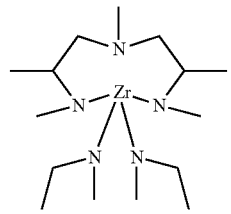

After adding tetrakis(ethylmethylamino)zirconium [Zr(NMeEt)$_4$] (108 g, 0.33 mol) to 100 mL of hexane, N,N',N''-trimethyldiisopropylenetriamine [CH$_3$N(CH$_2$C(CH$_3$)HN(CH$_3$)H)$_2$](57.83 g, 0.33 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and distillation under reduced pressure (130° C. at the bottom of the reactor, 0.1 torr) was performed, thereby obtaining the title compound in a liquid state, CH$_3$N(CH$_2$C(CH$_3$)HN(CH$_3$))$_2$Zr(N(CH$_3$)(C$_2$H))$_2$ (94 g, 74%).

$^1$H-NMR (C$_6$D$_6$, ppm) δ 3.50 (2H, m, NCH$_2$), 3.44 (2H, m, NCH$_2$), 3.21 (2H, m, CH$_2$), 3.19 (6H, s, Zr(NCH$_3$)), 3.14 (3H, s, (N(CH$_3$))$_2$Zr), 3.08 (3H, s, (N(CH$_3$))$_2$Zr), 3.00 (2H, m, CH$_2$), 2.82 (1H, m, CH$_2$), 2.74 (1H, m, CH), 2.03 (3H, s, CH$_3$N), 1.27 (6H, q, C(CH$_3$)), 0.96 (3H, d, C(CH$_3$)), 0.63 (3H, d, C(CH$_3$)).

[Example 6] Synthesis of CH$_3$N(CH$_2$CH$_2$HN(CH$_3$))$_2$Zr(N(CH$_3$)(C$_2$H))$_2$

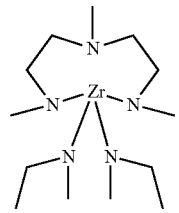

After adding tetrakis(ethylmethylamino)zirconium [Zr(NMeEt)$_4$] (295 g, 0.91 mol) to 300 mL of hexane, N,N',N''-trimethyldiethylenetriamine [CH$_3$N(CH$_2$CH$_2$N(CH$_3$)H)$_2$] (132.4 g, 0.91 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and distillation under reduced pressure (130° C. at the bottom of the reactor, 0.13 torr) was performed, thereby obtaining the title compound in a liquid state, CH$_3$N(CH$_2$CH$_2$HN(CH$_3$))$_2$Zr(N(CH$_3$)(C$_2$H$_5$))$_2$ (210 g, 65%).

$^1$H-NMR (C$_6$D$_6$, ppm) δ 3.48 (2H, m, NCH$_2$), 3.21 (6H, s, Zr(NCH$_3$)), 3.18 (3H, s, (N(CH$_3$))$_2$Zr), 3.13 (2H, m, NCH$_2$), 3.11 (2H, m, CH$_2$), 3.03 (3H, s, (N(CH$_3$))$_2$Zr), 2.94 (2H, m, CH$_2$), 2.66 (2H, m, CH$_2$), 2.22 (2H, m, CH$_2$), 1.99 (3H, s, CH$_3$N), 1.29 (6H, q, C(CH$_3$)).

[Example 7] Synthesis of CH$_3$N(CH$_2$C(CH$_3$)HN(CH$_3$))$_2$Hf(N(CH$_3$)$_2$)$_2$

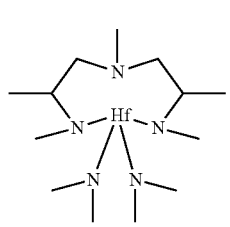

After adding tetrakis(dimethylamino)hafnium [Hf(NMe$_2$)$_4$] (200 g, 0.56 mol) to 200 mL of hexane, N,N',N''-trimethyldiisopropylenetriamine [CH$_3$N(CH$_2$C(CH$_3$)HN(CH$_3$)H)$_2$] (97.7 g, 0.56 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and distillation under reduced pressure (130° C. at the bottom of the reactor, 0.21 torr) was performed, thereby obtaining the title compound in a liquid state, CH$_3$N(CH$_2$C(CH$_3$)HN(CH$_3$))$_2$Hf(N(CH$_3$)$_2$)$_2$ (100 g, 40%).

$^1$H-NMR (C$_6$D$_6$, ppm) δ 3.31 (1H, m, CH), 3.23 (6H, s, Hf(NCH$_3$)$_2$), 3.19 (3H, s, (N(CH$_3$))$_2$Hf), 3.14 (3H, s, (N(CH$_3$))$_2$Hf), 3.08 (1H, m, CH$_2$), 3.05 (6H, s, Hf(NCH$_3$)$_2$), 2.97 (2H, m, CH$_2$), 2.83 (1H, m, CH$_2$), 2.81 (1H, m, CH), 1.97 (3H, s, CH$_3$N), 0.87 (3H, d, C(CH$_3$)), 0.63 (3H, d, C(CH$_3$)).

[Example 8] Synthesis of CH$_3$N(CH$_2$CH$_2$HN(CH$_3$))$_2$Hf(N(CH$_3$)$_2$)$_2$

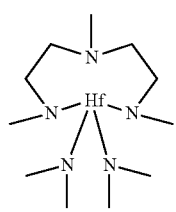

After adding tetrakis(dimethylamino)hafnium [Hf(NMe$_2$)$_4$] (20 g, 0.056 mol) to 100 mL of hexane, N,N',N''-trimethyldiethylenetriamine [CH$_3$N(CH$_2$CH$_2$N(CH$_3$)H)$_2$] (8.19 g, 0.056 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and sublimation under reduced pressure (63° C. at the bottom of the reactor, 0.82 torr) was performed, thereby obtaining the title compound in a solid state with a melting point of 60° C., CH$_3$N(CH$_2$CH$_2$HN(CH$_3$))$_2$Hf(N(CH$_3$)$_2$)$_2$ (5 g, 22%).

$^1$H-NMR (C$_6$D$_6$, ppm) δ 3.27 (6H, s, Hf(NCH$_3$)$_2$), 3.24 (6H, s, Hf(NCH$_3$)$_2$), 3.15 (4H, m, CH$_2$), 3.03 (6H, s, Hf(NCH$_3$)$_2$), 2.56 (2H, m, CH$_2$), 2.12 (2H, m, CH$_2$), 1.92 (3H, s, CH$_3$N).

[Example 9] Synthesis of CH$_3$N(CH$_2$C(CH$_3$)HN(CH$_3$))$_2$Hf(N(CH$_3$)(C$_2$H))$_2$

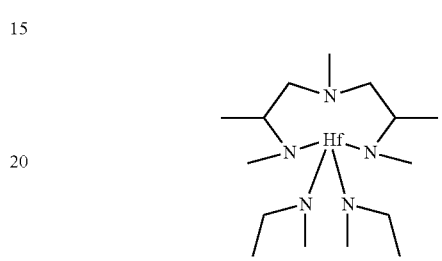

After adding tetrakis(ethylmethylamino)hafnium [Hf(NMeEt)$_4$] (450 g, 1.1 mol) to 300 mL of hexane, N,N',N''-trimethyldiisopropylenetriamine [CH$_3$N(CH$_2$C(CH$_3$)HN(CH$_3$)H)$_2$](189.8 g, 1.1 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and distillation under reduced pressure (132° C. at the bottom of the reactor, 0.56 torr) was performed, thereby obtaining the title compound in a liquid state, CH$_3$N(CH$_2$C(CH$_3$)HN(CH$_3$))$_2$Hf(N(CH$_3$)(C$_2$H))$_2$ (270 g, 53%).

$^1$H-NMR (C$_6$D$_6$, ppm) δ 3.53 (2H, m, NCH$_2$), 3.33 (1H, m, NCH$_2$), 3.26 (2H, m, CH$_2$), 3.25 (1H, m, CH$_2$), 3.21 (3H, s, Hf(NCH$_3$)), 3.20 (3H, s, Hf(NCH$_3$)), 3.16 (3H, s, (N(CH$_3$))$_2$Hf), 3.12 (1H, m, CH$_2$), 3.07 (3H, s, (N(CH$_3$))$_2$Hf), 3.00 (1H, m, CH$_2$), 2.93 (1H, m, CH$_2$), 2.82 (1H, m, CH), 2.00 (3H, s, CH$_3$N), 1.27 (6H, q, C(CH$_3$)), 0.90 (3H, d, C(CH$_3$)), 0.64 (3H, d, C(CH$_3$)).

[Example 10] Synthesis of CH$_3$N(CH$_2$CH$_2$HN(CH$_3$))$_2$Hf(N(CH$_3$)(C$_2$H))$_2$

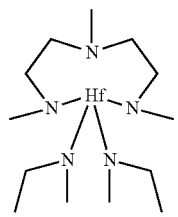

After adding tetrakis(ethylmethylamino)hafnium [Hf(NMeEt)$_4$] (224 g, 0.55 mol) to 200 mL of hexane, N,N',N''-trimethyldiethylenetriamine [CH$_3$N(CH$_2$CH$_2$N(CH$_3$)H)$_2$] (79.2 g, 0.55 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and purification under reduced pressure (130° C. at the bottom of the reactor, 0.25 torr) was performed, thereby obtaining the title compound in a liquid state, CH₃N(CH₂CH₂HN(CH₃))₂Hf(N(CH₃)(C₂H))₂ (100 g, 42%).

¹H-NMR (C₆D₆, ppm) δ 3.53 (2H, m, NCH₂), 3.23 (6H, s, Hf(NCH₃)), 3.21 (2H, m, NCH₂), 3.17 (3H, s, (N(CH₃))₂Hf), 3.16 (2H, m, CH₂), 3.03 (3H, s, (N(CH₃))₂Hf), 3.01 (2H, m, CH₂), 2.60 (2H, m, CH₂), 2.16 (2H, m, CH₂), 1.97 (3H, s, CH₃N), 1.28 (6H, m, C(CH₃)).

[Example 11] Synthesis of CH₃N(CH₂C(CH₃)HN(CH(CH₃)₂))₂Hf(N(CH₃)₂)₂

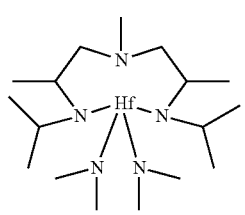

After adding tetrakis(dimethylamino)hafnium [Hf(NMe₂)₄] (20 g, 0.056 mol) to 100 mL of hexane, N'-methyl-N,N''-diisopropyldiisopropylenetriamine [CH₃N(CH₂C(CH₃)HN(CH(CH₃)₂))H)₂] (12.93 g, 0.084 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and purification under reduced pressure (139° C. at the bottom of the reactor, 0.2 torr) was performed, thereby obtaining the title compound in a liquid state, CH₃N(CH₂C(CH₃)HN(CH(CH₃)₂))₂Hf(N(CH₃)₂)₂ (7 g, 26%).

¹H-NMR (C₆D₆, ppm) δ 4.10 (1H, m, NCH), 4.03 (1H, m, NCH), 3.33 (2H, m, NCH), 3.22 (1H, m, CH₂), 3.19 (6H, s, Hf(NCH₃)₂), 3.15 (1H, m, CH₂), 3.08 (6H, s, Hf(NCH₃)₂), 2.95 (1H, m, CH₂), 2.83 (1H, m, CH₂), 2.00 (3H, s, CH₃N), 1.25 (6H, m, C(CH₃)), 1.19 (6H, m, C(CH₃)), 0.86 (3H, d, C(CH₃)), 0.68 (3H, d, C(CH₃)).

[Example 12] Synthesis of CH₃N(CH₂CH₂N(CH(CH₃)₂))₂Hf(N(CH₃)₂)₂

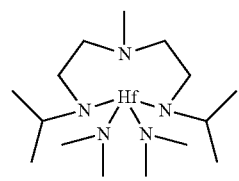

After adding tetrakis(dimethylamino)hafnium [Hf(NMe₂)₄] (20 g, 0.056 mol) to 100 mL of hexane, N'-methyl-N,N''-diisopropyldiethylenetriamine [CH₃N(CH₂CH₂N(CH(CH₃)₂)H)₂](17.3 g, 0.056 mol) was added at −10° C., and the temperature was slowly raised to room temperature (25° C.), and then stirring was performed at room temperature (25° C.) for 24 hours. When the reaction was completed, the solvent and volatile by-products were removed under reduced pressure, and purification under reduced pressure (140° C. at the bottom of the reactor, 0.1 torr) was performed, thereby obtaining the title compound in a solid state with a melting point of 50° C., CH₃N(CH₂CH₂N(CH(CH₃)₂))₂Hf(N(CH₃)₂)₂ (10 g, 37%).

¹H-NMR (C₆D₆, ppm) δ 4.10 (2H, m, NCH), 3.22 (2H, m, CH₂), 3.16 (6H, s, Hf(NCH₃)₂), 3.07 (6H, s, Hf(NCH₃)₂), 3.04 (2H, m, CH₂), 2.61 (2H, m, CH₂), 2.12 (2H, m, CH₂), 1.97 (3H, s, CH₃N), 1.24 (6H, m, C(CH₃)), 1.18 (6H, m, C(CH₃)).

[Example 13] Synthesis of CH₃N(CH₂CH₂N(CH₃))₂Ti(OCH(CH₃)₂)₂

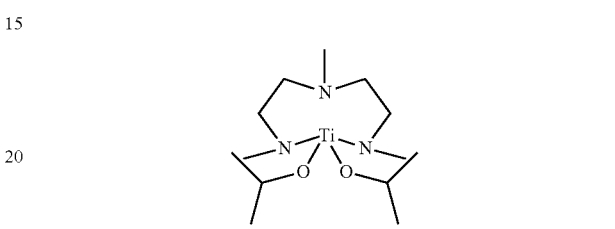

After adding tetrakis(dimethylamino)titanium [TDMAT, Ti(NMe₂)₄] (184 g, 0.82 mol) to a flask, N,N',N''-trimethyldiethylenetriamine [CH₃N(CH₂CH₂N(CH₃)H)₂] (119 g, 0.82 mol) was slowly added at room temperature (25° C.). After completing addition, stirring was performed at 60° C. for 12 hours, and the synthesis of CH₃N(CH₂CH₂N(CH₃))₂Ti(N(CH₃)₂)₂ was confirmed by NMR. After confirming the synthesis of CH₃N(CH₂CH₂N(CH₃))₂Ti(N(CH₃)₂)₂, 300 mL of hexane was added, the temperature inside the flask was cooled to −30° C., and isopropanol [HOCH(CH₃)₂] (98.6 g 1.64 mol) was slowly added so that the temperature inside the flask was not raised to −20° C. or higher. After finishing addition, the temperature was slowly raised to room temperature (25° C.), stirring was performed for 6 hours, then the synthesis was confirmed by NMR, then the solvent and volatile by-products were removed under reduced pressure, and distillation under reduced pressure (80° C. at the bottom of the reactor, 0.1 torr) was performed, thereby obtaining the title compound in a liquid state, CH₃N(CH₂CH₂N(CH₃))₂Ti(OCH(CH₃)₂)₂ (126 g, 50%).

¹H-NMR (C₆D₆, ppm) δ 4.79 (1H, m, OCH), 4.67 (1H, m, OCH), 3.36 (6H, s, Ti(N(CH₃)), 3.15 (2H, m, Ti(N(CH₂)), 2.97 (2H, m, Ti(N(CH₃)), 2.77 (2H, m, N(CH₂)), 2.44 (2H, m, N(CH₂)), 2.30 (3H, s, N(CH₃)), 1.40 (6H, d, C(CH₃)₂), 1.28 (6H, d, C(CH₃)₂).

[Example 14] Synthesis of CH₃N(CH₂CH₂N(CH₃))₂Hf(OCH(CH₃)₂)₂

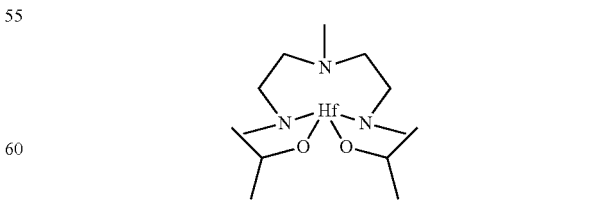

After adding 100 mL of hexane to a flask, tetrakis(ethylmethylamino)hafnium [TEMAH, Hf(NMeEt)₄] (63 g, 0.153 mol) was added thereto. After cooling the temperature inside the flask to −30° C., N,N',N''-trimethyldiethylenetriamine [CH₃N(CH₂CH₂N(CH₃)H)₂] (22.3 g, 0.153 mol) was slowly added thereto. After completing the addition, stirring was performed for 12 hours, and the synthesis of CH₃N(CH₂CH₂N(CH₃))₂Hf(N(CH₃)(CH₂CH₃))₂ was confirmed by NMR. After confirming the synthesis of CH₃N(CH₂CH₂N(CH₃))₂Hf(N(CH₃)(CH₂CH₃))₂, the temperature inside the flask was cooled to −30° C., and isopropanol [HOCH(CH₃)₂] (18.4 g 0.307 mol) was slowly added so that the temperature inside the flask was not raised to −20° C. or higher. After finishing addition, the temperature was slowly raised to room temperature (25° C.), stirring was performed for 6 hours, then the synthesis was confirmed by NMR, then the solvent and volatile by-products were removed under reduced pressure, and distillation under reduced pressure (140° C. at the bottom of the reactor, 0.26 torr), thereby obtaining the title compound in a liquid state, CH₃N(CH₂CH₂N(CH₃))₂Hf(OCH(CH₃)₂)₂ (30 g, 44.5%).

¹H-NMR (C₆D₆, ppm) δ 4.59 (1H, m, OCH), 4.45 (1H, m, OCH), 3.23 (6H, s, Hf(N(CH₃)), 3.02 (2H, m, Hf(N(CH₂)), 2.91 (2H, m, Hf(N(CH₃)), 2.60 (2H, m, N(CH₂)), 2.29 (2H, m, N(CH₂)), 2.19 (3H, s, N(CH₃)), 1.36 (6H, d, OC(CH₃)₂), 1.28 (6H, d, OC(CH₃)₂).

[Example 15] Synthesis of CH₃N(CH₂CH(CH₃)N(CH₃))₂Hf(OCH(CH₃)₂)₂

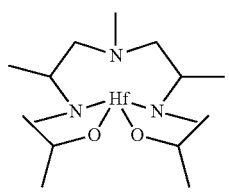

After adding 100 mL of hexane to a flask, tetrakis(ethylmethylamino)hafnium [TEMAH, Hf(NMeEt)₄] (49 g, 0.119 mol) was added thereto. After cooling the temperature inside the flask to −30° C., N,N',N''-trimethyldiisopropylenetriamine [CH₃N(CH₂CH(CH₃)N(CH₃)H)₂](20.7 g, 0.119 mol) was slowly added thereto. After completing the addition, stirring under reflux was performed at room temperature for 12 hours, and the synthesis of CH₃N(CH₂CH(CH₃)N(CH₃))₂Hf(N(CH₃)(CH₂CH₃))₂ was confirmed by NMR. After confirming the synthesis of CH₃N(CH₂CH(CH₃)N(CH₃))₂Hf(N(CH₃)(CH₂CH₃))₂, the temperature inside the flask was cooled to −30° C., and isopropanol [HOCH(CH₃)₂] (14.3 g 0.239 mol) was slowly added so that the temperature inside the flask was not raised to −20° C. or higher. After finishing addition, the temperature was slowly raised to room temperature (25° C.), stirring was performed for 6 hours, then the synthesis was confirmed by NMR, then the solvent and volatile by-products were removed under reduced pressure, and distillation under reduced pressure (140° C. at the bottom of the reactor, 0.16 torr), thereby obtaining the title compound in a liquid state, CH₃N(CH₂CH(CH₃)N(CH₃))₂Hf(OCH(CH₃)₂)₂ (25 g, 45%).

¹H-NMR (C₆D₆, ppm) δ 4.59 (1H, m, OCH), 4.56 (1H, m, OCH), 3.41 (1H, m, Hf(N(CH)), 3.40 (3H, s, Hf(N(CH₃)), 3.2 (1H, m, N(CH₂)), 3.15 (3H, s, Hf(N(CH₃)), 2.98 (1H, m, Hf(N(CH)), 2.44 ((1H, m, Hf(N(CH)), 2.22 (3H, s, N(CH₃)), 1.37 (6H, d, OC(CH₃)₂), 1.29 (6H, d, OC(CH₃)₂), 0.75 (3H, d, C(CH₃)), 0.69 (3H, d, C(CH₃)).

[Example 16] Synthesis of CH₃N(CH₂CH(CH₃)NCH₃)₂Mo(=NC(CH₃)₃)₂

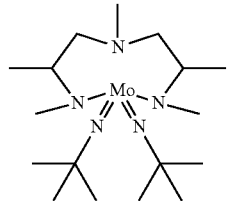

Synthesis of ((CH₃)₃CN)₂MoCl₂(DME)

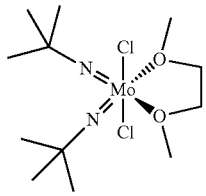

Sodium molybdate [Na₂MoO₄] (160 g, 0.777 mol) and 2 L of 1,2-dimethoxyethane were added to a flask. Triethylamine (314.5 g, 3.108 mol), chlorotrimethylsilane (759.72 g, 6.993 mol), and t-butylamine (119.3 g, 1.632 mol) were slowly added in order at room temperature. After finishing the addition, the temperature was slowly raised to 80° C., and reflux was performed for 18 hours. After finishing the reflux, filtration under reduced pressure was performed, and the solvent was removed by 80% from the filtrate at 40° C. under reduced pressure, and then hexane was added. The hexane suspension was filtered under reduced pressure to obtain a brown solid compound, ((CH₃)₃CN)₂MoCl₂ (DME) (146 g, 49%).

¹H-NMR (C₆D₆, ppm) δ 1.36 (18H, s, ((CH₃)₃CN)₂MoCl₂(DME)), 3.32, 3.49 (10H, s, ((CH₃)₃CN)₂MoCl₂(DME)).

Synthesis of CH₃N(CH₂CH(CH₃)NCH₃)₂Mo(=NC(CH₃)₃)₂

After adding ((CH₃)₃CN)₂MoCl₂(DME) (100 g, 0.26 mol) and 1 L of hexane to a flask, a hexane suspension of N,N',N''-trimethyldiisopropyltriamine dilithium salt [CH₃N(CH₂C(CH₃)HN(CH₃)Li)₂] (52.88 g, 0.286 mol) was slowly added thereto while maintaining the temperature of the hexane suspension at 10° C. Thereafter, stirring was performed at room temperature for 18 hours, and then filtration under reduced temperature was performed, and the solvent was completely removed from the filtrate at room temperature under reduced pressure. In order to increase the purity, distillation under reduced pressure (62° C., 0.4 torr) was performed to obtain the liquid title compound, CH₃N(CH₂CH(CH₃)NCH₃)₂Mo(=NC(CH₃)₃)₂ (75.4 g, yield 71%).

¹H-NMR (C₆D₆, ppm) δ 0.64, 0.89 (6H, d, CH₃N(CH₂CH(CH₃)NCH₃)₂), 1.44, 1.50 (18H, s, Mo(NC(CH₃)₃)₂), 2.41 (3H, s, CH₃N(CH₂CH(CH₃)NCH₃)₂), 2.64, 2.99 (2H, m, CH$_3$N(CH$_2$CH(CH$_3$)NCH$_3$)$_2$), 2.83, 2.84, 3.32, 3.64 (4H, m, CH$_3$N(CH$_2$CH(CH$_3$)NCH$_3$)$_2$), 3.56, 3.68 (6H, s, CH$_3$N (CH$_2$CH(CH$_3$)NCH$_3$)$_2$).

[Example 17] Synthesis of CH$_3$N(CH$_2$CH$_2$NCH$_3$)$_2$Ta(N(CH$_3$)$_2$)$_3$

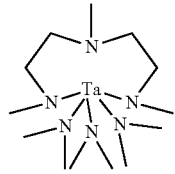

After dissolving penta(dimethylamino)tantalum [Ta(NMe$_2$)] (30 g, 0.07 mol) in a hexane solvent, N,N',N''-trimethyldiethylenetriamine [CH$_3$N(CH$_2$CH$_2$N(CH$_3$)H)$_2$] (10.86 g, 0.07 mol) was added at 0° C., and stirring was performed at room temperature for 8 hours. After finishing the reaction, the solvent and volatile by-products were removed under reduced pressure, and then sublimation under reduced pressure (120° C. @ 0.44 torr) was performed, thereby obtaining the solid title compound, CH$_3$N(CH$_2$CH$_2$NCH$_3$)$_2$Ta(N(CH$_3$)$_2$)$_3$ (21 g, 62%).

$^1$H-NMR (C$_6$D$_6$, ppm) δ 2.01 (2H, t, CH$_3$N(CHHCH$_2$NCH$_3$)$_2$), 2.16 (3H, s, CH$_3$N(CH$_2$CH$_2$NMe$_2$)$_2$), 2.18 (2H, t, CH$_3$N(CHHC$_2$HNMe)$_2$), 2.98 (2H, m, CH$_3$N(CH$_2$CHHNMe)$_2$), 3.14 (3H, s, TaNCH$_3^1$), 3.23 (3H, s, TaNCH$_3^2$), 3.29 (2H, s, CH$_3$N(CH$_2$CH$_2$NCH$_3$)$_2$), 3.31 (3H, s, TaNCH$_3^3$), 3.46 (3H, m, CH$_3$N(CH$_2$CH$_2$NCH$_3^2$)$_2$), 3.70 (2H, m, CH$_3$N(CH2CHHNMe)$_2$).

[Example 18] Synthesis of CH$_3$N(CH$_2$CH(CH$_3$)NCH$_3$)$_2$La(N(Si(CH$_3$)$_3$)$_2$)

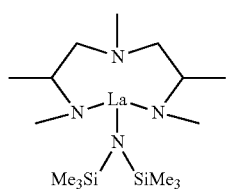

After dissolving tris(N,N-bis(trimethylsilyl)amide)lanthanum [La(N(Si(CH$_3$)$_3$)$_2$)$_3$] (20 g, 0.03 mol) in a hexane solvent, N,N'N''-trimethyldiisopropylenetriamine[CH$_3$N(CH$_2$CH(CH$_3$)N(CH$_3$)H)$_2$] (5.59 g, 0.03 mol) was added at 0° C., the temperature was raised to room temperature, and stirring was performed at 68° C. for 8 hours. After finishing the reaction, the solvent and volatile by-products were removed under reduced pressure, thereby obtaining the solid title compound, CH$_3$N(CH$_2$CH(CH$_3$)NCH$_3$)$_2$La(N(Si(CH$_3$)$_3$)$_2$) (5 g, 33%).

$^1$H-NMR (C$_6$D$_6$, ppm) δ 3.33 (1H, m, CH), 3.19 (3H, s, (N(CH$_3$))$_2$Hf), 3.15 (3H, s, (N(CH$_3$))$_2$Hf), 3.08 (1H, m, CH$_2$), 3.00 (2H, m, CH$_2$), 2.83 (1H, m, CH$_2$), 2.81 (1H, m, CH), 1.95 (3H, s, CH$_3$N), 0.86 (3H, d, C(CH$_3$)), 0.62 (3H, d, C(CH$_3$)), 0.36 (18H, s, N(Si(CH$_3$)$_3$)$_2$).

[Example 19] Synthesis of CH$_3$N(CH$_2$CH$_2$CH$_2$NCH$_3$)$_2$W(CO)$_4$

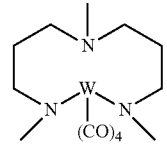

Tungsten hexacarbonyl (W(CO)$_6$) (300 g, 0.853 mol, 1 eq.) was added to a 3000 mL flask under the nitrogen atmosphere, and dichloromethane (2000 mL) was added thereto. Diatomic bromine (Br$_2$) (149.86 g, 0.938 mol, 1.10 eq.) was slowly added, while stirring this solution at −78° C. After stirring this mixed reaction solution at −78° C. for 1 hour, the temperature was raised to room temperature, and stirring was performed until the solution became a dark reddish brown suspension. This solution was filtered and the solvent was removed under reduced pressure until a precipitate was produced. The precipitated solution was filtered again to obtain a solid compound, which was washed with normal hexane, and dried under reduced pressure. After completely drying, a W(CO)$_4$Br$_2$ compound (98 g, yield 25%) was obtained as a reddish solid. As a next step, W(CO)$_4$Br$_2$ (98 g, 0.215 mol, 1.00 eq.) from which the solvent was completely removed under the nitrogen atmosphere was added to a flame dried 1000 mL Schlenk flask, and toluene (500 mL) was added thereto. After slowly adding triethylamine (0.538 mol, 2.50 eq.) at room temperature, N,N',N''-trimethyldipropylenetriamine [CH$_3$N(CH$_2$CH$_2$CH$_2$N(CH$_3$)H)$_2$] (0.226 mol, 1.05 eq.) was added, stirring under reflux was performed at 100° C. for 6 hours, the temperature was cooled to room temperature, and drying was performed. The solvent was removed from the filtrate under reduced pressure, and normal hexane was extracted. The solvent was removed from the extracted solution under reduced pressure to obtain the light brown title compound in the form of gel, CH$_3$N(CH$_2$CH$_2$CH$_2$NCH$_3$)$_2$W(CO)$_4$ (10 g, 10%).

$^1$H-NMR (C$_6$D$_6$, ppm) δ 3.13 (H, m, CH$_2$), 2.64 (6H, s, NCH$_3$), 2.19 (4H, m, CH$_2$), 1.89 (3H, s, NCH$_3$), 1.35 (4H, m, CH$_2$).

[Example 20] Preparation of Zirconium Oxide (ZrO2) Thin Film Using CH$_3$N(CH$_2$C(CH$_3$)HN(CH$_3$))$_2$Zr(N(CH$_3$)$_2$)$_2$ A zirconium oxide thin film was preparing on a silicon substrate by atomic layer deposition (ALD). Each temperature of the silicon substrates was maintained at 220° C., 240° C., 260° C., 280° C., 300° C., 320° C., 330° C., 340° C., 350° C. and 400° C., and the CH$_3$N(CH$_2$C(CH$_3$)HN(CH$_3$))$_2$Zr(N(CH$_3$)$_2$)$_2$ precursor prepared in Example 3 was filled in a stainless steel bubbler vessel, which was maintained at 110° C. First, the CH$_3$N(CH$_2$C(CH$_3$)HN(CH$_3$))$_2$Zr(N(CH$_3$)$_2$)$_2$ precursor which was vaporized in the stainless steel bubbler vessel was transferred to a silicon substrate using argon gas (50 sccm) as carrier gas, and allowed to be adsorbed on the silicon substrate. Next, the zirconium oxide precursor compound was removed therefrom for 15 seconds using argon gas (3000 sccm). Thereafter, ozone gas at a concentration of about 180 g/m$^3$ was supplied at 500 sccm for 10 seconds to form a zirconium oxide thin film. Finally, reaction by-products and remaining reaction gas were removed for 10 seconds using argon gas (3000 sccm). The above-described process was set as 1 cycle, and 150 cycles were repeated to form the zirconium oxide thin film.

[Example 21] Preparation of Titanium Oxide (TiO2) Thin Film Using $CH_3N(CH_2CH_2N(CH_3))_2Ti(OCH(CH_3)_2)_2$ A titanium oxide thin film was prepared on a silicon substrate by atomic layer deposition. Each silicon pattern substrate was maintained at 300° C., and $CH_3N(CH_2CH_2N(CH_3))_2Ti(OCH(CH_3)_2)_2$ synthesized in Example 13 was filled in a stainless steel bubbler vessel, which was maintained at 104° C. First, the precursor of Example 13 which was vaporized in the stainless steel bubbler vessel was transferred to a silicon substrate using argon gas (50 sccm) as carrier gas, and allowed to be adsorbed on the silicon substrate. Next, the titanium oxide precursor compound was removed therefrom for 15 seconds using argon gas (3000 sccm). Thereafter, ozone gas at a concentration of about 180 g/m³ was supplied at 500 sccm for 10 seconds to form a titanium oxide thin film. Finally, reaction by-products and remaining reaction gas were removed for 10 seconds using argon gas (3000 sccm). The above-described process was set as 1 cycle, and 150 cycles were repeated to form the titanium oxide thin film.

[Example 22] Preparation of Titanium Oxide (TiO2) Thin Film Using $CH_3N(CH_2C(CH_3)HN(CH_3))_2Ti(N(CH_3)_2)_2$ A titanium oxide thin film was prepared on a silicon substrate by atomic layer deposition. Each temperature of the silicon substrates was maintained at 220° C., 240° C., 260° C., 280° C., 290° C., 300° C., 350° C. and 400° C., and $CH_3N(CH_2C(CH_3)HN(CH_3))_2Ti(N(CH_3)_2)_2$ synthesized in Example 1 was filled in a stainless steel bubbler vessel, which was maintained at 110° C. First, the precursor of Example 1 which was vaporized in the stainless steel bubbler vessel was transferred to a silicon substrate using argon gas (50 sccm) as carrier gas, and allowed to be adsorbed on the silicon substrate. Next, the titanium oxide precursor compound was removed therefrom for 15 seconds using argon gas (3000 sccm). Thereafter, ozone gas at a concentration of about 180 g/m' was supplied at 500 sccm for 10 seconds to forma titanium oxide thin film. Finally, reaction by-products and remaining reaction gas were removed for 10 seconds using argon gas (3000 sccm). The above-described process was set as 1 cycle, and 150 cycles were repeated to form the titanium oxide thin film.

[Example 23] Preparation of Hafnium Oxide (HfO2) Thin Film Using $CH_3N(CH_2C(CH_3)HN(CH_3))_2Hf(N(CH_3)_2)_2$ A hafnium oxide thin film was prepared on a silicon substrate by atomic layer deposition. Each temperature of the silicon substrates was maintained at 230° C., 250° C., 270° C., 290° C., 310° C., 330° C., 350° C. and 400° C., and $CH_3N(CH_2C(CH_3)HN(CH_3))_2Hf(N(CH_3)_2)_2$ synthesized in Example 7 was filled in a stainless steel bubbler vessel, which was maintained at 110° C. First, the precursor of Example 7 which was vaporized in the stainless steel bubbler vessel was transferred to a silicon substrate using argon gas (50 sccm) as carrier gas, and allowed to be adsorbed on the silicon substrate. Next, the hafnium oxide precursor compound was removed therefrom for 15 seconds using argon gas (3000 sccm). Thereafter, ozone gas at a concentration of about 180 g/m³ was supplied at 500 sccm for 10 seconds to form a hafnium oxide thin film. Finally, reaction by-products and remaining reaction gas were removed for 10 seconds using argon gas (3000 sccm). The above-described process was set as 1 cycle, and 150 cycles were repeated to form the hafnium oxide thin film.

[Example 24] Preparation of Titanium Nitride (TiN) Thin Film Using $CH_3N(CH_2C(CH_3)HN(CH_3))_2Ti(N(CH_3)_2)_2$ A titanium nitride thin film was prepared on a silicon substrate by atomic layer deposition. The silicon substrate was maintained at 300° C., and $CH_3N(CH_2C(CH_3)HN(CH_3))_2Ti(N(CH_3)_2)_2$ synthesized in Example 1 was filled in a stainless steel bubbler vessel, which was maintained at 110° C. First, the precursor of Example 1 which was vaporized in the stainless steel bubbler vessel was transferred to a silicon substrate using argon gas (50 sccm) as carrier gas, and allowed to be adsorbed on the silicon substrate. Next, the titanium oxide precursor compound was removed therefrom for 15 seconds using argon gas (3000 sccm). Thereafter, ammonia ($NH_3$) gas was supplied at 2000 sccm for 20 seconds to form a titanium nitride (TiN) thin film. Finally, reaction by-products and remaining reaction gas were removed for 10 seconds using argon gas (3000 sccm). The above-described process was set as 1 cycle, and 300 cycles were repeated to form the titanium nitride thin film.

[Example 25] Evaluation of Heat Treatment of Titanium Nitride Thin Film Using $CH_3N(CH_2C(CH_3)HN(CH_3))_2Ti(N(CH_3)_2)_2$ The titanium nitride thin film prepared in Example 21 was heat-treated by an in-situ process under vacuum without external exposure, while maintaining it at a process temperature of 600° C. and 6000 sccm of $NH_3$ for 2 hours, thereby preparing a titanium nitride thin film having a low content of impurities.

[Example 26] Preparation of Hafnium Nitride (HfN) Thin Film Using $CH_3N(CH_2C(CH_3)HN(CH_3))_2Hf(N(CH_3)_2)_2$ A hafnium nitride thin film was prepared on a tungsten substrate by atomic layer deposition. The tungsten substrate was maintained at 300° C., and $CH_3N(CH_2C(CH_3)HN(CH_3))_2Hf(N(CH_3)_2)_2$ synthesized in Example 7 was filled in a stainless steel bubbler vessel, which was maintained at 107° C. First, the precursor of Example 7 which was vaporized in the stainless steel bubbler vessel was transferred to a tungsten substrate using nitrogen gas (25 sccm) as carrier gas, and allowed to be adsorbed on the tungsten substrate. Next, the hafnium nitride precursor compound was removed therefrom for 15 seconds using nitrogen gas (3000 sccm). Thereafter, ammonia ($NH_3$) gas was supplied at 2000 sccm for 20 seconds to form a hafnium nitride (HfN) thin film. Finally, reaction by-products and remaining reaction gas were removed for 10 seconds using nitrogen gas (3000 sccm). The above-described process was set as 1 cycle, and 210 cycles were repeated to form the hafnium nitride thin film.

[Example 27] Preparation of Hafnium Nitride (HfN) Thin Film Using $CH_3N(CH_2C(CH_3)HN(CH_3))_2Hf(N(CH_3)_2)_2$ A hafnium nitride thin film was prepared on a silicon dioxide substrate by atomic layer deposition. The silicon dioxide substrate was maintained at 300° C., and CH$_3$N(CH$_2$C(CH$_3$)HN(CH$_3$))$_2$Hf(N(CH$_3$)$_2$)$_2$ synthesized in Example 7 was filled in a stainless steel bubbler vessel, which was maintained at 107° C. First, the precursor of Example 7 which was vaporized in the stainless steel bubbler vessel was transferred to a silicon dioxide substrate using nitrogen gas (25 sccm) as carrier gas, and allowed to be adsorbed on the silicon dioxide substrate. Next, the hafnium nitride precursor compound was removed therefrom for 15 seconds using nitrogen gas (3000 sccm). Thereafter, ammonia (NH$_3$) gas was supplied at 2000 sccm for 20 seconds to form a hafnium nitride (HfN) thin film. Finally, reaction by-products and remaining reaction gas were removed for 10 seconds using nitrogen gas (3000 sccm). The above-described process was set as 1 cycle, and 210 cycles were repeated to form the hafnium nitride thin film.

[Example 28] Preparation of Hafnium Oxide (HfO2) Thin Film Using CH$_3$N(CH$_2$C(CH$_3$)HN(CH$_3$))$_2$Hf(N(CH$_3$)$_2$)$_2$ A hafnium oxide thin film was prepared on a tungsten substrate by chemical vapor deposition. The tungsten substrate was maintained at 300° C., and CH$_3$N(CH$_2$C(CH$_3$)HN(CH$_3$))$_2$Hf(N(CH$_3$)$_2$)$_2$ synthesized in Example 7 was filled in a stainless steel bubbler vessel, which was maintained at 107° C. First, the precursor of Example 7 which was vaporized in the stainless steel bubbler vessel was transferred to a tungsten substrate for 120 minutes using argon gas (25 sccm) as carrier gas, and allowed to be reacted with the tungsten substrate. Next, reaction was performed with ozone gas (200 sccm) for 5 minutes to form a hafnium oxide thin film.

[Example 29] Preparation of Hafnium Oxide (HfO2) Thin Film Using CH$_3$N(CH$_2$C(CH$_3$)HN(CH$_3$))$_2$Hf(N(CH$_3$)$_2$)$_2$ A hafnium oxide thin film was prepared on a silicon dioxide substrate by chemical vapor deposition. The silicon dioxide substrate was maintained at 300° C., and CH$_3$N(CH$_2$C(CH$_3$)HN(CH$_3$))$_2$Hf(N(CH$_3$)$_2$)$_2$ synthesized in Example 7 was filled in a stainless steel bubbler vessel, which was maintained at 107° C. First, the precursor of Example 7 which was vaporized in the stainless steel bubbler vessel was transferred to a silicon dioxide substrate for 120 minutes using argon gas (25 sccm) as carrier gas, and allowed to be reacted with the silicon dioxide substrate. Next, reaction was performed with ozone gas (200 sccm) for 5 minutes to form a hafnium oxide thin film.

[Example 30] Preparation of Molybdenum Nitride (MoN) Thin Film Using CH$_3$N(CH$_2$CH(CH$_3$)NCH$_3$)$_2$Mo(=NC(CH$_3$)$_3$)$_2$ A molybdenum nitride thin film was prepared on a silicon substrate by plasma enhanced atomic layer deposition. The silicon substrate was maintained at 300° C., and CH$_3$N(CH$_2$CH(CH$_3$)NCH$_3$)$_2$Mo(=NC(CH$_3$)$_3$)$_2$ synthesized in Example 16 was filled in a stainless steel bubbler vessel, which was maintained at 100° C. First, the precursor of Example 16 which was vaporized in the stainless steel bubbler vessel was transferred to a silicon substrate using nitrogen gas (25 sccm) as carrier gas, and allowed to be adsorbed on the silicon substrate. Next, the molybdenum nitride film precursor compound was removed therefrom for 15 seconds using nitrogen gas (3000 sccm). Thereafter, ammonia (NH$_3$) gas was supplied at 2000 sccm for 20 seconds, simultaneously with applying RF plasma power of 400 W, thereby forming the molybdenum nitride (MoN) thin film. Finally, reaction by-products and remaining reaction gas were removed for 10 seconds using nitrogen gas (3000 sccm). The above-described process was set as 1 cycle, and 210 cycles were repeated to form the molybdenum nitride thin film.

[Experimental Example 1] Evaluation of Thermal Stability of Metal Triamine Compounds In order to determine the thermal stability of the metal triamine compounds prepared in the above Examples, an experiment with a differential scanning calorimetry (DSC) (DSC3, METTLER TOLEDO) was performed to measure the temperature at which pyrolysis occurs. Herein, about 1-5 mg of each sample was taken, and added to a sample vessel, and the measurement was performed to 500° C. at a heating rate of 10° C./min, and the measurement results are shown in Table 1:

TABLE 1

| | Compound structure | Pyrolysis temperature |
|---|---|---|
| Examples 1 and 2 | CH$_3$N(CH$_2$C(CH$_3$)HN(CH$_3$))$_2$Ti(N(CH$_3$)$_2$)$_2$ | 305° C. |
| Examples 3 and 4 | CH$_3$N(CH$_2$C(CH$_3$)HN(CH$_3$))$_2$Zr(N(CH$_3$)$_2$)$_2$ | 307° C. |
| Example 5 | CH$_3$N(CH$_2$C(CH$_3$)HN(CH$_3$))$_2$Zr(N(CH$_3$)(C$_2$H$_5$))$_2$ | 300° C. |
| Example 6 | CH$_3$N(CH$_2$CH$_2$HN(CH$_3$))$_2$Zr(N(CH$_3$)(C$_2$H$_5$))$_2$ | 295° C. |
| Example 7 | CH$_3$N(CH$_2$C(CH$_3$)HN(CH$_3$))$_2$Hf(N(CH$_3$)$_2$)$_2$ | 315° C. |
| Example 8 | CH$_3$N(CH$_2$CH$_2$HN(CH$_3$))$_2$Hf(N(CH$_3$)$_2$)$_2$ | 315° C. |
| Example 9 | CH$_3$N(CH$_2$C(CH$_3$)HN(CH$_3$))$_2$Hf(N(CH$_3$)(C$_2$H$_5$))$_2$ | 320° C. |
| Example 10 | CH$_3$N(CH$_2$CH$_2$HN(CH$_3$))$_2$Hf(N(CH$_3$)(C$_2$H$_5$))$_2$ | 290° C. |
| Example 11 | CH$_3$N(CH$_2$C(CH$_3$)HN(CH(CH$_3$)2))$_2$Hf(N(CH$_3$)$_2$)$_2$ | 320° C. |
| Example 12 | CH$_3$N(CH$_2$CH$_2$N(CH(CH$_3$)$_2$))$_2$Hf(N(CH$_3$)$_2$)$_2$ | 315° C. |
| Example 13 | CH$_3$N(CH$_2$CH$_2$N(CH$_3$))$_2$Ti(O(CH(CH$_3$)$_2$)$_2$ | 295° C. |
| Example 16 | CH$_3$N(CH$_2$CH(CH$_3$)NCH$_3$)$_2$Mo(=NC(CH$_3$)$_3$)$_2$ | 240° C. |
| Comparative Example 1 | CpZr(N(CH$_3$)$_2$)$_3$ (Cp = cyclopentadienyl) | 285° C. |
| Comparative Example 2 | Hf(N(CH$_3$)(C$_2$H$_5$))$_4$ | 270° C. |
| Comparative Example 3 | Ti(NMe$_2$)$_4$ | 270° C. |
| Comparative Example 4 | ((CH$_3$)$_2$N)$_2$Mo(=NC(CH$_3$)$_3$) | 230° C. |

As shown in Table 1, the pyrolysis temperatures were compared as an onset temperature of DSC, and as a result, it was confirmed that the pyrolysis temperature of the metal triamine compound of the present invention was 290° C. or more, which was raised by 5 to 50° C. or more as compared with cyclopentadienyl tris(dimethylamino)zirconium (CpZr(N(CH$_3$)$_2$)$_3$) as an organic zirconium precursor, tetrakis (ethylmethylamino)hafnium (Hf(N(CH$_3$)(C$_2$H$_5$))$_4$) as an organic hafnium precursor, tetrakis(dimethylamino)titanium (Ti(N(CH$_3$)$_2$)$_4$) as an organic titanium precursor, and bis(t-butylimido)bis(dimethylamido)molybdenum (((CH$_3$)$_2$N)$_2$Mo(=NC(CH$_3$)$_3$)$^2$) as an organic molybdenum precursor, all of which were widely used in the past.

In particular, the titanium triamine compound of the present invention showed the pyrolysis temperature which was raised by 25° C. or more as compared with tetrakis (dimethylamino)titanium (Ti(N(CH$_3$)$_2$)$_4$) as an organic titanium precursor which was widely used in the past, the zirconium triamine compound of the present invention showed the pyrolysis temperature which was raised by 10° C. or more as compared with tris(dimethylamino)zirconium (CpZr(N(CH$_3$)$_2$)$_3$) as an organic zirconium precursor which was widely used in the past, and the hafnium triamine compound of the present invention showed the pyrolysis temperature which was raised by 20° C. or more as compared with tetrakis(ethylmethylamino)hafnium (Hf(N(CH$_3$)(C$_2$H))$_4$) as an organic hafnium precursor which was widely used in the past.

It is seen therefrom that the metal triamine compound of the present invention has excellent thermal stability, and enables thin film formation at higher temperature, which may lead to an increase in step coverage in micropatterns.

[Experimental Example 2] Evaluation of Storage Stability

In order to confirm the storage stability of the metal triamine compounds prepared in Examples 1 to 19, those compounds were added to a vial made of steel use stainless (SUS), respectively, and then subjected to a harshness test to be stored at 150° C. for 1 hour, and as a result, were confirmed to be stable without a change in NMR.

[Experimental Example 3] Evaluation of Step Coverage Property of Zirconium Oxide (ZrO2) Thin Film Using CH$_3$N(CH$_2$C(CH$_3$)HN(CH$_3$))$_2$Zr(N(CH$_3$)$_2$)$_2$ In order to confirm the step coverage property, the deposition method described in Example 20 was used to form a zirconium oxide thin film on a silicon pattern substrate having a trench structure of an aspect ratio of 6:1, and the results are shown in FIG. 1.

As seen from FIG. 1, a very high step coverage property of 100% was confirmed.

[Experimental Example 4] Evaluation of Step Coverage Property of Zirconium Oxide (ZrO2) Thin Film Using CH$_3$N(CH$_2$C(CH$_3$)HN(CH$_3$))$_2$Zr(N(CH$_3$)$_2$)$_2$ In order to confirm the step coverage property, the deposition method described in Example 20 was used to form a zirconium oxide thin film on a silicon pattern substrate having a 60:1 hole structure pattern, and the results are shown in FIG. 1.

As seen from FIG. 1, a very high step coverage property of 99% or more was confirmed.

[Experimental Example 5] Evaluation of Step Coverage Property of Titanium Oxide (TiO2) Thin Film Using CH$_3$N(CH$_2$CH$_2$N(CH$_3$))$_2$Ti(OCH(CH$_3$)$_2$)$_2$ In order to confirm the step coverage property, the deposition method described in Example 21 was used to form a titanium oxide thin film on a silicon pattern substrate having a trench structure of an aspect ratio of 6:1, and the results are shown in FIG. 2.

As seen from FIG. 2, a very high step coverage property of 100% was confirmed.

[Experimental Example 6] Evaluation of Step Coverage Property of Titanium Oxide (TiO2) Thin Film Using CH$_3$N(CH$_2$C(CH$_3$)HN(CH$_3$))$_2$Ti(N(CH$_3$)$_2$)$_2$ In order to confirm the step coverage property, the deposition method described in Example 22 was used to form a titanium oxide thin film on a silicon pattern substrate having a trench structure of an aspect ratio of 6:1, and the results are shown in FIG. 3.

As seen from FIG. 3, a very high step coverage property of 100% was confirmed.

[Experimental Example 7] Evaluation of Step Coverage Property of Titanium Oxide (TiO2) Thin Film Using CH$_3$N(CH$_2$C(CH$_3$)HN(CH$_3$))$_2$Ti(N(CH$_3$)$_2$)$_2$ In order to confirm the step coverage property, the deposition method described in Example 22 was used to form a titanium thin film on a silicon pattern substrate having a 60:1 hole structure pattern, and the results are shown in FIG. 3.

As seen from FIG. 3, a very high step coverage property of 99% or more was confirmed.

[Experimental Example 8] Evaluation of Step Coverage Property of Hafnium Oxide (HfO2) Thin Film Using CH$_3$N(CH$_2$C(CH$_3$)HN(CH$_3$))$_2$Hf(N(CH$_3$)$_2$)$_2$ In order to confirm the step coverage property, the deposition method described in Example 23 was used to form a hafnium oxide thin film on a silicon pattern substrate having a trench structure of an aspect ratio of 6:1, and the results are shown in FIG. 4.

As seen from FIG. 4, a very high step coverage property of 100% was confirmed.

[Experimental Example 9] Evaluation of Step Coverage Property of Hafnium Oxide (HfO2) Thin Film Using CH$_3$N(CH$_2$C(CH$_3$)HN(CH$_3$))$_2$Hf(N(CH$_3$)$_2$)$_2$ In order to confirm the step coverage property, the deposition method described in Example 23 was used to form a hafnium oxide thin film on a silicon pattern substrate having a 60:1 hole structure pattern, and the results are shown in FIG. 4.

As seen from FIG. 4, a very high step coverage property of 99% or more was confirmed.

[Experimental Example 10] Evaluation of Step Coverage Property of Titanium Nitride (TiN) Thin Film Using $CH_3N(CH_2C(CH_3)HN(CH_3))_2Ti(N(CH_3)_2)_2$ In order to confirm the step coverage property, the deposition method described in Example 24 was used to form a titanium nitride thin film on a silicon pattern substrate having a trench structure of an aspect ratio of 6:1, and the results are shown in FIG. 5.

As seen from FIG. 5, a very high step coverage property of 100% was confirmed.

[Experimental Example 11] Analysis of Growth Rate of Zirconium Oxide Thin Film Depending on Source Dosage The source dosage was changed by the thickness of the zirconium oxide thin film deposited in Example 20 (silicon substrate temperature 300° C.), which was analyzed by a transmission electron microscope, and the thin film growth rate per one cycle in accordance therewith is shown in FIG. 6.

As seen from FIG. 6, it was confirmed that the $CH_3N(CH_2C(CH_3)HN(CH_3))_2Zr(N(CH_3)_2)_2$ precursor of Example 3 underwent a self-limited reaction at a silicon substrate temperature of 300° C.

[Experimental Example 12] Linearity of Zirconium Oxide Thin Film

Using the thickness of the zirconium oxide thin film deposited by the same process as Example 20 (silicon substrate temperature 300° C.) except for a change in the process cycle, which was analyzed by a transmission electron microscope, the linearity of the zirconium oxide thin film is shown in FIG. 7.

As seen from FIG. 7, it was confirmed that the $CH_3N(CH_2C(CH_3)HN(CH_3))_2Zr(N(CH_3)_2)_2$ precursor of Example 3 had a low incubation time at a silicon substrate temperature of 300° C., good crystalline was formed at even a low thickness of 16 Å, and also at even a thickness of 16 Å or more.

[Experimental Example 13] Analysis of Growth Rate of Zirconium Oxide Thin Film Depending on Temperature of Silicon Substrate Using the thickness of the zirconium oxide thin film deposited in Example 20, which was analyzed by a transmission electron microscope, the thin film growth rate of the thin film per one cycle dependent upon the temperature of the silicon substrate was compared with the thin film growth rate deposited under the same deposition condition as Example 20 except that the temperature of the stainless steel bubbler vessel was maintained at 100° C. in $CpZr(N(CH_3)_2)_3$ (Cp=cyclopentadienyl) of Comparative Example 1, and the results are shown in FIG. 8.

As seen from FIG. 8, it was confirmed that for the $CH_3N(CH_2C(CH_3)HN(CH_3))_2Zr(N(CH_3)_2)_2$ precursor of Example 3, the growth rate of the zirconium oxide thin film per one cycle was within the significant difference interval at the silicon substrate temperature from 260° C. to 320° C., which was increased by 20° C. or more as compared with $CpZr(N(CH_3)_2)_3$ (Cp=cyclopentadienyl) of Comparative Example 1.

[Experimental Example 14] Analysis of Growth Rate of Titanium Oxide Thin Film Depending on Source Dosage The source dosage was changed by the thickness of the titanium oxide thin film deposited in Example 22 (silicon substrate temperature 280° C.), which was analyzed by a transmission electron microscope, and the thin film growth rate per one cycle in accordance therewith is shown in FIG. 9.

As seen from FIG. 9, it was confirmed that the $CH_3N(CH_2C(CH_3)HN(CH_3))_2Ti(N(CH_3)_2)_2$ precursor prepared in Example 1 underwent a self-limited reaction at a silicon substrate temperature of 280° C.

[Experimental Example 15] Linearity of Titanium Oxide Thin Film

Using the thickness of the titanium oxide thin film deposited by the same process as Example 22 (silicon substrate temperature 280° C.) except for a change in the process cycle, which was analyzed by a transmission electron microscope, the linearity of the titanium oxide thin film is shown in FIG. 10.

As seen from FIG. 10, it was confirmed that the $CH_3N(CH_2C(CH_3)HN(CH_3))_2Ti(N(CH_3)_2)_2$ precursor prepared in Example 1 had a low incubation time at a silicon substrate temperature of 280° C., good crystalline was formed at even a low thickness of 14 Å, and also at even a thickness of 14 Å or more.

[Experimental Example 16] Analysis of Growth Rate of Titanium Oxide Thin Film Depending on Temperature of Silicon Substrate Using the thickness of the titanium oxide thin film deposited in Example 22, which was analyzed by a transmission electron microscope, the thin film growth rate per one cycle depending on the temperature of the silicon substrate is shown in FIG. 11.

As seen from FIG. 11, it was confirmed that for the $CH_3N(CH_2C(CH_3)HN(CH_3))_2Ti(N(CH_3)_2)_2$ precursor synthesized in Example 1, the growth rate of the titanium oxide thin film per one cycle was within the significant difference interval at the silicon substrate temperature from 240° C. to 290° C.

[Experimental Example 17] Analysis of Growth Rate of Hafnium Oxide Thin Film Depending on Source Dosage The source dosage was changed by the thickness of the hafnium oxide thin film deposited in Example 23 (silicon substrate temperature 320° C.), which was analyzed by a transmission electron microscope, and the thin film growth rate per one cycle in accordance therewith is shown in FIG. 12.

As seen from FIG. 12, it was confirmed that the $CH_3N(CH_2C(CH_3)HN(CH_3))_2Hf(N(CH_3)_2)_2$ precursor prepared in Example 7 underwent a self-limited reaction at a silicon substrate temperature of 320° C.

[Experimental Example 18] Linearity of Hafnium Oxide Thin Film

Using the thickness of the hafnium oxide thin film deposited by the same process as Example 23 (silicon substrate temperature 320° C.) except for a change in the process cycle, which was analyzed by a transmission electron microscope, the linearity of the hafnium oxide thin film is shown in FIG. 13.

As seen from FIG. 13, it was confirmed that the $CH_3N(CH_2C(CH_3)HN(CH_3))_2Hf(N(CH_3)_2)_2$ precursor prepared in Example 7 had a low incubation time at a silicon substrate temperature of 320° C., good crystalline was formed at even a low thickness of 14 Å, and also at even a thickness of 14 Å or more.

[Experimental Example 19] Analysis of Growth Rate of Hafnium Oxide Thin Film Depending on Temperature of Silicon Substrate Using the thickness of the hafnium oxide thin film deposited in Example 23, which was analyzed by a transmission electron microscope, the thin film growth rate per one cycle depending on the temperature of the silicon substrate is shown in FIG. 14.

As seen from FIG. 14, it was confirmed that for the $CH_3N(CH_2C(CH_3)HN(CH_3))_2Hf(N(CH_3)_2)_2$ precursor synthesized in Example 7, the growth rate of the hafnium oxide thin film per one cycle was within the significant difference interval at the silicon substrate temperature from 270° C. to 330° C.

[Experimental Example 20] Comparison of Surface Selective Growth of Hafnium Nitride Thin Film In order to determine the surface selective growth ratio of the hafnium nitride thin film, the hafnium nitride film formed in Examples 26 and 27 were analyzed by a transmission electron microscope, and the results are shown in FIG. 15. As shown in FIG. 15, the hafnium nitride thin film of Example 27 was deposited to a thickness of 4 Å on a silicon dioxide substrate, while the hafnium nitride thin film of Example 26 was deposited to a thickness of 26 Å on a tungsten substrate, and thus, a surface selective growth rate of 1 (silicon dioxide substrate):6.5 (tungsten substrate) was confirmed.

That is, it was confirmed that the thin film growth rate when forming a hafnium nitride thin film is different depending on the type of substrate.

[Experimental Example 21] Comparison of Surface Selective Growth of Hafnium Oxide Thin Film In order to determine the surface selective growth ratio of the hafnium oxide thin film, the hafnium oxide film formed in Examples 28 and 29 were analyzed by a transmission electron microscope, and the results are shown in FIG. 16. As shown in FIG. 16, the hafnium oxide thin film of Example 29 was deposited to a thickness of 3 Å on a silicon dioxide substrate, while the hafnium oxide thin film of Example 28 was deposited to a thickness of 90 Å on a tungsten substrate, and thus, a surface selective growth rate of 1 (silicon dioxide substrate):30 (tungsten substrate) was confirmed.

That is, it was confirmed that the thin film growth rate when forming a hafnium oxide thin film is different depending on the type of substrate.

[Experimental Example 22] Analysis of Crystallinity of Zirconium Oxide Thin Film The crystallinity of the zirconium oxide thin film of Example 20 deposited at a substrate temperature of 300° C., and the crystallinity of the zirconium oxide thin film obtained by depositing the $CpZr(N(CH_3)_2)_3$ (Cp=cyclopentadienyl) of Comparative Example 1 under the same deposition condition as Example 20 except that temperature of the stainless steel bubbler vessel was maintained at 100° C. were analyzed by X-ray diffraction analysis, and the results are shown in FIG. 17.

As seen from FIG. 17, it was confirmed that the $CH_3N(CH_2C(CH_3)HN(CH_3))_2Zr(N(CH_3)_2)_2$ precursor of Example 3 had higher crystallinity at a substrate temperature of 300° C. than $CpZr(N(CH_3)_2)_3$ (Cp=cyclopentadienyl) of Comparative Example 1.

[Experimental Example 23] Analysis of Crystalline of Zirconium Oxide Thin Film

The crystalline of the zirconium oxide thin film of Example 20 deposited at a substrate temperature of 300° C., and the crystalline of the zirconium oxide thin film obtained by depositing the $CpZr(N(CH_3)_2)_3$ (Cp=cyclopentadienyl) of Comparative Example 1 under the same deposition condition as Example 20 except that temperature of the stainless steel bubbler vessel was maintained at 100° C. were analyzed by a transmission electron microscope, and the results are shown in FIG. 18.

As seen from FIG. 18, it was confirmed that the $CH_3N(CH_2C(CH_3)HN(CH_3))_2Zr(N(CH_3)_2)_2$ precursor of Example 3 had more distinct crystalline at a substrate temperature of 300° C. than $CpZr(N(CH_3)_2)_3$ (Cp=cyclopentadienyl) of Comparative Example 1.

[Experimental Example 24] Analysis of Composition of Zirconium Oxide Thin Film

The composition of the zirconium oxide thin film of Example 20 deposited at a substrate temperature of 300° C., and the composition of the zirconium oxide thin film obtained by depositing the $CpZr(N(CH_3)_2)_3$ (Cp=cyclopentadienyl) of Comparative Example 1 under the same deposition condition as Example 20 except that temperature of the stainless steel bubbler vessel was maintained at 100° C. were analyzed by secondary ion mass spectroscopy, and the results are shown in Table 2, and FIGS. 19 to 23.

As seen from Table 2, and FIGS. 19 to 23, it was confirmed that the $CH_3N(CH_2C(CH_3)HN(CH_3))_2Zr(N(CH_3)_2)_2$ precursor of Example 3 formed a zirconium oxide film having a higher purity at a silicon substrate temperature of 300° C. than $CpZr(N(CH_3)_2)_3$ (Cp=cyclopentadienyl) of Comparative Example 1.

TABLE 2

| | | Compositional ratio counts (by SIMS) | | | | |
|---|---|---|---|---|---|---|
| Precursor | Thin film | Zr | O | C | N | H |
| Example 3 | ZrO2 | 29007 | 4114 | 4 | 1 | 70 |
| Comparative Example 1 | ZrO2 | 28500 | 3466 | 30 | 2 | 204 |

[Experimental Example 25] Analysis of Composition of Metal-Containing Thin Film

The compositions of the metal-containing thin films deposited in Examples 20 to 30 were analyzed using X-ray photoelectron spectroscopy, and the results are shown in Table 3:

TABLE 3

| Classification | Thin film | Zr | Ti | Hf | Mo | O | N | C |
|---|---|---|---|---|---|---|---|---|
| Example 20 | ZrO2 | 33.8 | — | — | — | 66.2 | 0 | 0 |
| Example 21 | TiO2 | — | 36.7 | — | — | 63.3 | 0 | 0 |
| Example 22 | TiO2 | — | 35.1 | — | — | 64.9 | 0 | 0 |
| Example 23 | HfO2 | — | — | 34.5 | — | 65.5 | 0 | 0 |
| Example 24 | TiN | — | 40.4 | — | — | 7.8 | 37.7 | 14.1 |
| Example 25 | TiN | — | 47 | — | — | 7.1 | 42.7 | 3.2 |
| Example 26 | HfN | — | — | 45 | — | 8 | 47 | 0 |
| Example 27 | HfN | — | — | 39 | — | 22 | 39 | 0 |
| Example 28 | HfO2 | — | — | 34 | — | 66 | — | 0 |
| Example 29 | HfO2 | — | — | 33 | — | 67 | — | 0 |
| Example 30 | MoN | — | — | — | 57 | 6 | 37 | 0 |

As seen from Table 3, it was confirmed that in Examples 20 to 23, 28 and 29, a zirconium oxide (ZrO2) film, a hafnium oxide (HfO2) film, or a titanium oxide (TiO2) film was formed with high purity at a ratio of zirconium, hafnium or titanium to oxygen being about 1:2, without a carbon impurity.

In the thin film composition of Examples 24 to 27 and 30, oxygen is an impurity due to moisture absorption during measurement of the compositional ratio, and is irrelevant to the impurities in the thin film. In Examples 24 to 27 and 30, metal nitride thin films having a little or no carbon impurity were prepared. In addition, Example 25 is a titanium nitride thin film obtained by heat treating the titanium nitride thin film of Example 21 by continuous processes under vacuum, and it was confirmed that the content of carbon impurity was significantly decreased by the heat treatment by continuous processes.

That is, the metal triamine compound according to the present invention has excellent reactivity, high volatility, and excellent thermal stability and cohesion, and thus, is very useful as the precursor of a metal-containing thin film. Thus, it may form a high-purity metal-containing thin film without contamination with particles due to pyrolysis or contamination with impurities such as carbon.

[Experimental Example 26] Analysis of Electrical Properties of Metal Oxide Film

A zirconium oxide thin film was deposited in the same manner as the process conditions of Example 20, in the range of 280° C. to 320° C., using $CH_3N(CH_2C(CH_3)HN(CH_3))_2Zr(N(CH_3)_2)$ of Example 3 and $CpZr(N(CH_3)_2)_3$ of Comparative Example 1, and the electrical properties of the deposited zirconium oxide thin film were compared.

The electrical properties were measured by forming a platinum metal film on a zirconium oxide thin film to produce a metal-insulation film-semiconductor (MIS) structure. Here, the platinum metal film to be used as an upper electrode was produced to have a circular shape having a radius of about 150 m and a thickness of about 40 nm.

The dielectric constant was calculated by measuring capacitance in the range of −5V to 5V under the condition of 10 kHz, and using the capacitance in the accumulation region, the thickness of the zirconium oxide thin film, and the area of the platinum metal film, and this dielectric constant was used to obtain the thickness of an equivalent oxide film.

In addition, leakage current density was calculated by measuring the current value in the range of −4 V to 4 V, and taking the leakage current value at ±0.7 V.

As shown in FIG. 24, the leakage current characteristics in the case of using Example 3 $[CH_3N(CH_2C(CH_3)HN(CH_3))_2Zr(N(CH_3)_2)]$ and Comparative Example 1 $[CpZr(N(CH_3)_2)_3]$ were similar, however, the dielectric constant was high, and the thickness of the equivalent oxide film was low in the case of using Example 3, and thus, it was confirmed that the electrical properties were improved.

[Experimental Example 27] Analysis of Electrical Properties of Metal Oxide Film Having a Multilayer Structure (ZrO2/Al2O3/ZrO2, ZAZ)

A multilayer structure in the form of zirconium oxide film/aluminum oxide film/zirconium oxide film was formed on a silicon substrate by atomic layer deposition. Here, the silicon substrate was maintained at 300° C., and as the zirconium oxide film, the $CH_3N(CH_2C(CH_3)HN(CH_3))_2Zr(N(CH_3)_2)_2$ precursor synthesized in Example 3 was used, and as the aluminum oxide film, trimethyl aluminum (TMA) was used.

The zirconium oxide film was formed in the same manner as in Example 20, and the aluminum oxide film was formed in the following process: First, TMA in a stainless steel vessel was cooled to 10° C., and transferred to a silicon substrate using argon gas (50 sccm) as carrier gas, and allowed to be adsorbed on the silicon substrate. Second, the aluminum precursor compound was removed for about 15 seconds using the argon gas (4000 sccm). Third, ozone gas at a concentration of about 180 g/m$^3$ was supplied 500 sccm for 10 seconds to form an aluminum oxide film. Finally, reaction by-products and remaining reaction gas were removed for 10 seconds using argon gas (4000 sccm). The above-described process was set as 1 cycle, and a set of cycles was repeated to form the aluminum oxide film.

Using the above method, a multilayer structure of zirconium oxide film having a thickness of 22 Å/aluminum oxide film having a thickness of 7 Å/zirconium oxide film having a thickness of 44 Å from the top was formed, and the electrical properties thereof were analyzed as described above.

The electrical properties of the zirconium oxide film formed by using the metal oxide film having a multilayer structure (ZrO2/Al2O3/ZrO2, ZAZ) and the $CH_3N(CH_2C(CH_3)HN(CH_3))_2Zr(N(CH_3)_2)_2$ precursor of Example 3 used in Experimental Example 26 were evaluated as described in Experimental Example 26, and the results are shown in FIG. 25.

As shown in FIG. 25, it was confirmed that the metal oxide film having a multilayer structure (ZrO2/Al2O3/ZrO2, ZAZ) had improved leakage current characteristics as compared with the zirconium oxide film having a single structure (ZrO2 Single). The metal oxide film having a multilayer structure (ZrO2/Al2O3/ZrO2, ZAZ) on which the properties of the aluminum oxide film were reflected had a lower dielectric constant, and a larger thickness of the equivalent oxide film than the zirconium oxide film having a single structure (ZrO2 Single).

The invention claimed is:
1. A metal triamine compound represented by the following Chemical Formula 1:

[Chemical Formula 1]

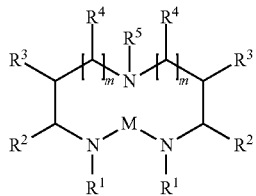

wherein
M is $M^1(A^1)$, $M^2(A^2)(A^3)$, $M^3(A^2)(A^3)(A^4)$, $M^4(=NR')_2$ or $M^4(CO)_4$;
$M^1$ is a Group 13 metal or a lanthanide metal;
$M^2$ is a Group 4 transition metal;
$M^3$ is a Group 5 transition metal;
$M^4$ is a Group 6 transition metal;
R' is (C1-C7) alkyl;
$R^1$ to $R^5$ are each independently hydrogen or (C1-C7) alkyl; and
$A^1$ is (C1-C7)alkyl, $NR^6R^7$, $OR^8$, a cyclopentadienyl ring or a fused ring containing the cyclopentadienyl ring;
$A^2$, $A^3$ and $A^4$ are each independently $NR^6R^7$, $OR^8$, a cyclopentadienyl ring or a fused ring containing the cyclopentadienyl ring;
the cyclopentadienyl ring or the fused ring containing the cyclopentadienyl ring in $A^1$, $A^2$, $A^3$ and $A^4$ may be further substituted with (C1-C7)alkyl or (C2-C7)alkenyl;
$R^6$, $R^7$ and $R^8$ are each independently (C1-C7)alkyl or $SiR^9R^{10}R^{11}$;
$R^9$ to $R^{11}$ are each independently (C1-C7)alkyl; and
m is an integer of 0 to 2.

2. The metal triamine compound of claim 1, wherein the metal triamine compound is represented by the following Chemical Formula 2 or 3:

[Chemical Formula 2]

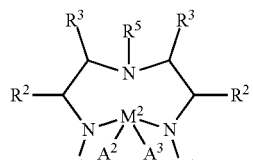

[Chemical Formula 3]

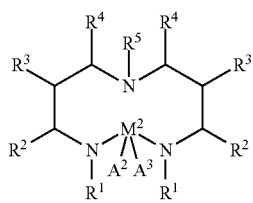

wherein
$M^1$ is B, Al, Ga, In or La;
$R^1$ to $R^5$ are each independently a hydrogen atom or (C1-C5)alkyl;
$A^1$ is (C1-C5)alkyl, $NR^6R^7$, $OR^8$ or a cyclopentadienyl ring;
$R^6$, $R^7$ and $R^8$ are each independently (C1-C5)alkyl or $SiR^9R^{10}R^{11}$; and
$R^9$ to $R^{11}$ are each independently (C1-C5)alkyl.

3. The metal triamine compound of claim 1, wherein the metal triamine compound is represented by the following Chemical Formula 4 or 5:

[Chemical Formula 4]

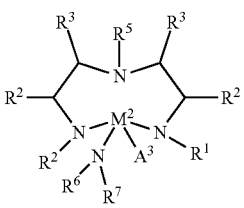

[Chemical Formula 5]

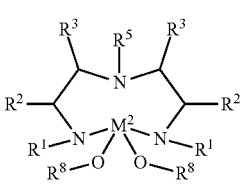

wherein
$M^2$ is Ti, Zr or Hf;
$R^1$ to $R^5$ are each independently a hydrogen atom or (C1-C5)alkyl;
$A^2$ and $A^3$ are each independently $NR^6R^7$, $OR^8$ or a cyclopentadienyl ring;
$R^6$, $R^7$ and $R^8$ are each independently (C1-C5)alkyl or $SiR^9R^{10}R^{11}$; and
$R^9$ to $R^{11}$ are each independently (C1-C5)alkyl.

4. The metal triamine compound of claim 3, wherein the metal triamine compound is represented by the following Chemical Formula 4-1 or 4-2:

[Chemical Formula 4-1]

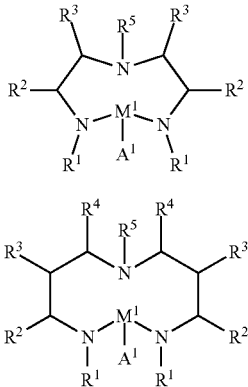

[Chemical Formula 4-2]

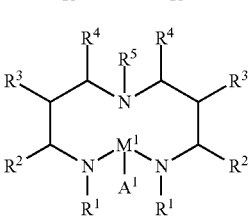

wherein
$M^2$ is Ti, Zr or Hf;
$R^1$ to $R^3$ and $R^5$ are each independently a hydrogen atom or (C1-C5)alkyl;
$A^3$ is $NR^6R^7$ or a cyclopentadienyl ring;
$R^6$, $R^7$ and $R^8$ are each independently (C1-C5)alkyl or $SiR^9R^{10}R^{11}$; and
$R^9$ to $R^{11}$ are each independently (C1-C5)alkyl.

5. The metal triamine compound of claim 4, wherein $R^1$ and $R^5$ are each independently (C1-C3)alkyl, $R^2$ and $R^3$ are each independently hydrogen or (C1-C3)alkyl, $A^3$ is $NR^6R^7$ or a cyclopentadienyl ring, $R^6$ and $R^7$ are each independently (C1-C3)alkyl, and $R^8$ is (C1-C4)alkyl.

6. The metal triamine compound of claim 1, wherein the metal triamine compound is represented by the following Chemical Formula 6 or 7:

[Chemical Formula 6]

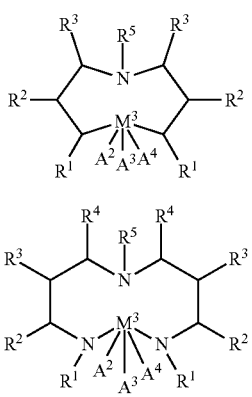

[Chemical Formula 7]

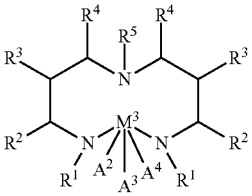

wherein
- $M^3$ is V, Nb or Ta;
- $R^1$ to $R^5$ are each independently a hydrogen atom or (C1-C5)alkyl;
- $A^2$, $A^3$ and $A^4$ are each independently $NR^6R^7$, $OR^8$ or a cyclopentadienyl ring;
- $R^6$, $R^7$ and $R^8$ are each independently (C1-C5)alkyl or $SiR^9R^{10}R^{11}$; and
- $R^9$ to $R^{11}$ are each independently (C1-C5)alkyl.

7. The metal triamine compound of claim 6, wherein $R^1$ and $R^5$ are each independently (C1-C3)alkyl, $R^2$ to $R^4$ are each independently hydrogen or (C1-C3)alkyl, $A^2$, $A^3$ and $A^4$ are each independently $NR^6R^7$, $R^6$ and $R^7$ are each independently (C1-C3)alkyl or $SiR^9R^{10}R^{11}$, and $R^9$ to $R^{11}$ are each independently (C1-C3)alkyl.

8. The metal triamine compound of claim 1, wherein the metal triamine compound is represented by the following Chemical Formula 8 or 9:

[Chemical Formula 8]

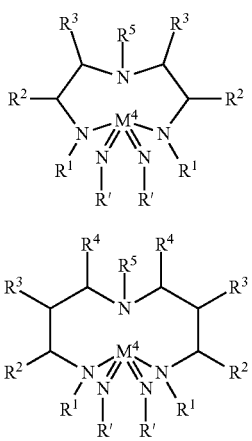

[Chemical Formula 9]

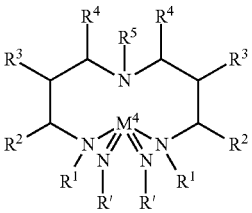

wherein
- $M^4$ is Cr, Mo or W;
- $R^1$ to $R^5$ are each independently a hydrogen atom or (C1-C5)alkyl; and
- R' is (C1-C5) alkyl.

9. The metal triamine compound of claim 1, wherein the metal triamine compound is represented by the following Chemical Formula 10 or 11:

[Chemical Formula 10]

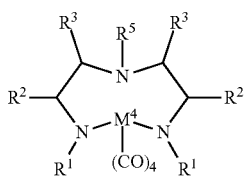

[Chemical Formula 11]

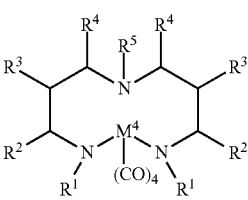

wherein
- $M^4$ is Cr, Mo or W; and
- $R^1$ to $R^5$ are each independently a hydrogen atom or (C1-C5)alkyl.

10. The metal triamine compound of claim 1, wherein the metal triamine compound is represented by the following structures:

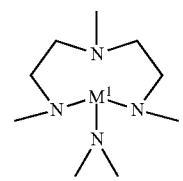

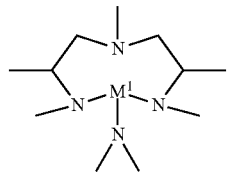

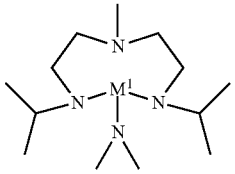

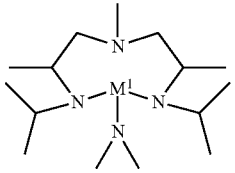

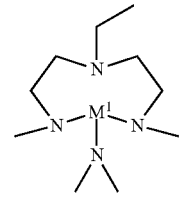

75
-continued
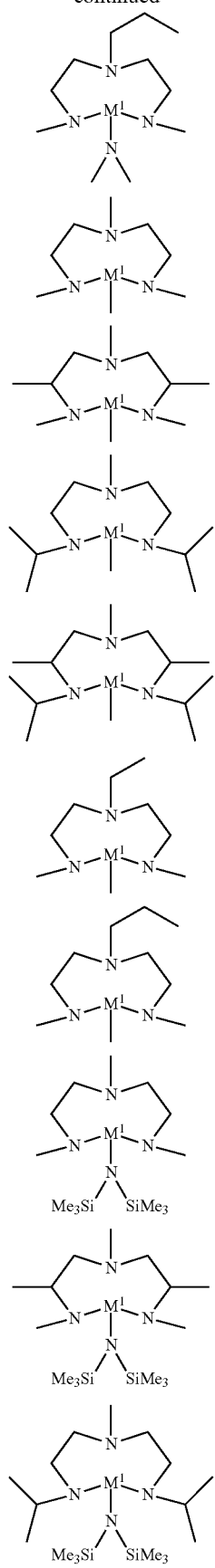
76
-continued
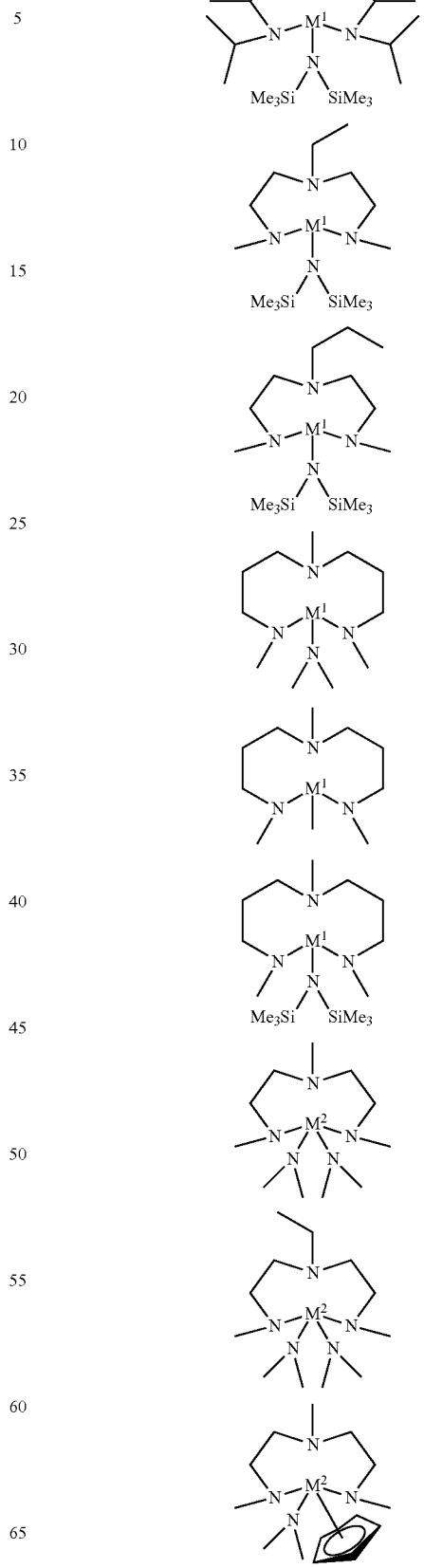

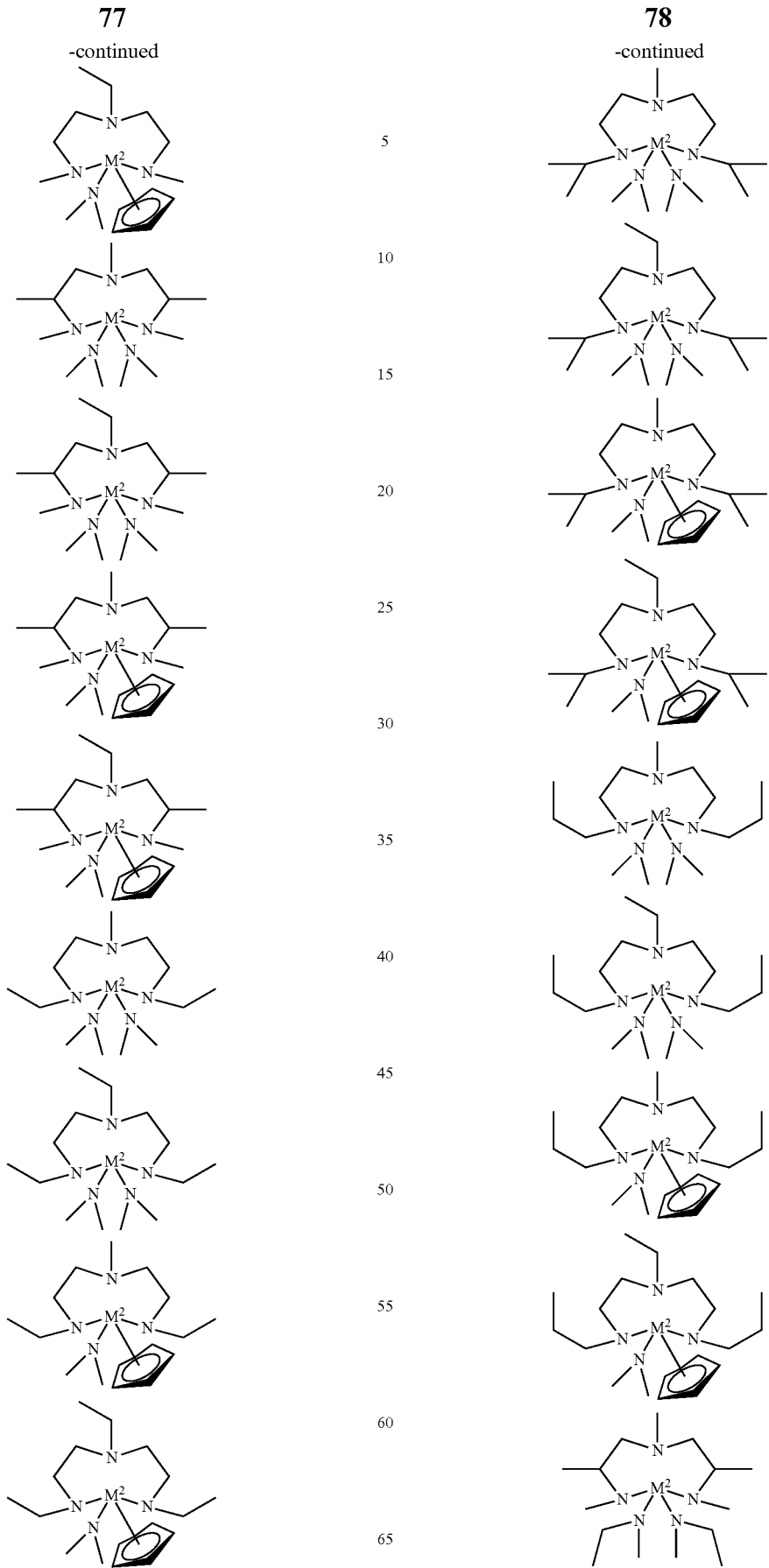

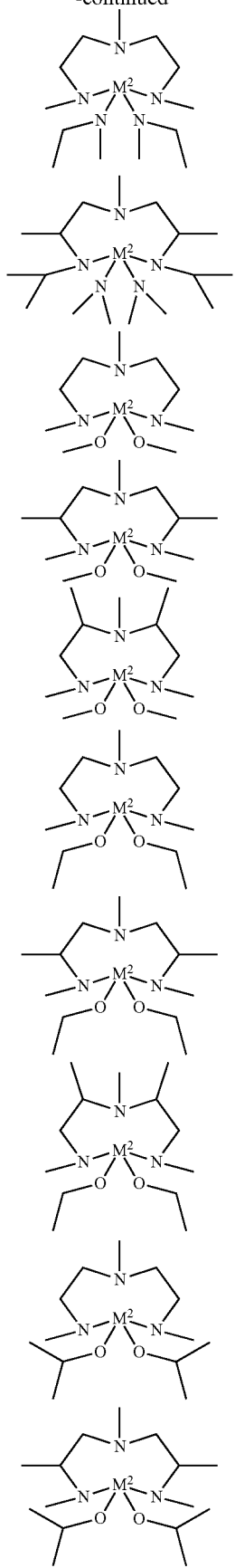
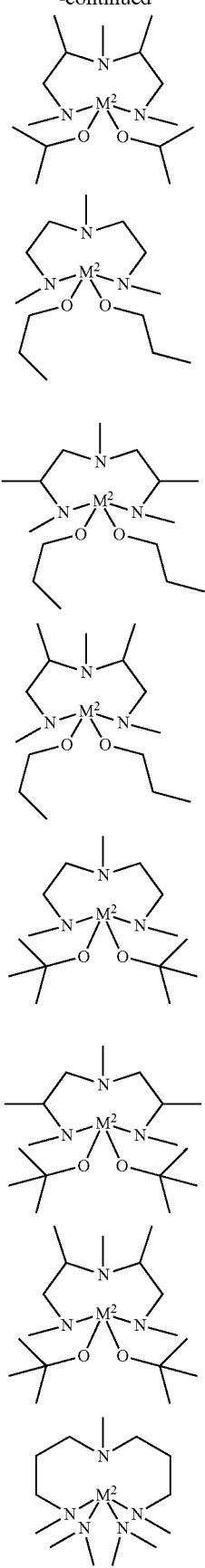

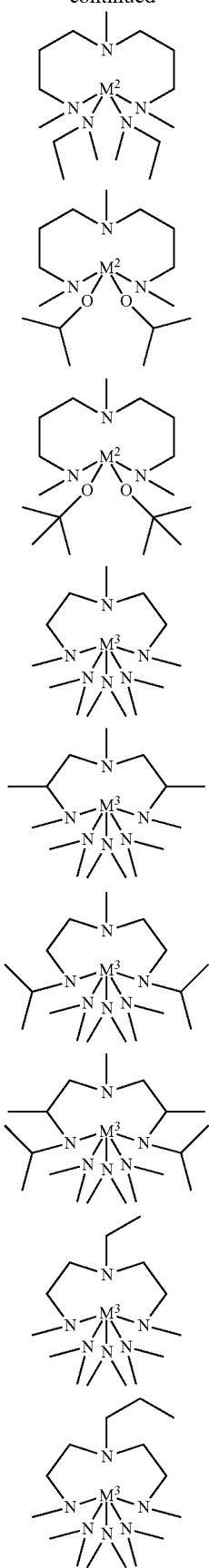
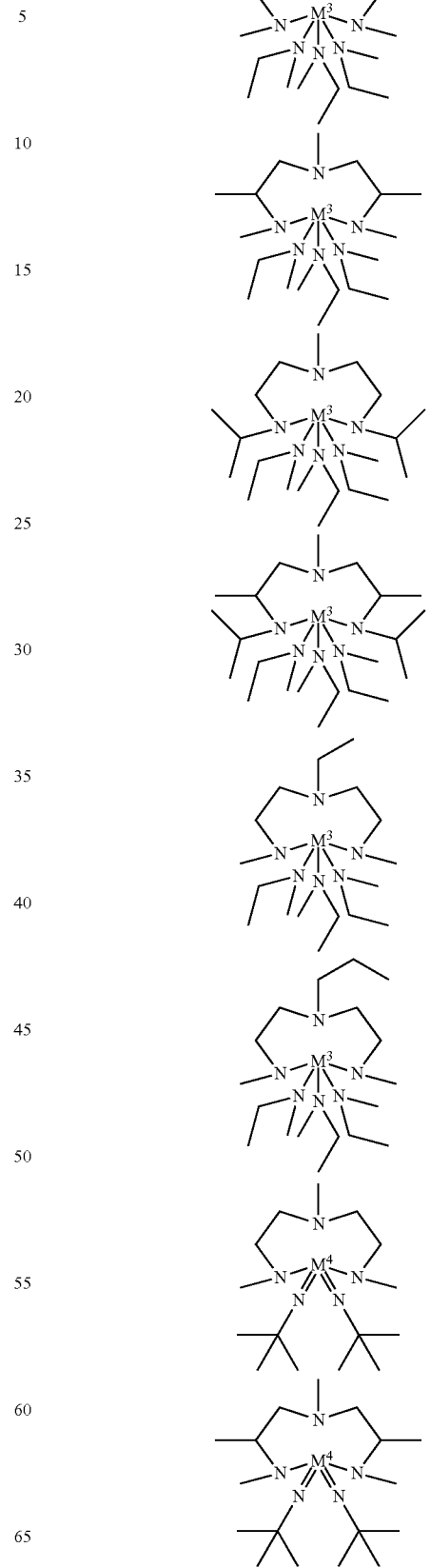

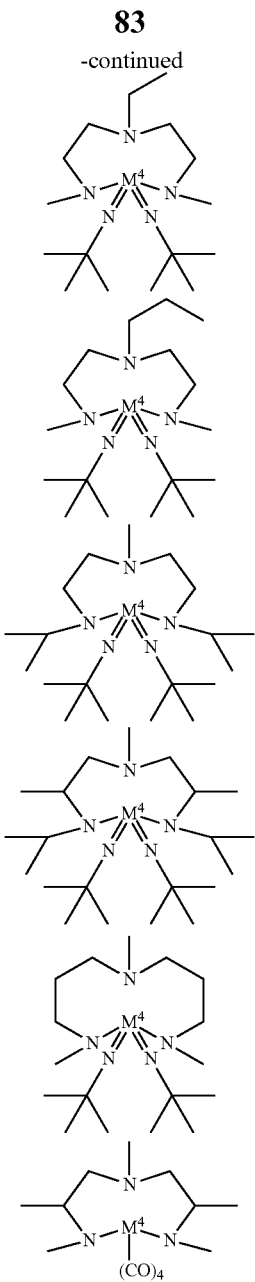

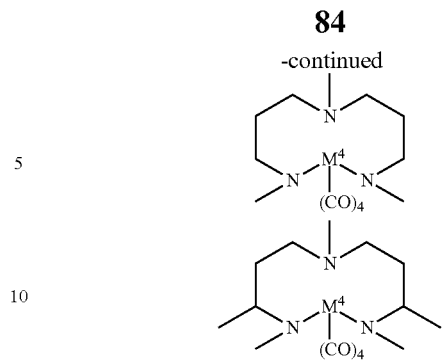

wherein $M^1$ is B, Al, Ga, In, Tl or La; $M^2$ is Ti, Zr or Hf; $M^3$ is V, Nb or Ta; and $M^4$ is Cr, Mo or W.

11. A composition for depositing a metal-containing thin film, comprising the metal triamine compound of claim 1.

12. A method for preparing a metal-containing thin film, using the composition for depositing a metal-containing thin film of claim 11.

13. The method of claim 12, wherein the method is performed by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD) of the composition for depositing a metal-containing thin film.

14. The method of claim 12, comprising:
 a) maintaining a temperature of a substrate mounted in a chamber at 80 to 400° C.;
 b) injecting carrier gas and the composition for depositing a metal-containing thin film of claim 11; and
 c) injecting reaction gas to deposit the metal-containing thin film on the substrate.

15. The method of claim 14, wherein the method is performed with supply of any one or two or more gases selected from the group consisting of oxygen ($O_2$), ozone ($O_3$), distilled water ($H_2O$), hydrogen peroxide ($H_2O_2$), nitrogen monoxide (NO), nitrous oxide ($N_2O$), nitrogen dioxide ($NO_2$), ammonia ($NH_3$), nitrogen ($N_2$), hydrazine ($N_2H_4$), amine, diamine, carbon monoxide (CO), carbon dioxide ($CO_2$), $C_1$ to $C_{12}$ saturated or unsaturated hydrocarbon, hydrogen ($H_2$), argon (Ar) and helium (He).

* * * * *